(12) United States Patent
Masuoka et al.

(10) Patent No.: US 8,441,066 B2
(45) Date of Patent: May 14, 2013

(54) SEMICONDUCTOR DEVICE

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

(*) Notice: Subject to any disclaimer, the term of this patent is extended or adjusted under 35 U.S.C. 154(b) by 147 days.

(21) Appl. No.: 12/882,698

(22) Filed: Sep. 15, 2010

(65) Prior Publication Data

US 2011/0062521 A1   Mar. 17, 2011

Related U.S. Application Data

(60) Provisional application No. 61/276,890, filed on Sep. 17, 2009, provisional application No. 61/284,999, filed on Dec. 29, 2009.

(30) Foreign Application Priority Data

Sep. 16, 2009  (JP) ................................. 2009-214166
Dec. 28, 2009  (JP) ................................. 2009-297211

(51) Int. Cl.
    *H01L 29/76*     (2006.01)
    *H01L 29/94*     (2006.01)
    *H01L 31/062*     (2006.01)
    *H01L 31/113*     (2006.01)
    *H01L 31/119*     (2006.01)

(52) U.S. Cl.
USPC ........... 257/330; 257/350; 257/369; 257/288; 257/331

(58) Field of Classification Search .................. 257/350, 257/369, 288, 329, 623, 330, 331, 332, 333, 257/334, 302, 401, 296, 392, 222, 225, 255, 257/291, 292, 295, 306, 396
See application file for complete search history.

(56) References Cited

U.S. PATENT DOCUMENTS 4,670,768 A * 6/1987 Sunami et al. ................ 257/331
5,427,962 A     6/1995 Sasaki et al.
(Continued)

FOREIGN PATENT DOCUMENTS

EP     0 020 929 A1    1/1981
EP     0 334 927 B1    12/1993
(Continued)

OTHER PUBLICATIONS

Watanabe, Shigeyoshi et al., "A Novel Circuit Technology with Surrounding Gate Transistors (SGT's) for Ultra High Density Dram's," IEEE Journal of Solid-State Circuits, vol. 30, No. 9, Sep. 1995, pp. 960-971.

(Continued)

*Primary Examiner* — Chuong A. Luu
(74) *Attorney, Agent, or Firm* — Brinks Hofer Gilson & Lione

(57) ABSTRACT

A semiconductor device according to the present invention comprises a first transistor and a second transistor, and functions as an inverter. The first transistor includes an island semiconductor layer, a first gate insulating film surrounding the periphery of the island semiconductor layer, a gate electrode surrounding the periphery of the first gate insulating film, p+-type semiconductor layers formed in the upper and lower part of the island semiconductor layer, respectively. The second transistor includes the gate electrode, a second gate insulating film surrounding a part of the periphery of the gate electrode, an arcuate semiconductor layer contacting a part of the periphery of the second gate insulating film, n+-type semiconductor layers formed in the upper and lower part of the arcuate semiconductor layer, respectively. A first contact electrically connects the p+-type semiconductor layer in the first transistor and the n+-type semiconductor layer in the second transistor.

14 Claims, 56 Drawing Sheets

U.S. PATENT DOCUMENTS

| | | | |
|---|---|---|---|
| 5,480,838 | A | 1/1996 | Mitsui |
| 5,550,084 | A | 8/1996 | Anjum et al. |
| 5,599,725 | A | 2/1997 | Dorleans et al. |
| 5,656,842 | A | 8/1997 | Iwamatsu et al. |
| 5,696,008 | A * | 12/1997 | Tamaki et al. ............... 438/212 |
| 5,773,329 | A | 6/1998 | Kuo |
| 6,235,568 | B1 | 5/2001 | Murthy et al. |
| 6,323,528 | B1 | 11/2001 | Yamazaki et al. |
| 6,373,099 | B1 | 4/2002 | Kikuchi et al. |
| 6,461,900 | B1 * | 10/2002 | Sundaresan et al. .......... 438/156 |
| 6,653,181 | B2 | 11/2003 | Hergenrother et al. |
| 6,867,084 | B1 | 3/2005 | Chiu et al. |
| 8,039,893 | B2 | 10/2011 | Masuoka et al. |
| 2002/0017687 | A1 | 2/2002 | Yamazaki et al. |
| 2002/0164858 | A1 | 11/2002 | Sayama et al. |
| 2005/0212063 | A1 | 9/2005 | Nakano et al. |
| 2006/0261406 | A1 | 11/2006 | Chen |
| 2008/0062756 | A1 | 3/2008 | Mayor et al. |
| 2009/0146194 | A1 | 6/2009 | Moselund et al. |
| 2010/0213525 | A1 * | 8/2010 | Masuoka et al. ............... 257/306 |
| 2010/0219482 | A1 * | 9/2010 | Masuoka et al. ............... 257/369 |
| 2010/0244140 | A1 | 9/2010 | Masuoka et al. |
| 2010/0308422 | A1 | 12/2010 | Masuoka et al. |

FOREIGN PATENT DOCUMENTS

| | | |
|---|---|---|
| EP | 1 507 294 A2 | 2/2005 |
| EP | 2 234 150 A2 | 9/2010 |
| EP | 2 259 315 A2 | 12/2010 |
| EP | 2 259 315 A3 | 12/2010 |
| JP | 60-070757 A | 4/1985 |
| JP | 62-045058 A | 2/1987 |
| JP | 02-066969 A | 3/1990 |
| JP | 02-188966 A | 7/1990 |
| JP | 03-225873 A | 10/1991 |
| JP | 08-051203 A | 2/1996 |
| JP | 2001-028399 A | 1/2001 |
| JP | 2004-319808 A | 11/2004 |
| JP | 2005-310921 A | 11/2005 |
| JP | 2007-250652 A | 9/2007 |
| JP | 2008-066562 A | 3/2008 |
| JP | 2008-205168 A | 9/2008 |
| JP | 2008-300558 A | 12/2008 |
| JP | 2009-038226 A | 2/2009 |
| JP | 2010-283181 A | 12/2010 |
| WO | WO 2009/057194 A1 | 5/2009 |
| WO | WO 2009/096464 A1 | 8/2009 |
| WO | WO 2009/096470 A1 | 8/2009 |

OTHER PUBLICATIONS

Notice of allowance for co-pending U.S. Appl. No. 12/729,977 dated Jun. 5, 2012, 10 pages.

Takato, H. et al., "High Performance CMOS Surrounding Gate Transistor (SGT) for Ultra High Density LSIs," IEEE Electron Devices Meeting, Technical Digest, 1998, pp. 222-225 IEDM.

Wolf, S., "Silicon Processing for the VLSI Era," vol. 3, "The Submicron MOSFET," Lattice Press, Sunset Beach, CA, USA, 1995, Sec. 4.1.1: Basics of MOSFET Operation, pp. 136-138.

Office Action from co-pending U.S. Appl. No. 12/794,088, dated May 23, 2012, 20 pages.

Chen, Yijian et al., "Vertical integrated-gate CMOS for ultra-dense IC", *Microelectronic Engineering*, vol. 83, 2006, pp. 1745-1748.

European Search Report for European Application No. 10 005 813, dated May 3, 2011, 4 pages.

European Search Report for European Application No. 10 00 9573, dated Feb. 24, 2012, 10 pages.

European Search Report for European Application No. 10 00 3151, dated Mar. 5, 2012, 9 pages.

Korean Office Action (with English Language translation) for Korean Patent Application No. KR2010-52973, dated Aug. 4, 2011, 5 pages.

Korean Office Action (with English Language translation) for Korean Patent Application No. KR2010-52973, dated Nov. 22, 2011, 5 pages.

Notice of Allowance for U.S. Appl. No. 12/729,977, dated Oct. 9, 2012, 8 pages.

Office Action for U.S. Appl. No. 12/794,088, dated Oct. 15, 2012, 22 pages.

Office Action for U.S. Appl. No. 12/854,564, dated Dec. 4, 2012, 16 pages.

Office Action for U.S. Appl. No. 13/534,615, dated Feb. 15, 2013, 10 pages.

* cited by examiner

SEMICONDUCTOR DEVICE

RELATED APPLICATIONS

Pursuant to 35 U.S.C. §119(e), this application claims the benefit of the filing date of Provisional U.S. Patent Application Ser. Nos. 61/276,890 filed on Sep. 17, 2009 and 61/284,999 filed on Dec. 29, 2009. This application also claims priority under 35 U.S.C. §119(a) to JP2009-214166 filed on Sep. 16, 2009 and JP2009-297211 filed on Dec. 28, 2009. The entire contents of these applications are hereby incorporated by reference.

BACKGROUND OF THE INVENTION

1. Field of the Invention

The present invention relates to a semiconductor device.

2. Description of the Related Art

High-integration of integrated circuits with a semiconductor device, in particular, a MOS transistor which is a field-effect transistor having a gate electrode with a MOS (metal-oxide semiconductor) structure is advancing well. Together with advancement of high-integration, microfabrication of such MOS transistor used in the integrated circuit is advanced in the range of a nano order. When an inverter circuit (a NOT circuit) which is one of basic circuits of digital circuits is configured by using a MOS transistor, if microfabrication of the MOS transistor advances, it becomes difficult to suppress any leak current, and the reliability is deteriorated because of a hot-carrier effect. Moreover, because of the requisition of ensuring a necessary current amount, reduction of an occupy area of the circuit is not accomplished. In order to overcome such problems, there is proposed a Surrounding Gate Transistor (SGT) which has an island semiconductor layer having a source, a gate, and a drain arranged in the vertical direction relative to a substrate and which has a structure that the gate surrounds the island semiconductor layer, and there are also proposed CMOS inverter circuits using such SGT (S. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Nobel Circuit Technology with Surrounding Gate Transistors (SGT's) for Ultra High Density DRAM's", IEEE JSSC, Vol. 30, No. 9, 1995.).

The inverter circuit which is a basic circuit of digital circuits includes a p-channel type MOS transistor (pMOS transistor) and an n-channel type MOS transistor (nMOS transistor). Because the mobility of a hole is half of that of an electron, it is necessary in the inverter circuit to make the gate width of the pMOS transistor twice as much as that of the nMOS transistor. Accordingly, a conventional CMOS inverter circuit using the SGT includes two pMOS SGTs connected in series and an nMOS SGT. That is, a conventional CMOS inverter circuit using the SGT includes three island semiconductors. That is, the conventional CMOS inverter circuit using the SGT includes three island semiconductor layers. When a CMOS inverter circuit using the SGT is configured by three island semiconductor layers in this way, such configuration may interfere with accomplishment of high-integration of semiconductor devices.

SUMMARY OF THE INVENTION

The present invention has been made in view of the foregoing circumstances, and it is an object of the present invention to provide a semiconductor device which has a CMOS inverter circuit using an SGT and which can achieve high-integration.

A semiconductor device according to a first aspect of the present invention comprises a first transistor and a second transistor and is allowed by the first and second transistors to function as an inverter, wherein the first transistor includes: an island semiconductor layer; a first gate insulating film surrounding a periphery of the island semiconductor layer; a gate electrode surrounding a periphery of the first gate insulating film; a first-conductivity-type upper high-concentration semiconductor layer formed in an upper part of the island semiconductor layer; and a first-conductivity-type lower high-concentration semiconductor layer formed in a lower part of the island semiconductor layer; the second transistor includes: the gate electrode; a second gate insulating film surrounding at least a part of a periphery of the gate electrode; a semiconductor layer contacting at least a part of a periphery of the second gate insulating film; a second-conductivity-type upper high-concentration semiconductor layer which is formed in an upper part of the semiconductor layer and which has an opposite conductivity to the first-conductivity-type upper high-concentration semiconductor layer; and a second-conductivity-type lower high-concentration semiconductor layer which is formed in a lower part of the semiconductor layer and which has an opposite conductivity to the first-conductivity-type lower high-concentration semiconductor layer, and the semiconductor device further comprises a first contact which electrically connects the first-conductivity-type upper high-concentration semiconductor layer in the first transistor and the second-conductivity-type upper high-concentration semiconductor layer in the second transistor together.

A semiconductor device according to a second aspect of the present invention comprises a first transistor and a second transistor and is allowed by the first and second transistors to function as an inverter, wherein the first transistor includes: an island semiconductor layer; a first gate insulating film surrounding a periphery of the island semiconductor layer; a gate electrode surrounding a periphery of the first gate insulating film; a first-conductivity-type upper high-concentration semiconductor layer formed in an upper part of the island semiconductor layer; and a first-conductivity-type lower high-concentration semiconductor layer formed in a lower part of the island semiconductor layer; the second transistor includes: the gate electrode; a gate insulating film surrounding at least a part of a periphery of the gate electrode; an arcuate semiconductor layer contacting a part of a periphery of the gate insulating film; a second-conductivity-type upper high-concentration semiconductor layer which is formed in an upper part of the arcuate semiconductor layer and which has an opposite conductivity to the first-conductivity-type upper high-concentration semiconductor layer; and a second-conductivity-type lower high-concentration semiconductor layer which is formed below the arcuate semiconductor layer and which has an opposite conductivity to the first-conductivity-type lower high-concentration semiconductor layer, and the semiconductor device further comprises a first contact which electrically connects the first-conductivity-type upper high-concentration semiconductor layer in the first transistor and the second-conductivity-type upper high-concentration semiconductor layer in the second transistor together.

A semiconductor device according to a third aspect of the present invention comprises a first transistor and a second transistor and is allowed by the first and second transistors to function as an inverter, wherein the first transistor includes: an island semiconductor layer; a first gate insulating film surrounding a periphery of the island semiconductor layer; a gate electrode surrounding a periphery of the first gate insulating film; a first-conductivity-type upper high-concentration semiconductor layer formed in an upper part of the island semiconductor layer; and a first-conductivity-type lower high-concentration semiconductor layer formed below the island semiconductor layer; the second transistor includes: the gate electrode; a second gate insulating film surrounding at least a part of a periphery of the gate electrode; an arcuate semiconductor layer contacting a part of a periphery of the second gate insulating film; a second-conductivity-type upper high-concentration semiconductor layer which is formed in an upper part of the arcuate semiconductor layer and which has an opposite conductivity to the first-conductivity-type upper high-concentration semiconductor layer; and a second-conductivity-type lower high-concentration semiconductor layer which is formed below the arcuate semiconductor layer and which has an opposite conductivity to the first-conductivity-type lower high-concentration semiconductor layer, the semiconductor device further comprises: a first semiconductor/metal compound layer formed on the first-conductivity-type upper high-concentration semiconductor layer in the first transistor; a second semiconductor/metal compound layer formed on an extending part of the first-conductivity-type lower high-concentration semiconductor layer in the first transistor running outwardly of the first transistor and in a horizontal direction of the first transistor; a third semiconductor/metal compound layer formed on the second-conductivity-type upper high-concentration semiconductor layer in the second transistor; a fourth semiconductor/metal compound layer formed on an extending part of the second-conductivity-type lower high-concentration semiconductor layer in the second transistor running outwardly of the second transistor and in a horizontal direction of the second transistor; a first contact which is formed on the first semiconductor/metal compound layer and on the third semiconductor/metal compound layer and which electrically connects the first-conductivity-type upper high-concentration semiconductor layer in the first transistor and the second-conductivity-type upper high-concentration semiconductor layer in the second transistor together; and an output wiring electrically connected to the first contact.

In a preferable mode of the present invention, the semiconductor device according to the third aspect further comprises: a second contact formed on the second semiconductor/metal compound layer; a third contact formed on the fourth semiconductor/metal compound layer; a fourth contact formed on the gate electrode; the output wiring which is connected to the first contact and which is for outputting a signal; an input wiring which is connected to the fourth contact and which is for inputting a signal; a first power-source wiring connected to the second contact and to an external power source; and a second power-source wiring connected to the third contact and to the external power source.

In a preferable mode of the present invention, according to the semiconductor device of the first aspect, the first-conductivity-type upper high-concentration semiconductor layer is a p+-type upper semiconductor layer, the first-conductivity-type lower high-concentration semiconductor layer is a p+-type lower semiconductor layer, the second-conductivity-type upper high-concentration semiconductor layer is an n+-type upper semiconductor layer, and the second-conductivity-type lower high-concentration semiconductor layer is an n+-type lower semiconductor layer.

In a preferable mode of the present invention, according to the semiconductor device of the third aspect, $Wp \cong 2 \times Wn$ is satisfied where Wn is a length of an arc formed at a boundary where the arcuate semiconductor layer contacts a part of the periphery of the gate insulating film and Wp is an outer circumference length of the island semiconductor layer.

In a preferable mode of the present invention, according to the semiconductor device of the third aspect, when a length of an arc formed at a boundary where the arcuate semiconductor layer contacts a part of the periphery of the second gate insulating film is Wn and an outer circumference length of the island semiconductor layer is Wp, Wp is larger than Wn.

In a preferable mode of the present invention, according to the semiconductor device of the third aspect, $Ln \cong Lp$ is satisfied where Ln is a channel length of the arcuate semiconductor layer and Lp is a channel length of the island semiconductor layer. Moreover, in a preferable mode of the present invention, according to the semiconductor device of the third aspect, $W \cong 2\ Wn$ and $Ln \cong Lp$ are both satisfied where Ln is a channel length of the arcuate semiconductor layer and Lp is a channel length of the island semiconductor layer. Furthermore, in a preferable mode of the present invention, according to the semiconductor device of the third aspect, $Wp > Wn$ and $Ln \cong Lp$ are both satisfied where Ln is a channel length of the arcuate semiconductor layer and Lp is a channel length of the island semiconductor layer.

In a preferable mode of the present invention, according to the semiconductor device of the first aspect of the present invention, the first transistor is an enhancement-type nMOS transistor, the first-conductivity-type upper high-concentration semiconductor layer is a p+-type semiconductor layer, the first-conductivity-type lower high-concentration semiconductor layer is a p+-type semiconductor layer, the second transistor is an enhancement-type pMOS transistor, the second-conductivity-type upper high-concentration semiconductor layer is an n+-type semiconductor layer, the second-conductivity-type lower high-concentration semiconductor layer is an n+-type semiconductor layer, and the gate electrode is formed of a material that causes the nMOS transistor and the pMOS transistor to be an enhancement-type transistor.

In a preferable mode of the present invention, according to the semiconductor device of the third aspect of the present invention, all of the first to fourth semiconductor/metal compound layers are a compound layer of silicon and metal.

In a preferable mode of the present invention, according to the semiconductor device of the second aspect of the present invention, the first and second transistors are an enhancement-type nMOS transistor and an enhancement-type pMOS transistor, respectively, the island semiconductor layer is an island silicon layer, the arcuate semiconductor layer is an arcuate silicon layer, both of the first-conductivity-type upper high-concentration semiconductor layer and the first-conductivity-type lower high-concentration semiconductor layer are a p+-type silicon layer, and both of the second-conductivity-type upper high-concentration semiconductor layer and second-conductivity-type lower high-concentration semiconductor layer are an n+-type silicon layer.

In a preferable mode of the present invention, the island silicon layer is an n-type or none-doped island silicon layer, and the arcuate silicon layer is a p-type or none-doped arcuate silicon layer.

According to the semiconductor device of the first aspect of the present invention, it is possible to accomplish high-integration of the semiconductor device having a CMOS inverter circuit using an SGT.

According to the semiconductor device of the second aspect of the present invention, it is possible to accomplish high-integration of the semiconductor device having a CMOS inverter circuit using an SGT.

According to the semiconductor device of the third aspect of the present invention, it is possible to accomplish high-integration of the semiconductor device having a CMOS inverter circuit using an SGT.

Moreover, according to the semiconductor device of the third aspect of the present invention, by setting conditions which satisfy Wp≅2 Wn and Ln≅Lp, because the mobility of a hole is half of that of an electron, the current drive force of an nMOS transistor can be made same as that of a pMOS transistor, so that the threshold voltage of an inverter can be set to be half of a supply voltage.

Furthermore, according to the semiconductor device of the third aspect of the present invention, by setting conditions which satisfy Wp>Wn and Ln≅Lp, it becomes possible to provide the highly integrated semiconductor device comprising a CMOS inverter circuit using an SGT with the gate width of the pMOS transistor being wider than that of the nMOS transistor.

Moreover, according to the semiconductor device of the first aspect of the present invention, the first transistor is an enhancement-type nMOS transistor, the first-conductivity-type upper high-concentration semiconductor layer is a p+-type semiconductor layer, the first-conductivity-type lower high-concentration semiconductor layer is a p+-type semiconductor layer, the second transistor is an enhancement-type pMOS transistor, the second-conductivity-type upper high-concentration semiconductor layer is an n+-type semiconductor layer, the second-conductivity-type lower high-concentration semiconductor layer is an n+-type semiconductor layer, and the gate electrode is formed of a material that causes the nMOS transistor and the pMOS transistor to be an enhancement-type transistor. Therefore, it becomes possible to cause both pMOS transistor and nMOS transistor to be an enhancement-type transistor.

BRIEF DESCRIPTION OF THE DRAWINGS

A more complete understanding of this application can be obtained when the following detailed description is considered in conjunction with the following drawings, in which.

DETAILED DESCRIPTION OF THE PREFERRED EMBODIMENTS

An explanation will be given of a semiconductor device according to an embodiment of the present invention and a manufacturing method thereof with reference to the accompanying drawings.

Figure 1:
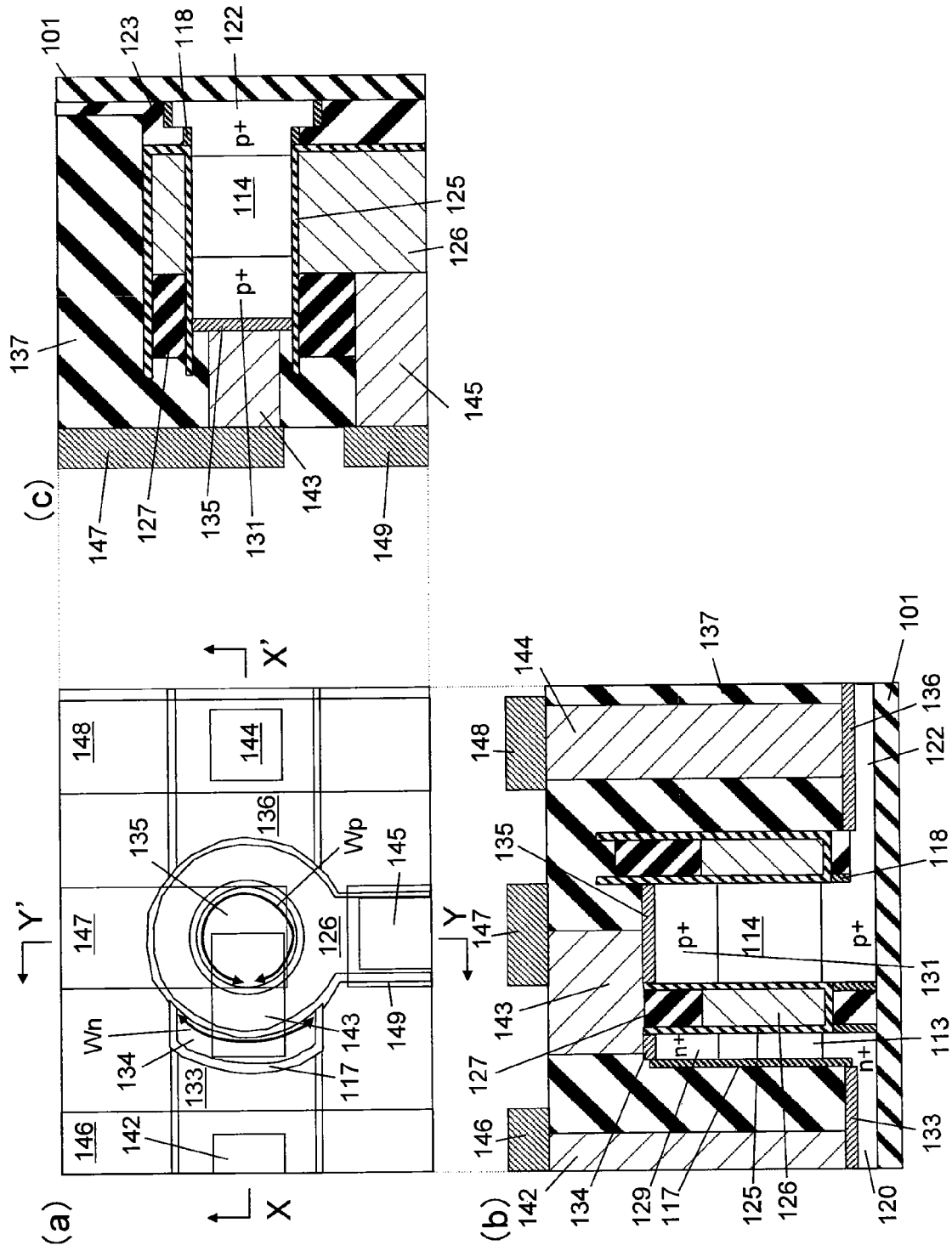
FIG. 1 shows a semiconductor device according to one embodiment of the present invention, wherein (a), (b) and (c) are a schematic diagram of the semiconductor device in a plane view, taken along the line X-X' in (a) and a cross-sectional view taken along the line Y-Y' in (a), respectively.

FIG. 1 shows a semiconductor device according to one embodiment of the present invention, wherein (a), (b) and (c) are a schematic diagram of the semiconductor device in a plane view, taken along the line X-X' in (a) and a cross-sectional view taken along the line Y-Y' in (a), respectively.

As shown in FIG. 1, the semiconductor device of the present embodiment has a CMOS inverter circuit using an SGT, and comprises a first transistor which is an enhancement-type nMOS transistor that forms a channel between a source and a drain as a voltage is applied to a gate to prompt formation of an inversion layer, and a second transistor which is an enhancement-type pMOS transistor.

The first transistor includes an island silicon layer 114 having the source, the gate, and the drain all arranged in the vertical direction relative to a substrate (not illustrated).

The first transistor further includes a first gate insulating film 125a surrounding the periphery of the island silicon layer 114, a gate electrode 126 surrounding the periphery of the first gate insulating film 125a, a first p+-type (first-conductivity-type) silicon layer 131 formed in an upper part of the island silicon layer 114, and a second p+-type silicon layer 122 formed below the island silicon layer 114.

The second transistor includes the gate electrode 126, a second gate insulating film 125b surrounding a part of the periphery of the gate electrode 126, a second arcuate silicon layer 113 contacting a part of the periphery of the second gate insulating film 125b, a first n+-type (second-conductivity-type) silicon layer 129 formed in an upper part of the second arcuate silicon layer 113, and a second n+-type silicon layer 120 formed below the second arcuate silicon layer 113.

The semiconductor device of the present embodiment further includes a first silicon/metal compound layer 135 formed on the first p+-type silicon layer 131.

A second silicon/metal compound layer 136 is formed on an extending part of the second p+-type silicon layer 122 running outwardly (in a direction apart from the island silicon layer 114) and in the horizontal direction. The semiconductor device of the present embodiment further includes the second compound layer 136.

The semiconductor device of the present embodiment further includes a third silicon/metal compound layer 134 formed on the first n+-type silicon layer 129.

A fourth silicon/metal compound layer 133 is formed on an extending part of the second n+-type silicon layer 120 running outwardly (in a direction apart from the island silicon layer 114) and in the horizontal direction. The semiconductor device of the present embodiment further includes the fourth compound layer 133.

The semiconductor device of the present embodiment further includes a first contact 143 which is formed on the first silicon/metal compound layer 135 and on the third silicon/metal compound layer 134, and which electrically connects the p+-type silicon layer 131 in the first transistor and the n+-type silicon layer 129 in the second transistor.

The semiconductor device of the present embodiment further includes a second contact 144 formed on the second silicon/metal compound layer 136 and electrically connected thereto, a third contact 142 formed on the fourth silicon/metal compound layer 133 and electrically connected to thereto, a fourth contact 145 formed on the gate electrode 126, an output wiring 147 electrically connected to the first contact 143, an input wiring 149 connected to the fourth contact 145, a first power-source wiring 148 connected to the second contact 144, and a second power-source wiring 146 connected to the third contact 142. The output wiring 147 is for outputting a signal to the exterior, and the input wiring 149 is for inputting a signal from the exterior. The first power-source wiring 148 and the second power-source wiring 146 are used for electrically connecting an external DC power source or the like and the semiconductor device of the present embodiment together.

Note that the first contact 143 may be formed as physically separated independent contacts which are connected to the first compound layer 135 and the third compound layer 134, respectively.

According to the semiconductor device of the present invention, a pMOS SGT which is a pMOS transistor is configured by the first gate insulating film 125a surrounding the periphery of the island silicon layer 114, the gate electrode 126 surrounding the periphery of the first gate insulating film 125a, the first p+-type silicon layer 131 formed in an upper part of the island silicon layer 114, and the second p+-type silicon layer 122 formed below the island silicon layer 114.

Moreover, according to the semiconductor device of the present embodiment, an nMOS SGT which is an nMOS transistor is configured by the gate electrode 126, the second gate insulating film 125b surrounding a part of the periphery of the gate electrode 126, the second arcuate silicon layer 113 contacting a part of the periphery of the second gate insulating film 125, the first n+-type silicon layer 129 formed in an upper part of the second arcuate silicon layer 113, and the second n+-type silicon layer 120 formed below the second arcuate silicon layer 113.

With reference to FIG. 1, according to the semiconductor device of the present embodiment, Wp≅2 Wn is satisfied where Wn is the length of an arc formed at a boundary where the second arcuate silicon layer 113 contacts a part of the periphery of the second gate insulating film 125b and Wp is the outer circumference length of the island silicon layer 114. Moreover, according to the semiconductor device of the present embodiment, Ln≅Lp is satisfied where Ln is the channel length of the second arcuate silicon layer 113 and Lp is the channel length of the island silicon layer 114. By setting conditions which satisfy Wp≅2 n and Ln≅Lp as explained above, the gate width of the pMOS transistor becomes twice as much as that of the nMOS transistor, and because the mobility of a hole is half of that of an electron, the current drive force of the nMOS transistor can be made same as that of the pMOS transistor, so that the threshold voltage of an inverter can be set to be half of a supply voltage.

Note that according to the semiconductor device of the present embodiment, Wp>Wn and Ln≅Lp may be both satisfied where Wn is the length of the arc formed at the boundary where the second arcuate semiconductor 113 contacts a part of the periphery of the second gate insulating film 125b and Wp is the outer circumference length of the island silicon layer 114. Accordingly, it becomes also possible to accomplish high-integration of the semiconductor device comprising a CMOS inverter circuit using an SGT with the gate width of the pMOS transistor being wider than that of the nMOS transistor.

Moreover, according to the semiconductor device of the present embodiment, the first transistor is the enhancement-type nMOS transistor that includes the first gate insulating film 125a, the gate electrode 126, the island silicon layer 114, the first p+-type silicon layer 131, and the second p+-type silicon layer 122. Furthermore, the second transistor is the enhancement-type pMOS transistor that includes the gate electrode 126, the second gate insulating film 125b, the second arcuate silicon layer 113, the first n+-type silicon layer 129, and the second n+-type silicon layer 120.

According to the semiconductor device of the present embodiment, as the gate electrode 126 is formed of a material that causes the nMOS transistor and the pMOS transistor to be an enhancement type transistor, e.g., Al (aluminum), and a cutoff state (non-conduction state) can be acquired between a source and a drain of the nMOS transistor and between those of the pMOS transistor by applying no voltage to the gate electrode 126.

Figure 2:
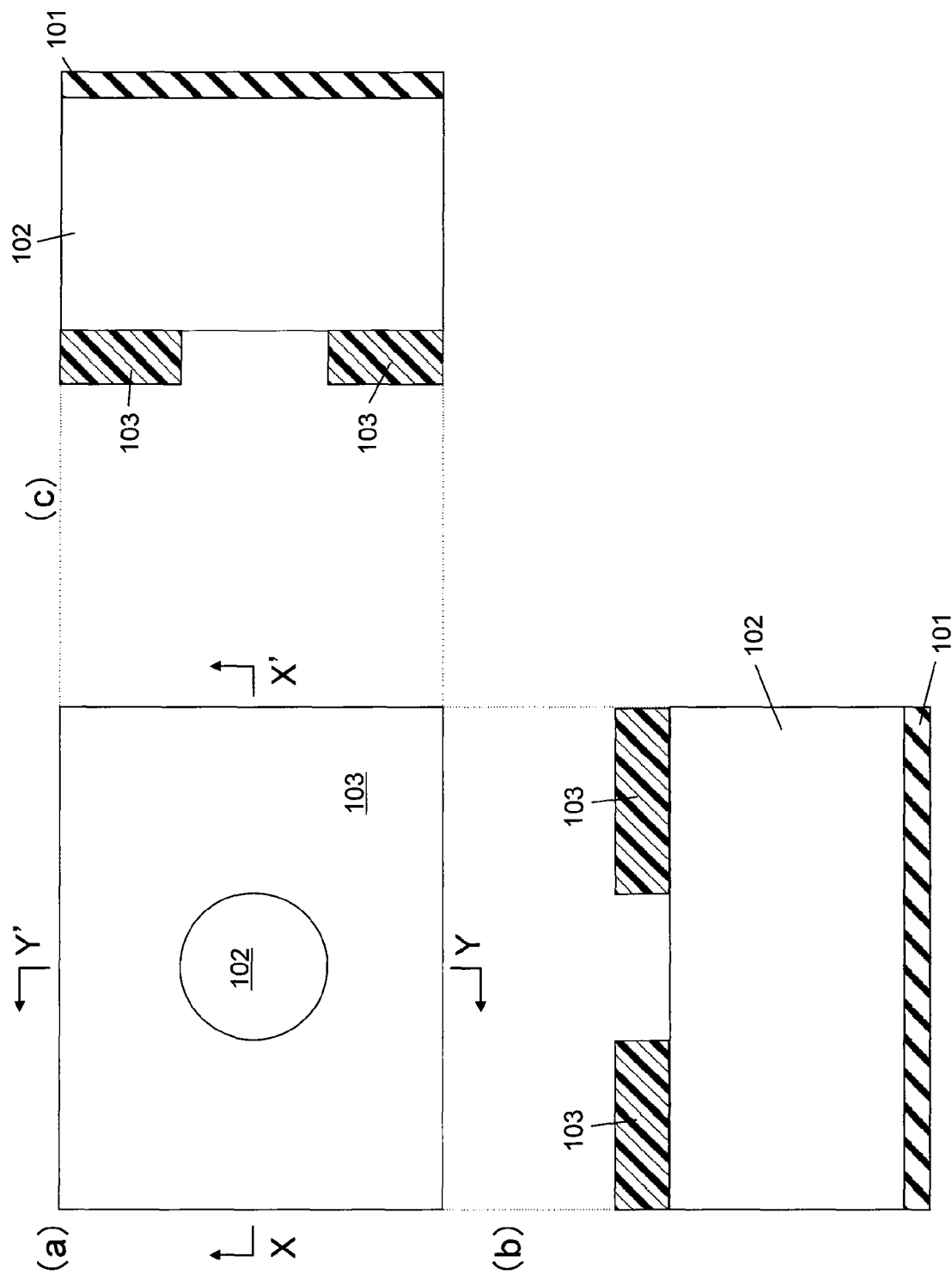
FIG. 2 shows a step in one example of a manufacturing process for the semiconductor device according to the embodiment, wherein (a), (b) and (c) are a top plan view, a cross-sectional view taken along the line X-X' in (a), and a cross-sectional view taken along the line Y-Y' in (a), respectively.
Figure 56:
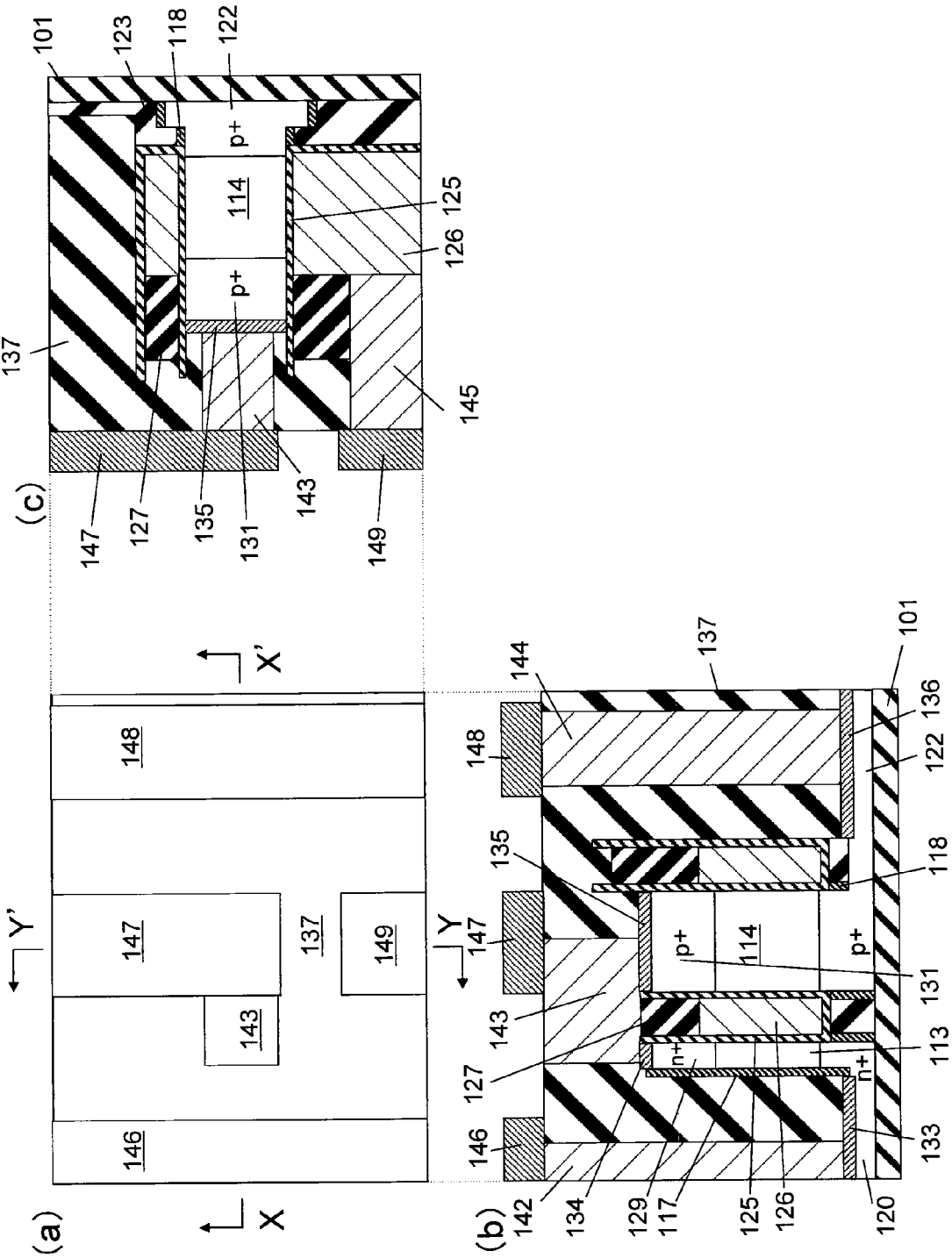
FIG. 56 shows a step in the example of the manufacturing process, wherein (a), (b) and (c) are a top plan view, a cross-sectional view taken along the line X-X' in (a), and a cross-sectional view taken along the line Y-Y' in (a), respectively.

An example of a manufacturing process of forming a structure of the semiconductor device of the present invention will be explained below with reference to FIGS. 2 to 56. Note that the same structural elements are denoted by the same reference numerals through these drawings. FIGS. 2 to 56 are diagrams for explaining the manufacturing process of the semiconductor device of the present invention. In FIGS. 2 to 56, all A-figures are a plan view for explaining the manufacturing process of the semiconductor device according to the embodiment of the present invention, all B-figures are a cross-sectional view of corresponding A-figure along a line X-X', and all C-figures are a cross-sectional view of corresponding A-figure along a line Y-Y'.

With reference to FIG. 2, a resist 103 having a predetermined pattern for forming an n-type silicon layer is formed on a p-type or non-doped silicon layer 102 formed on an oxide film 101. When the silicon layer 102 is a non-doped silicon layer, this step is unnecessary.

Figure 3:
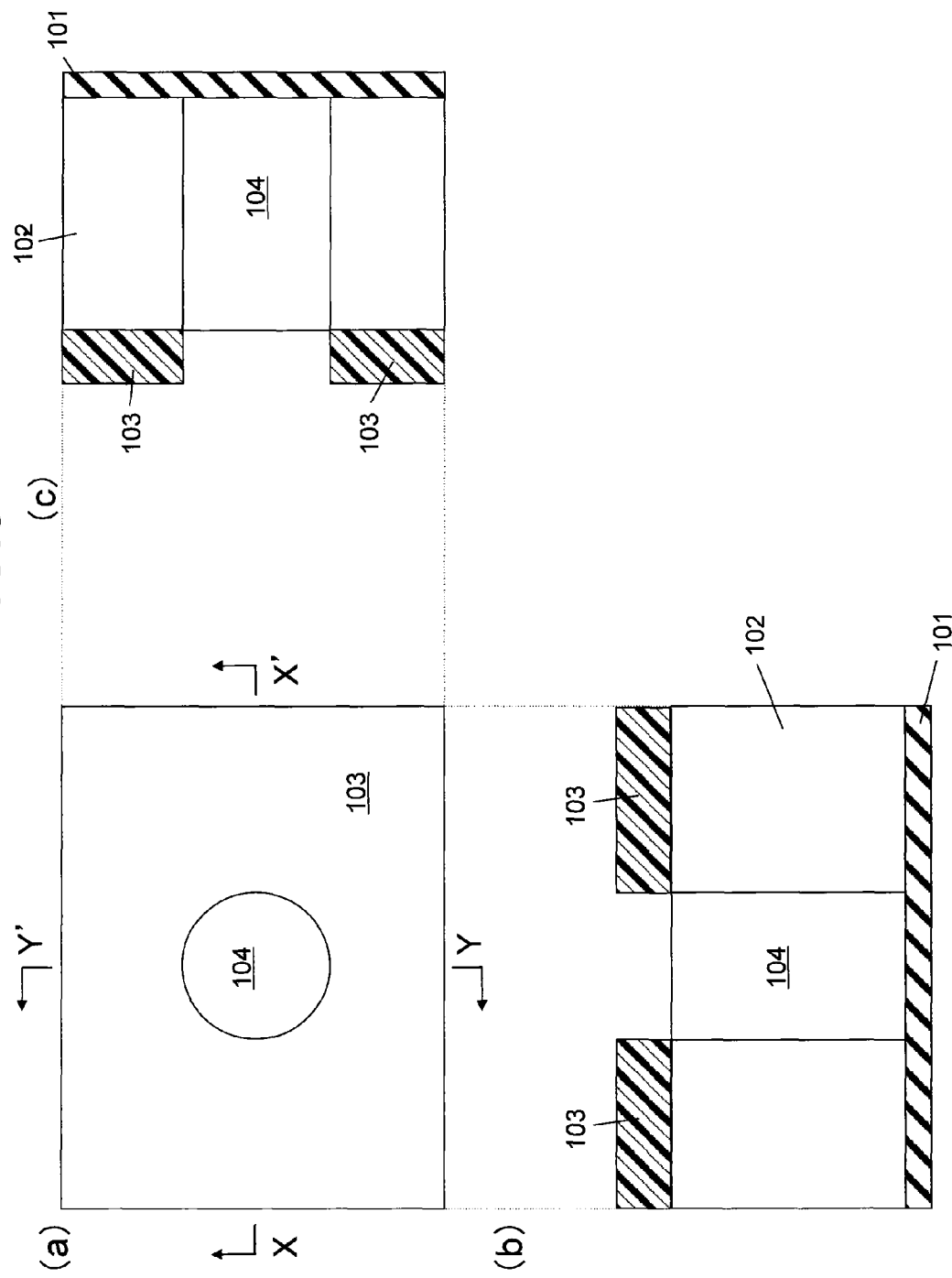
FIG. 3 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 3, phosphorus (P) is doped to form an n-type silicon layer 104 at a predetermined site of the silicon layer 102 using the resist 103 as a mask. Thereafter, the resist 103 is peeled. When the silicon layer 102 is a non-doped silicon layer, this step is unnecessary.

Figure 4:
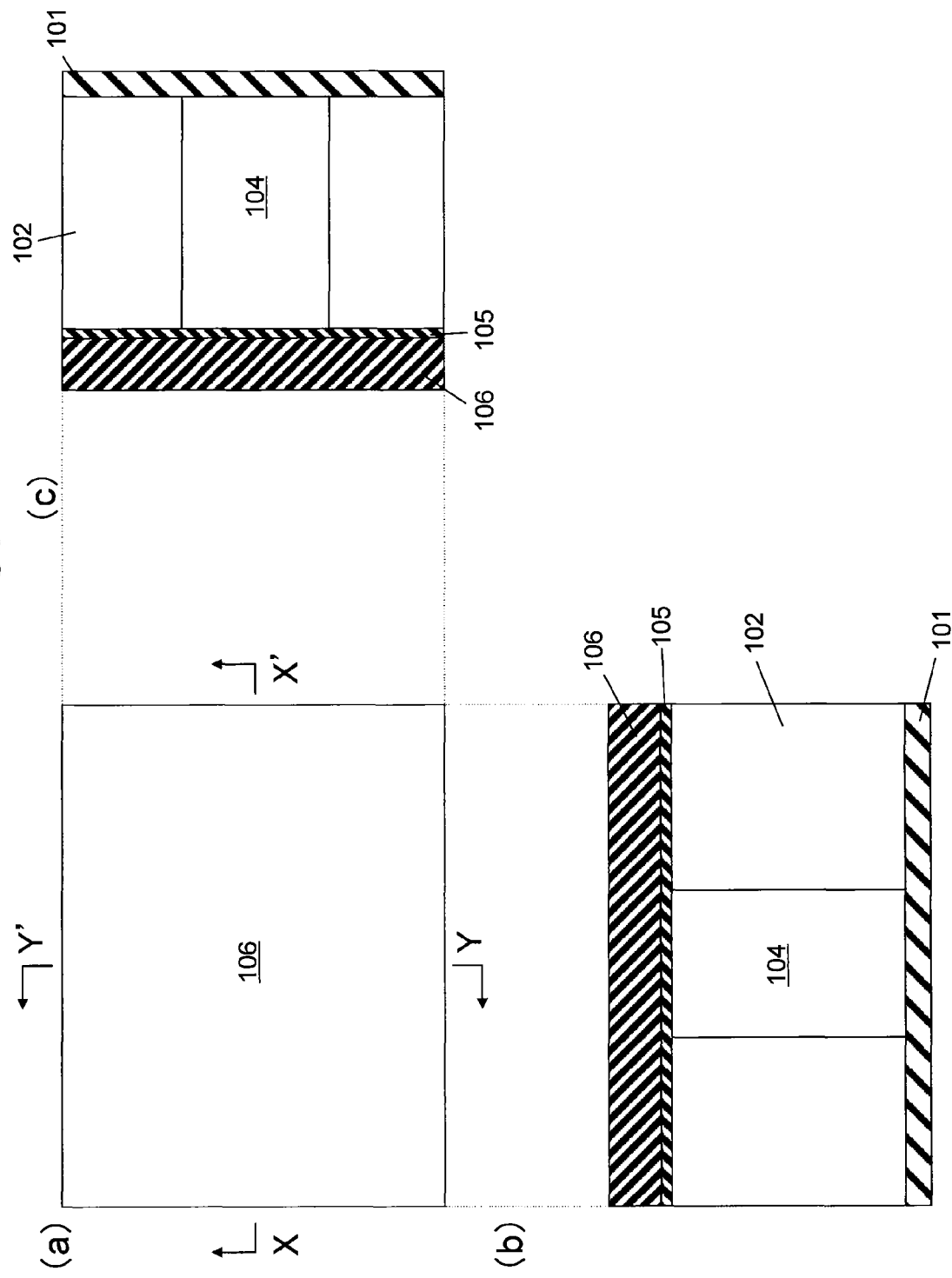
FIG. 4 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 4, an oxide film 105 and a nitride film 106 are formed on the silicon layer 102 in this order.

Figure 5:
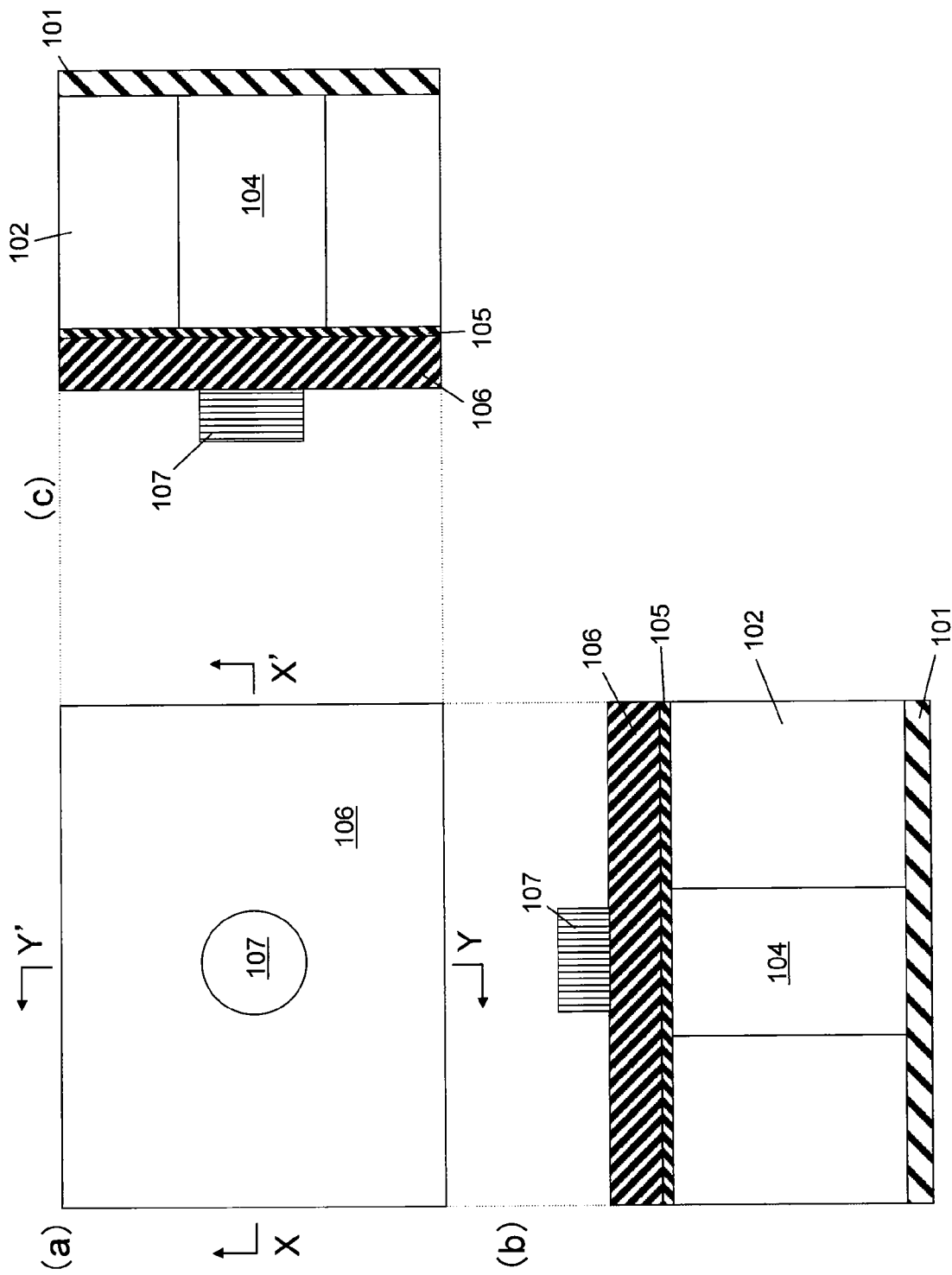
FIG. 5 shows a step in the example of the manufacturing process, wherein (a), (b) and (c) are a top plan view, a cross-sectional view taken along the line X-X in (a), and a cross-sectional view taken along the line Y-Y' in (a), respectively.

Next, with reference to FIG. 5, a resist 107 having a predetermined pattern for forming a silicon column which will be the island silicon layer 114 is formed at a predetermined position on the silicon layer 102.

Figure 6:
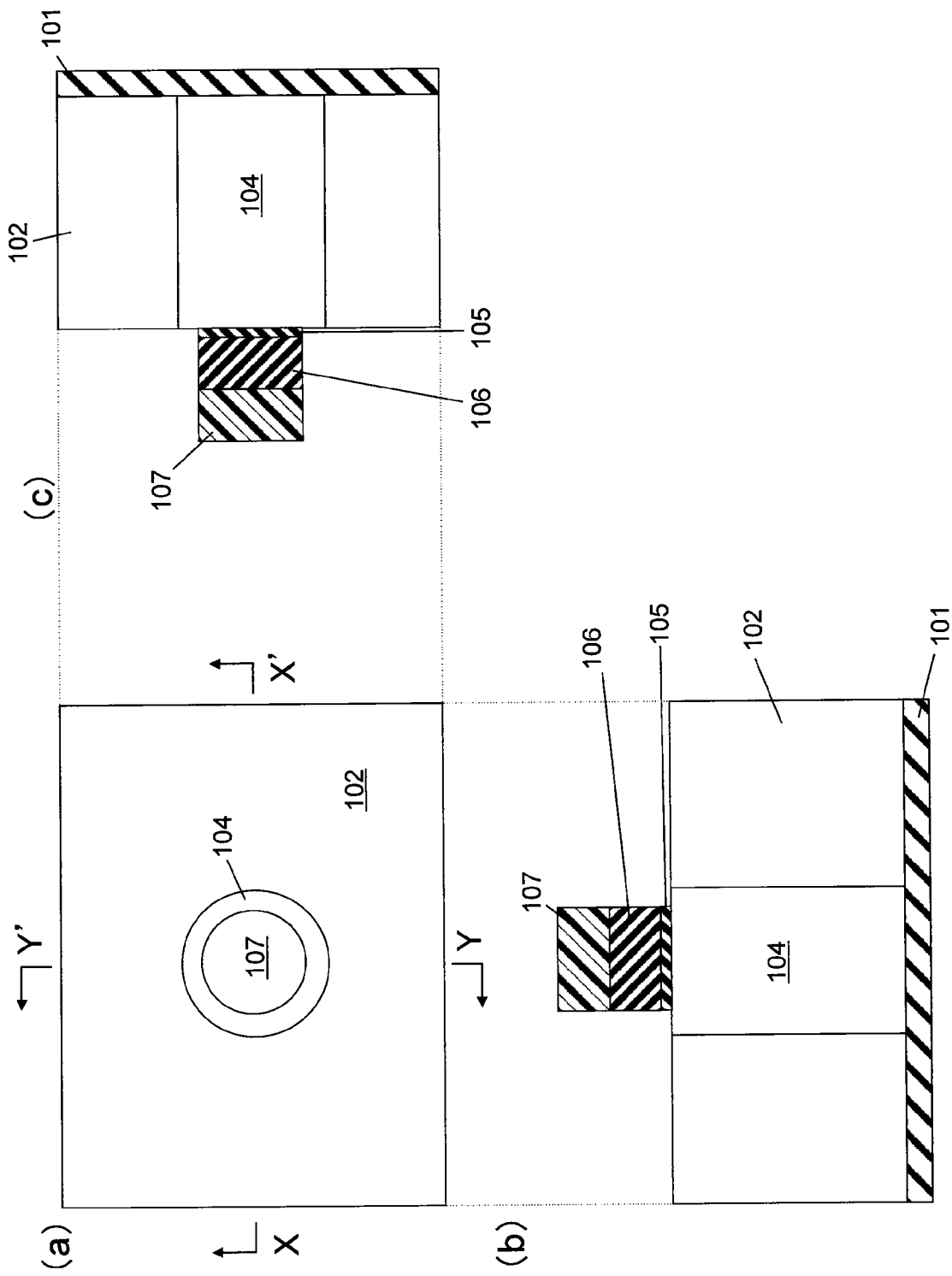
FIG. 6 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 6, the oxide film 105 and the nitride film 106 are etched to be reshaped using the resist 107 as a mask.

Figure 7:
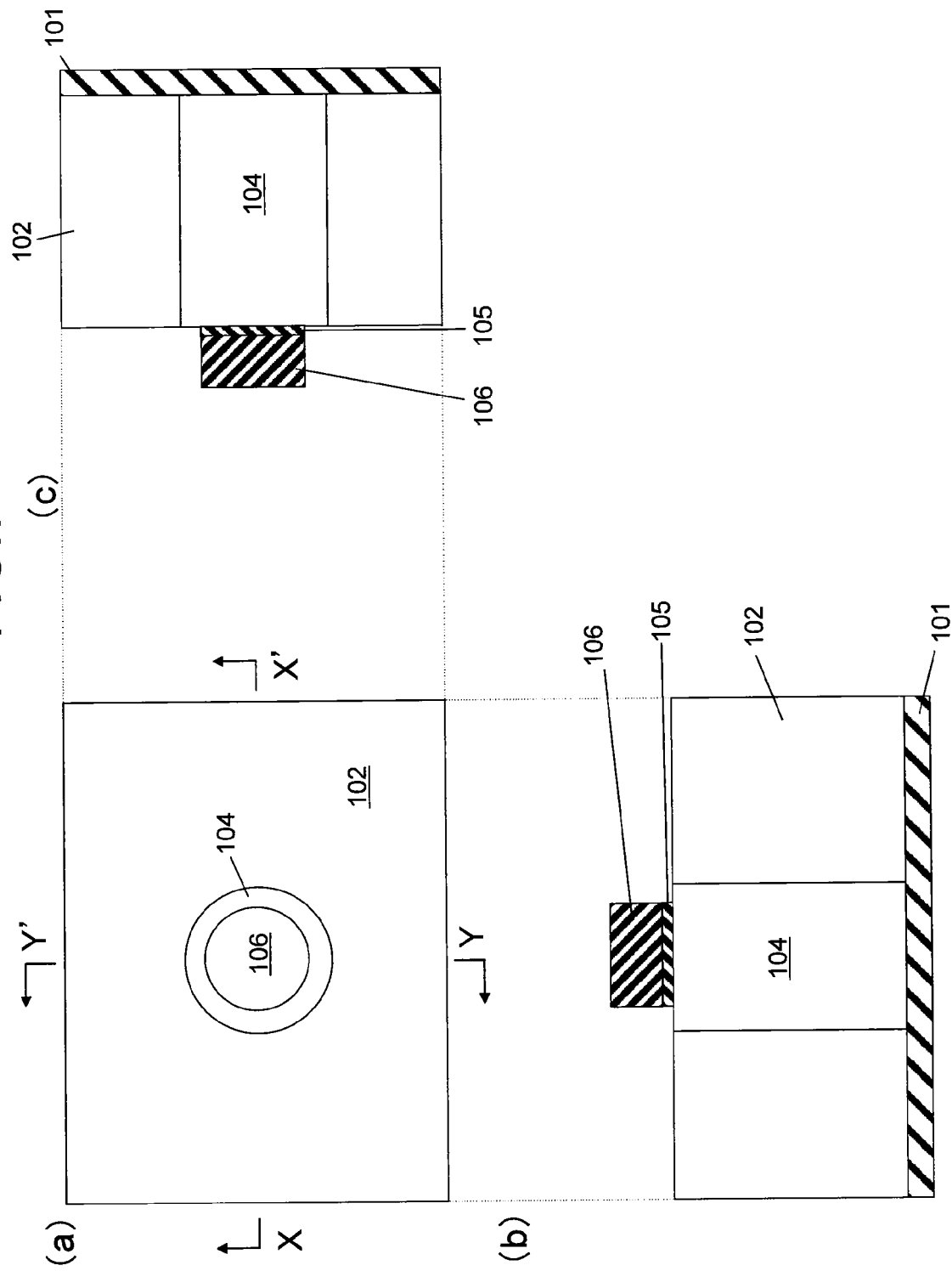
FIG. 7 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 7, the resist 107 is peeled.

Figure 8:
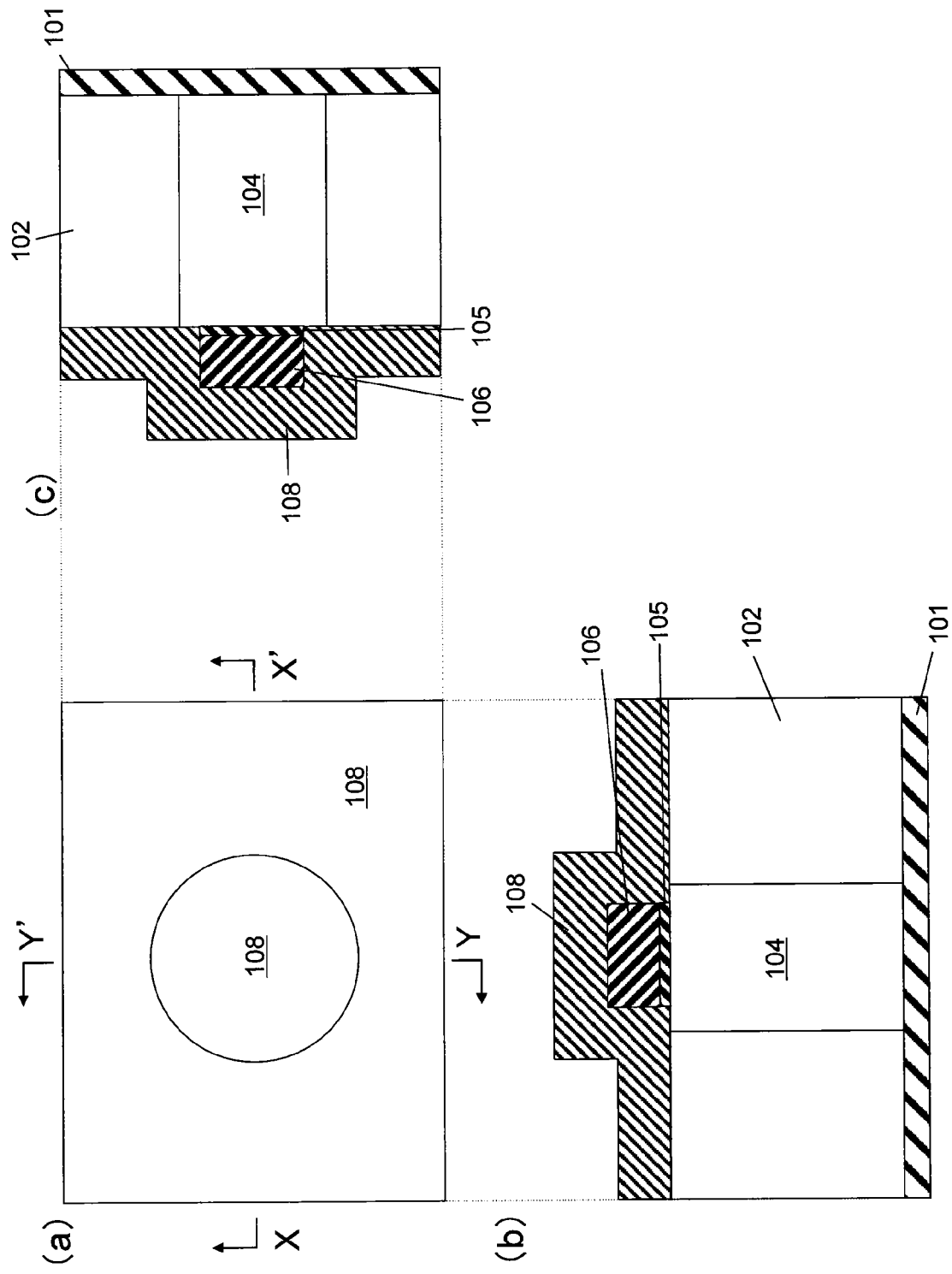
FIG. 8 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 8, an oxide film 108 is deposited on the silicon layer 102 so as to cover the oxide film 105 and the nitride film 106.

Figure 9:
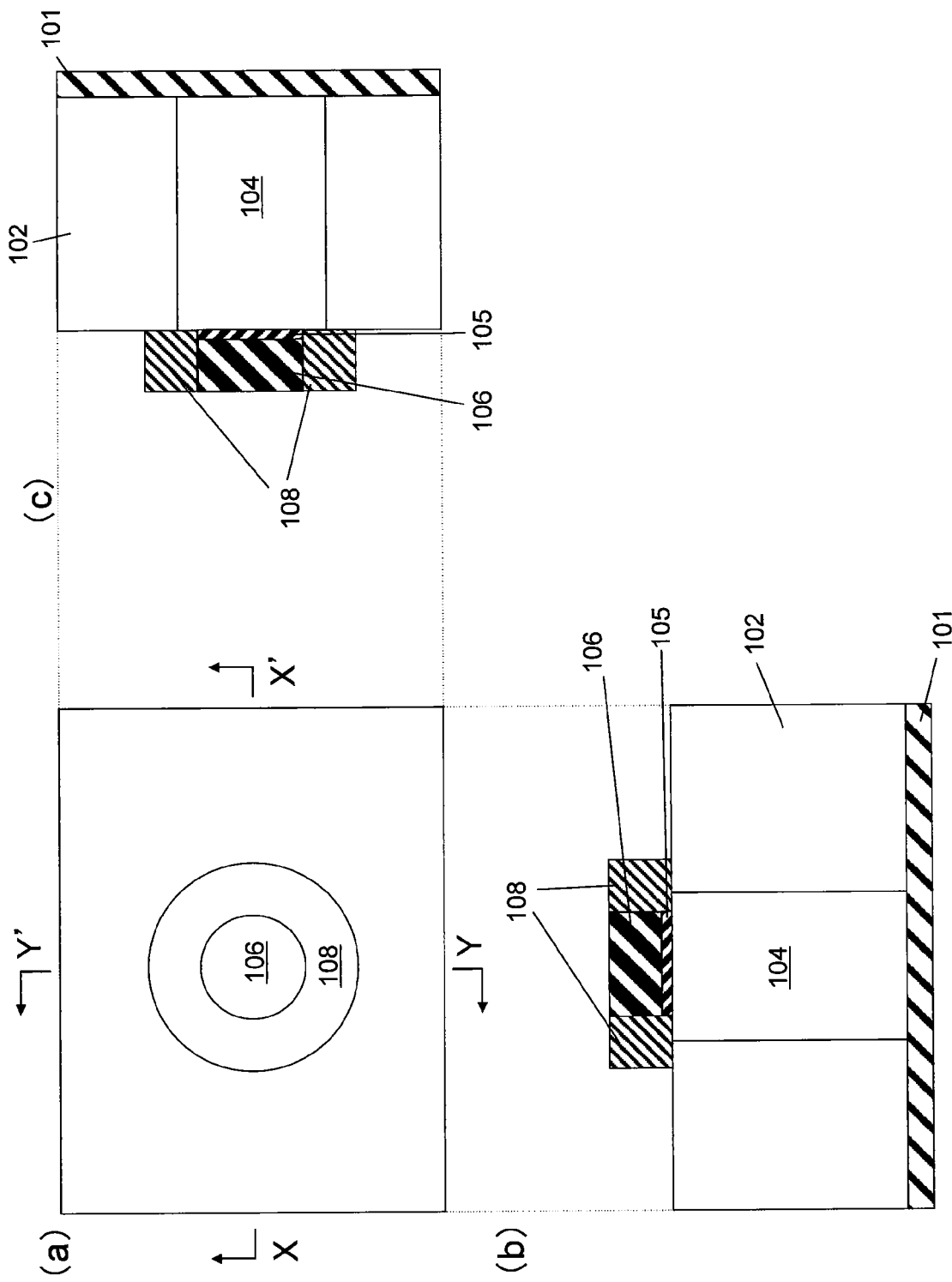
FIG. 9 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 9, the oxide film 108 is subjected to etch-back through reactive ion etching so as to be left around the oxide film 105 and the nitride film 106.

Figure 10:
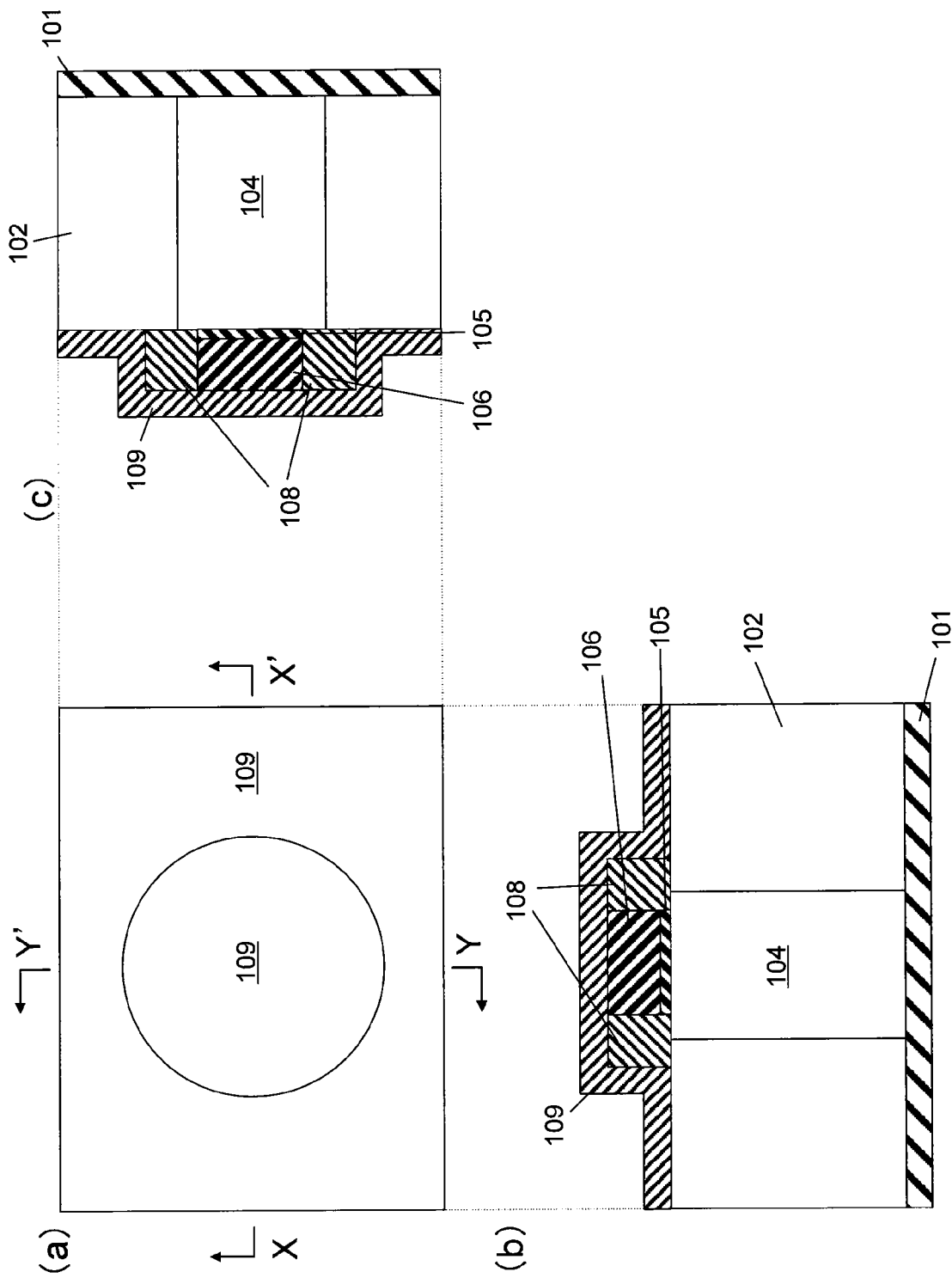
FIG. 10 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 10, a nitride film 109 is deposited so as to cover the oxide film 105, the nitride film 106, and the oxide film 108.

Figure 11:
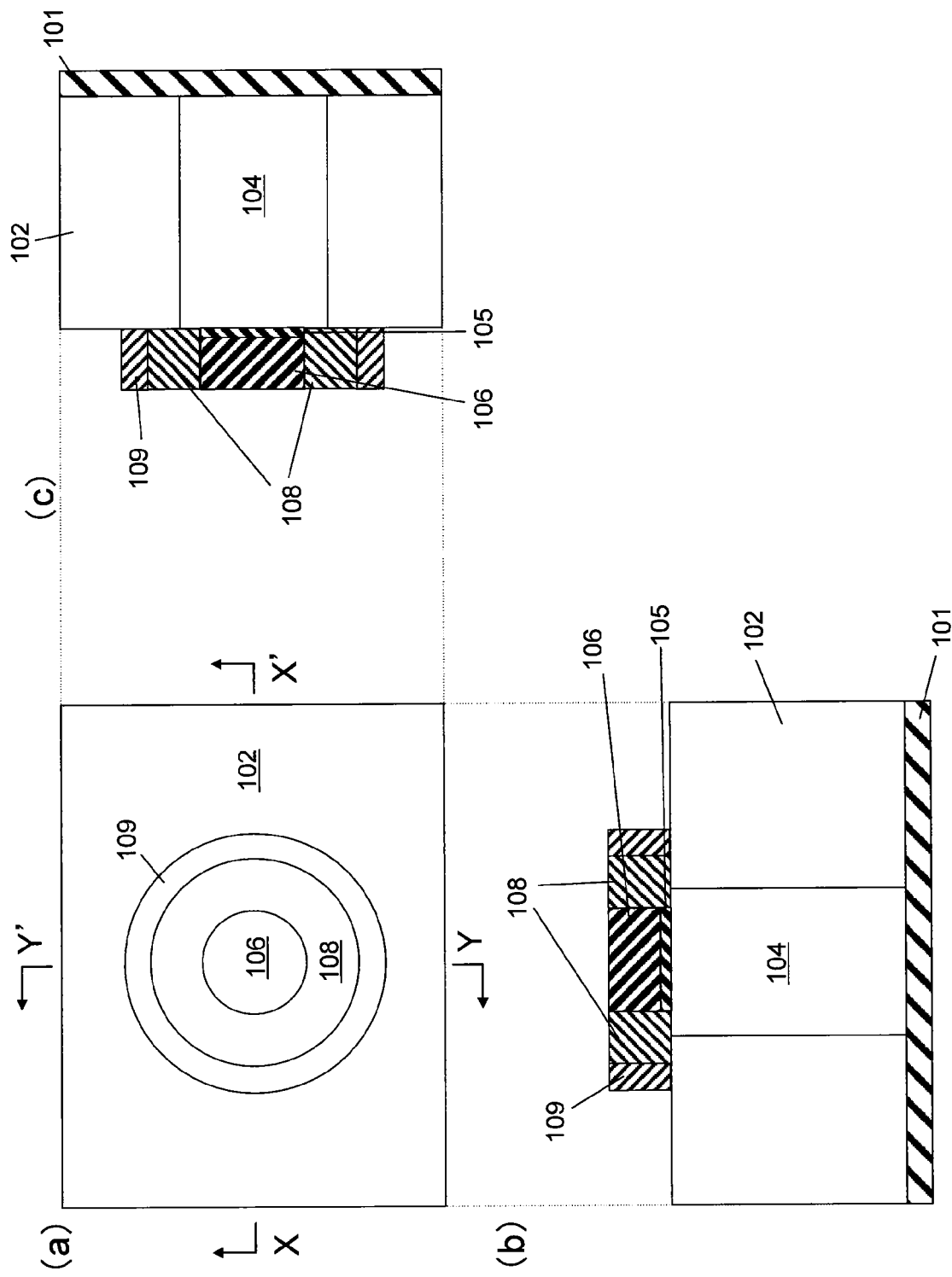
FIG. 11 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 11, the nitride film 109 is subjected to etch-back through reactive ion etching so as to be left around the oxide film 108.

Figure 12:
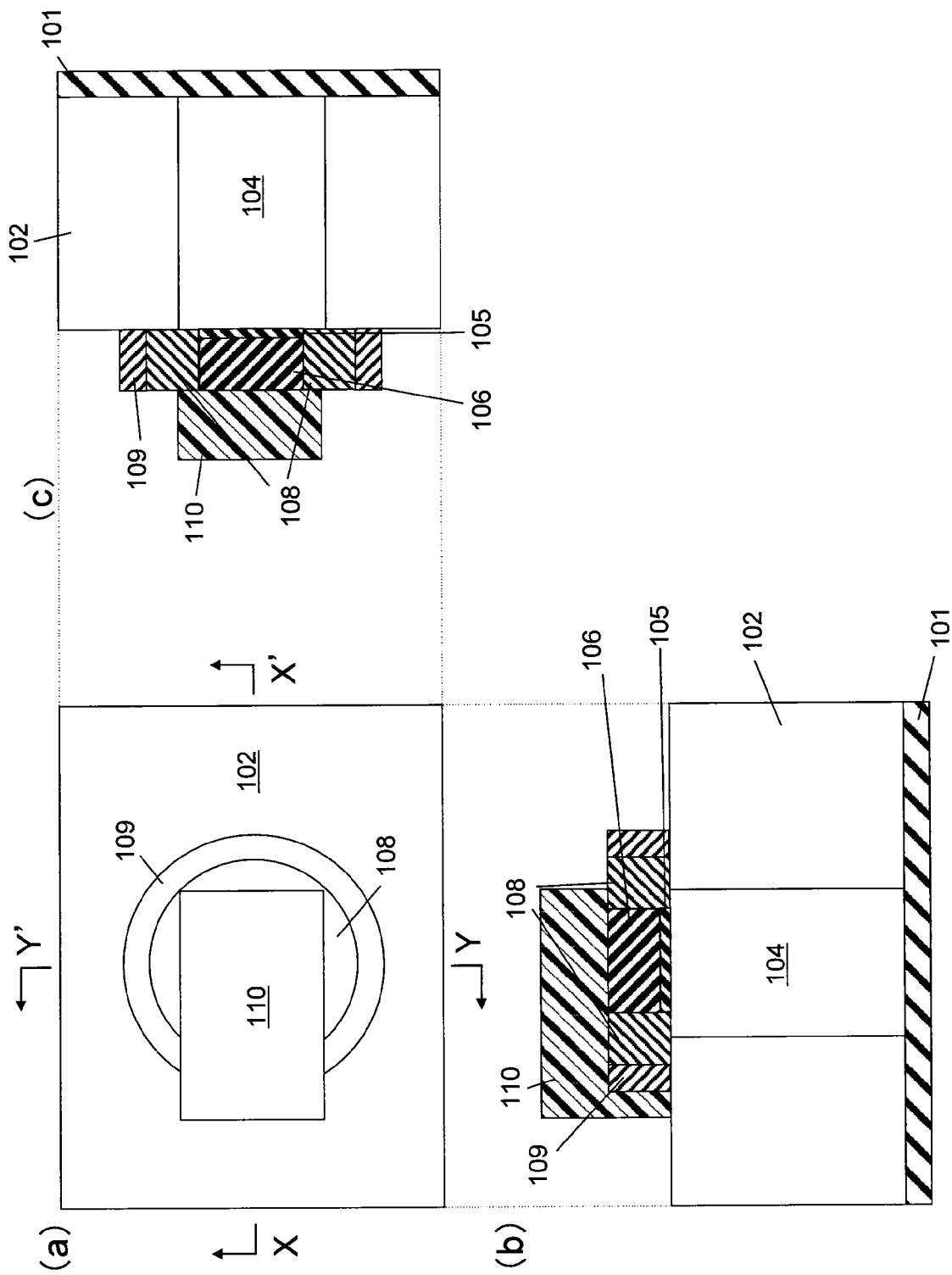
FIG. 12 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 12, a resist 110 having a predetermined pattern for forming the second arcuate silicon layer 113 is formed on the oxide film 105, the nitride film 106, the oxide film 108, and the nitride film 109.

Figure 13:
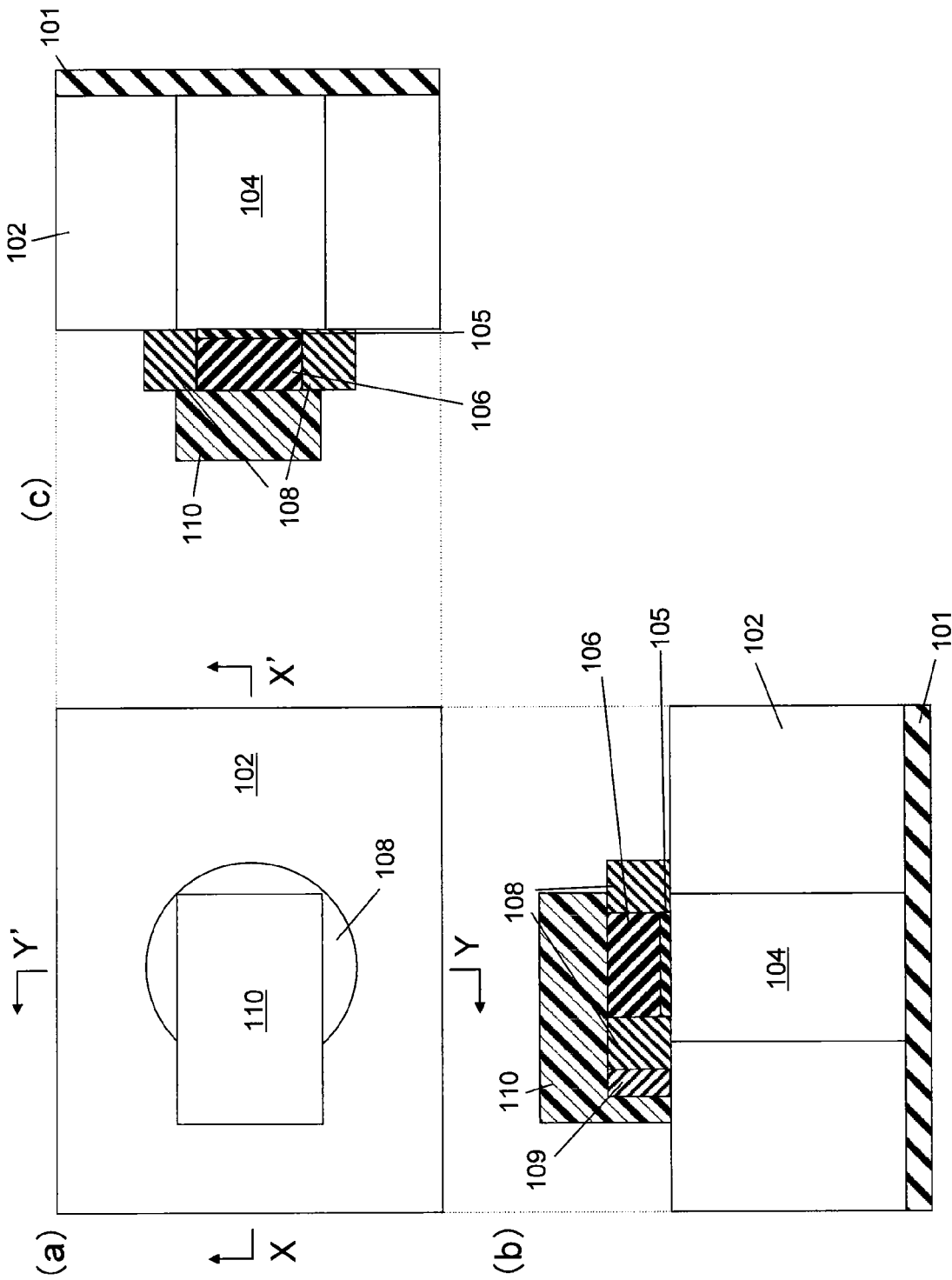
FIG. 13 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 13, the nitride film 109 is etched so as to be left at the sidewall of the oxide film 108 using the resist 110 as a mask.

Figure 14:
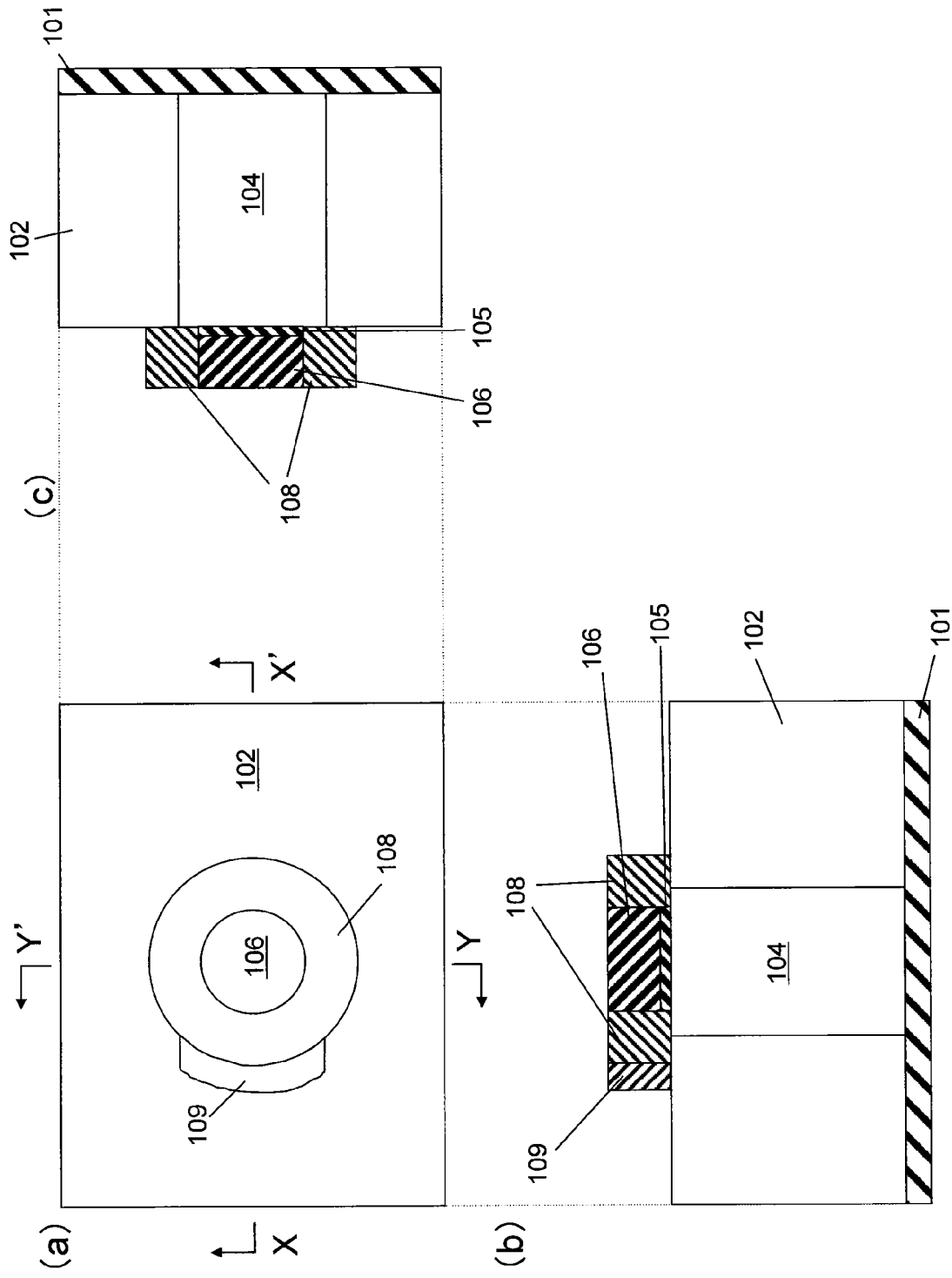
FIG. 14 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 14, the resist 110 is peeled.

Figure 15:
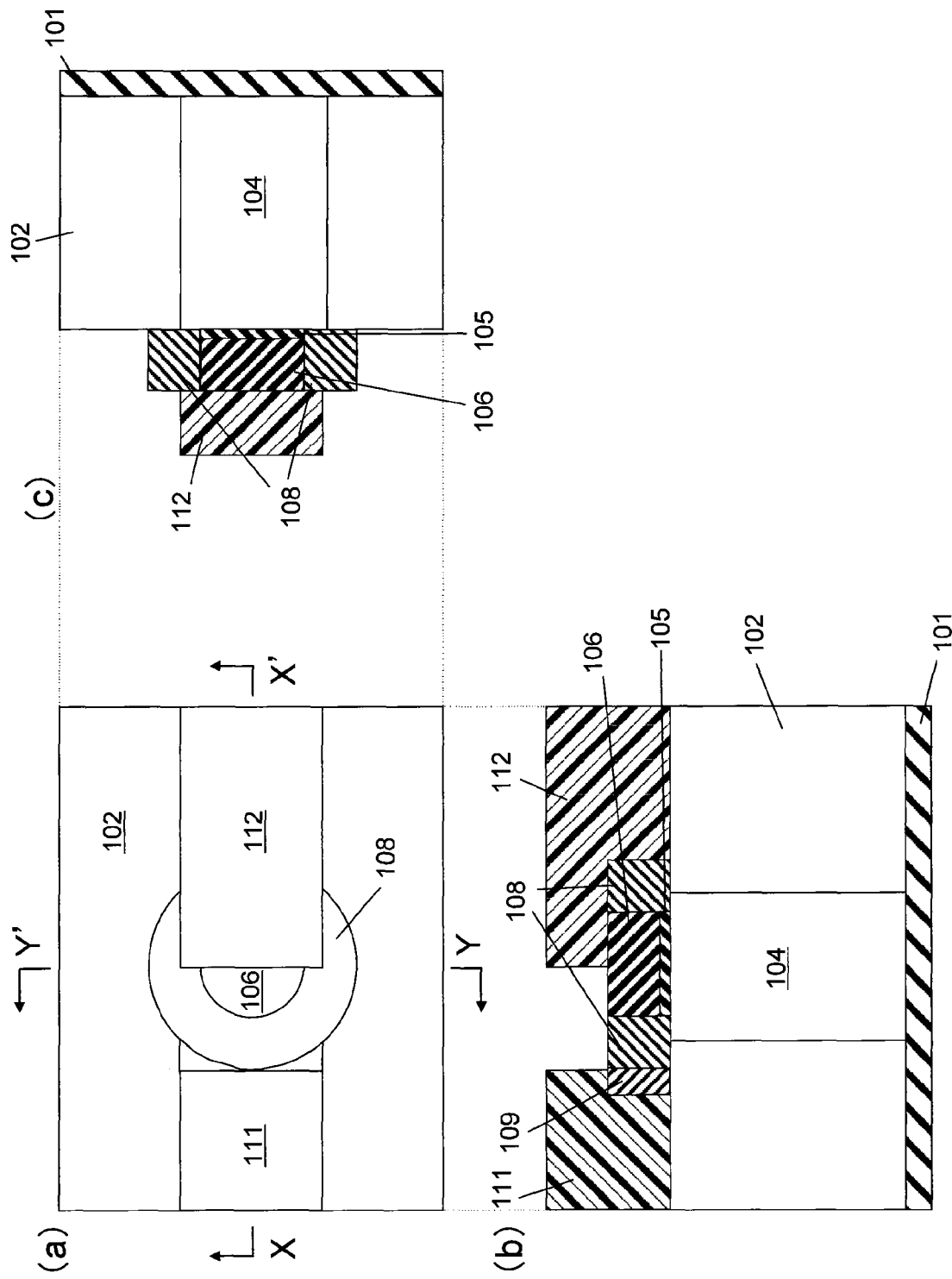
FIG. 15 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 15, resists 111 and 112 each having a predetermined pattern are formed on the silicon layer 102 so as to cover a part of the oxide film 105, a part of the nitride film 106, a part of the oxide film 108, and a part of the nitride film 109.

Figure 16:
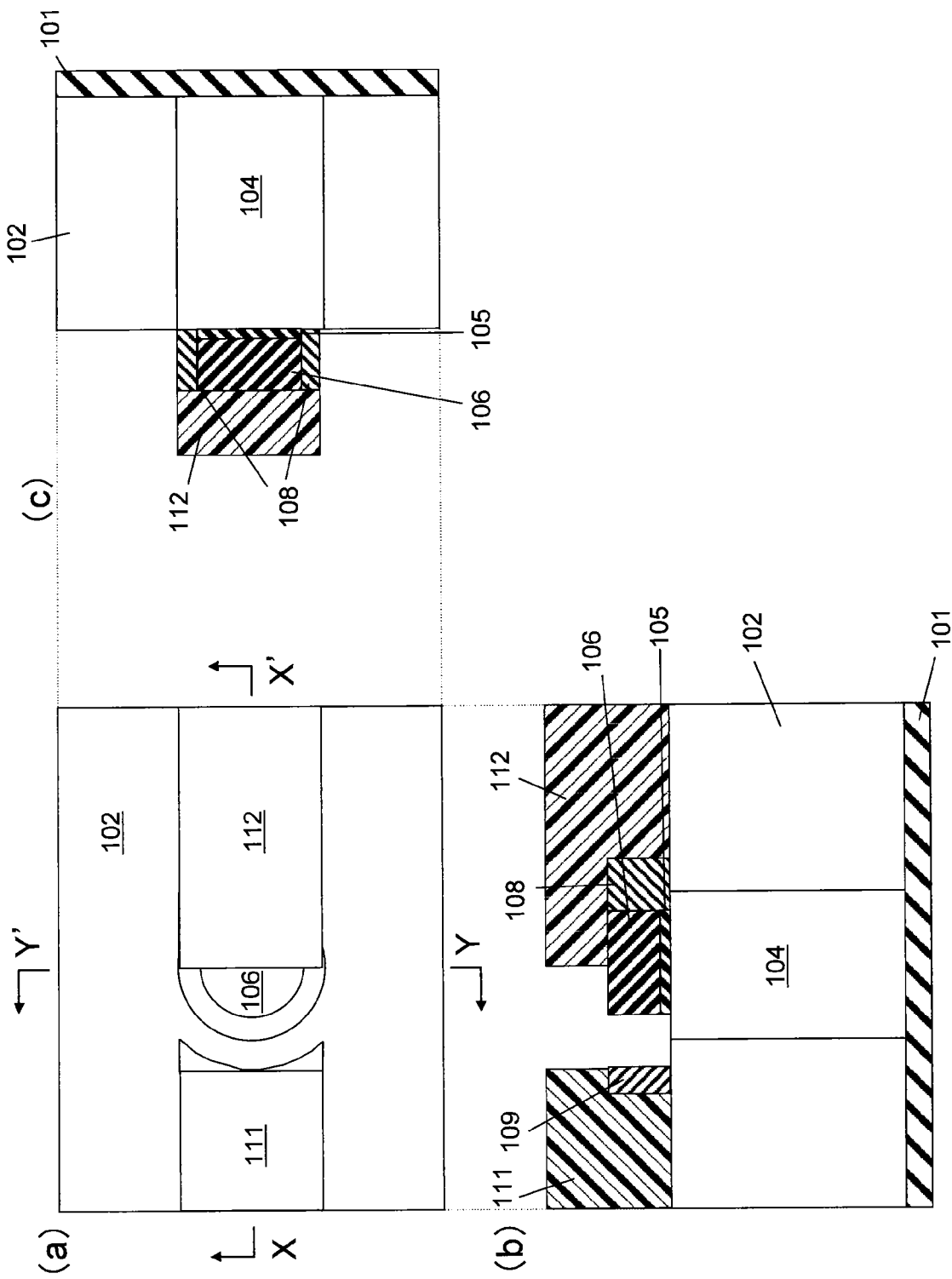
FIG. 16 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 16, only the oxide film 108 is selectively etched and eliminated using the resists 111 and 112 as masks.

Figure 17:
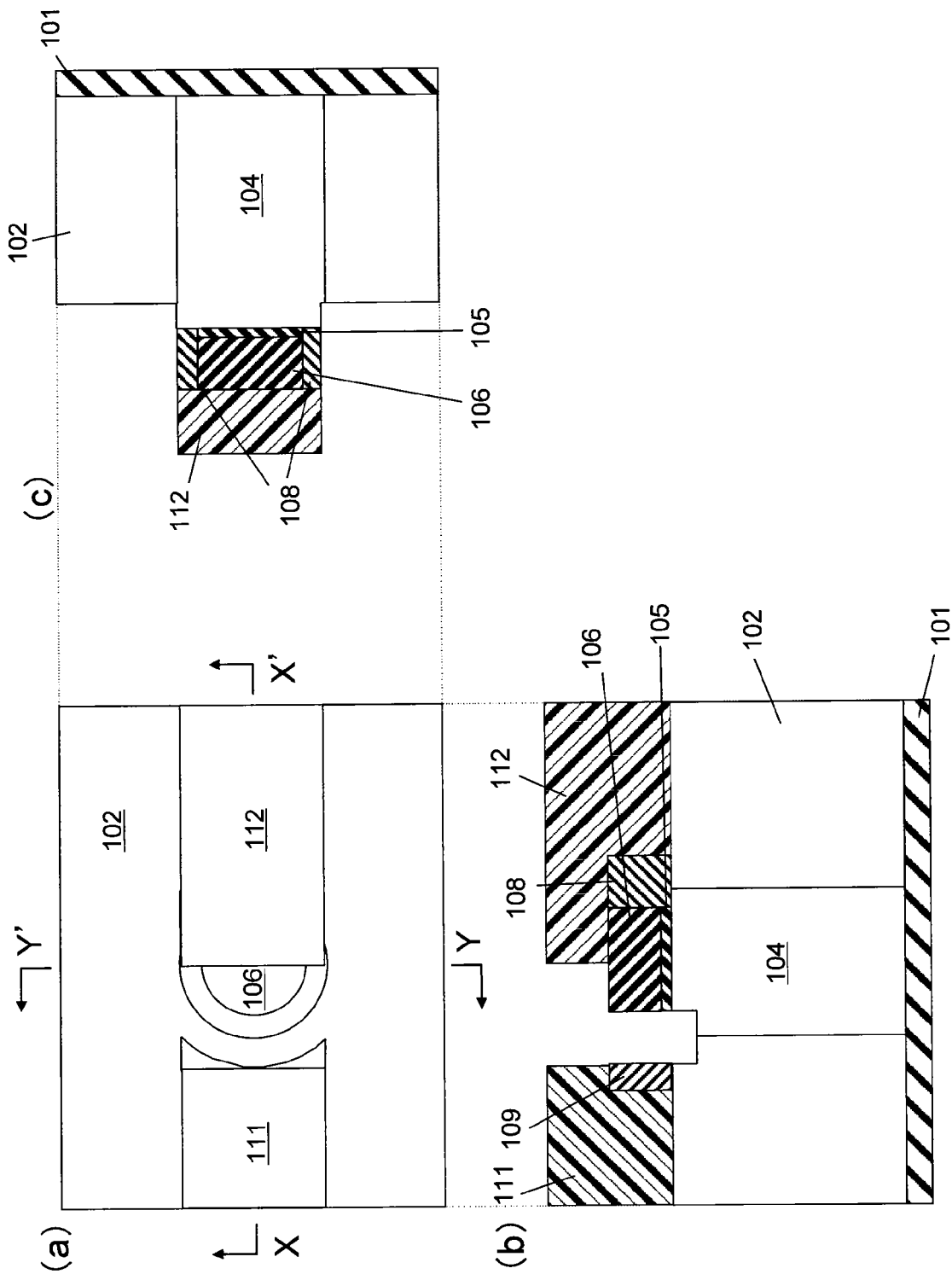
FIG. 17 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 17, the silicon at the surface layer of the silicon layer 102 is etched and eliminated through a space where the eliminated oxide film 108 was present.

Figure 18:
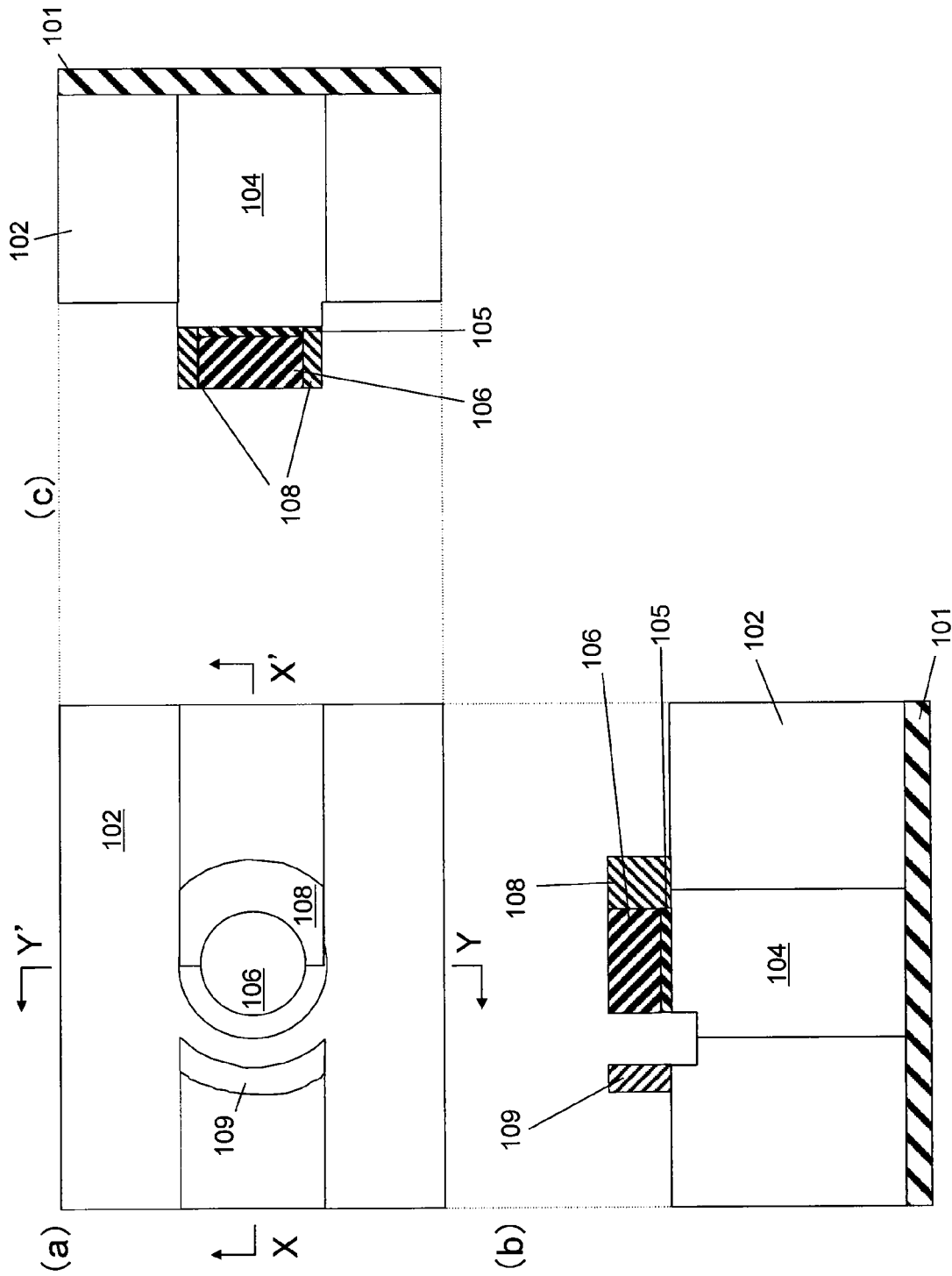
FIG. 18 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 18, the resists 111 and 112 are peeled.

Figure 19:
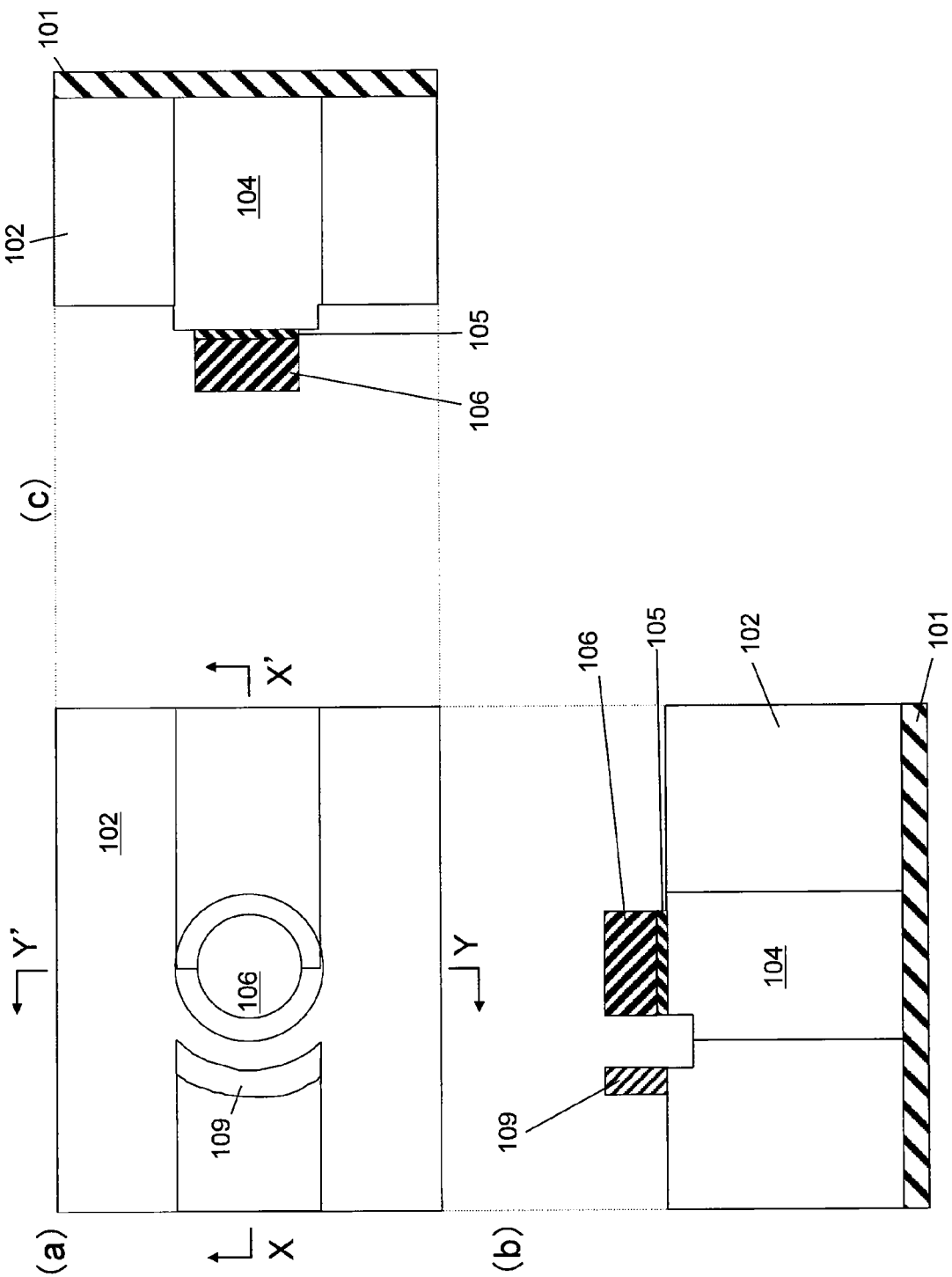
FIG. 19 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 19, the oxide film 108 is etched and eliminated.

Figure 20:
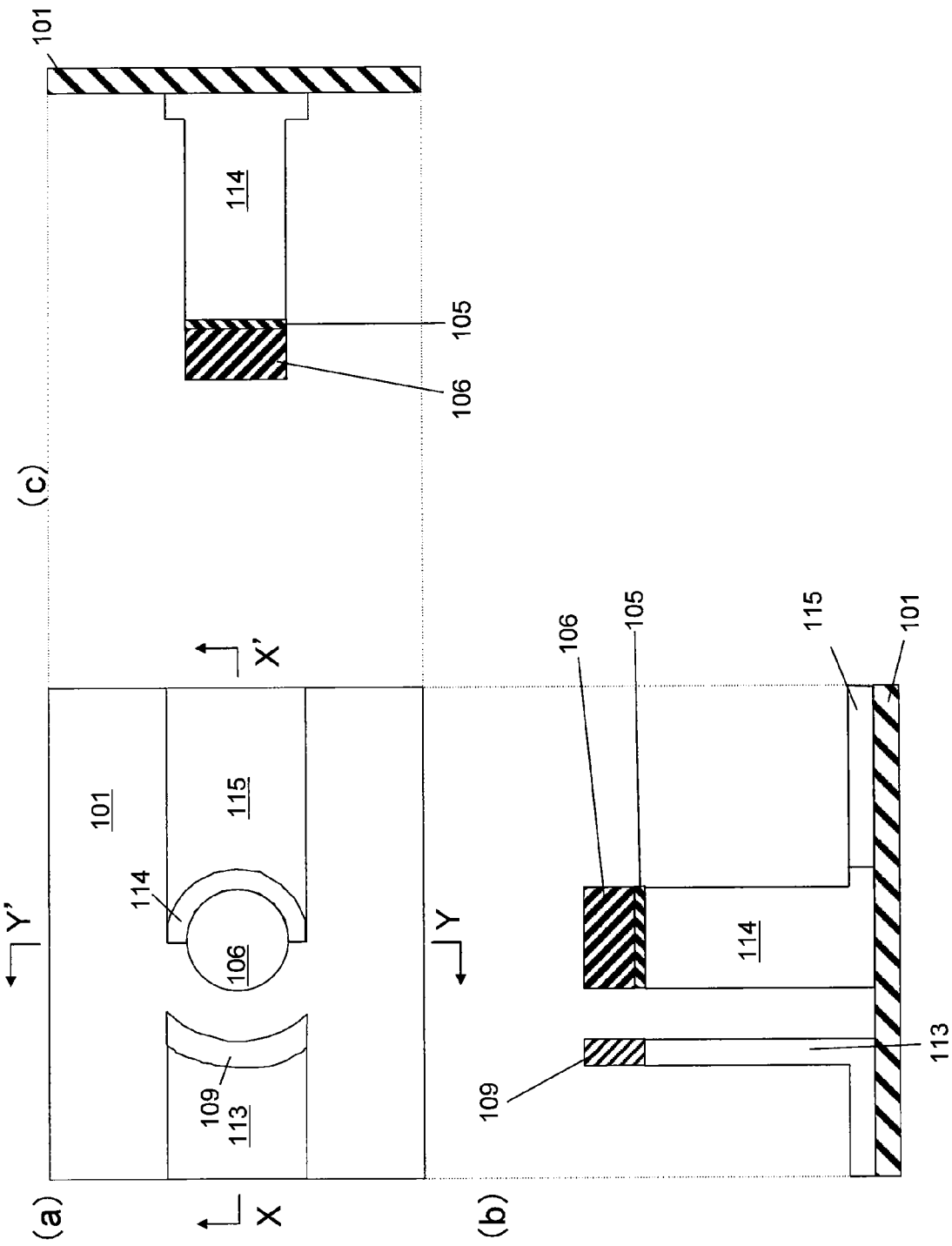
FIG. 20 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 20, the silicon of the silicon layer 102 is etched to a predetermined depth by anisotropic etching using the oxide film 106 and the nitride film 109 as etching resists. Accordingly, the island silicon layer 114, the second arcuate silicon layer 113, and a p-type or non-doped silicon layer 115 are formed.

Figure 21:
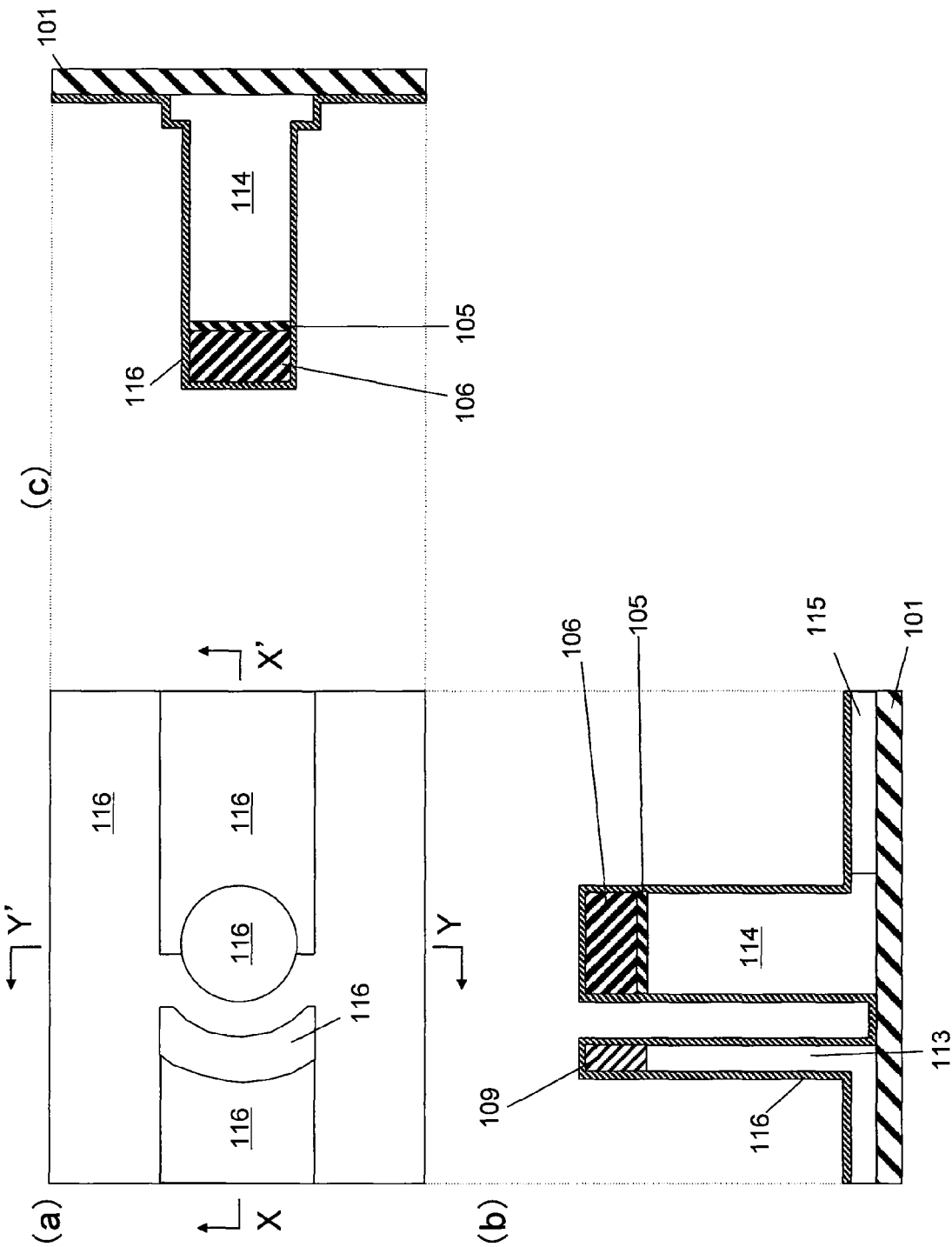
FIG. 21 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 21, a nitride film 116 is deposited so as to thinly cover the nitride film 109, the nitride film 106, the island silicon layer 114, the second arcuate silicon layer 113, and the p-type or non-doped silicon layer 115 with a uniform thickness.

Figure 22:
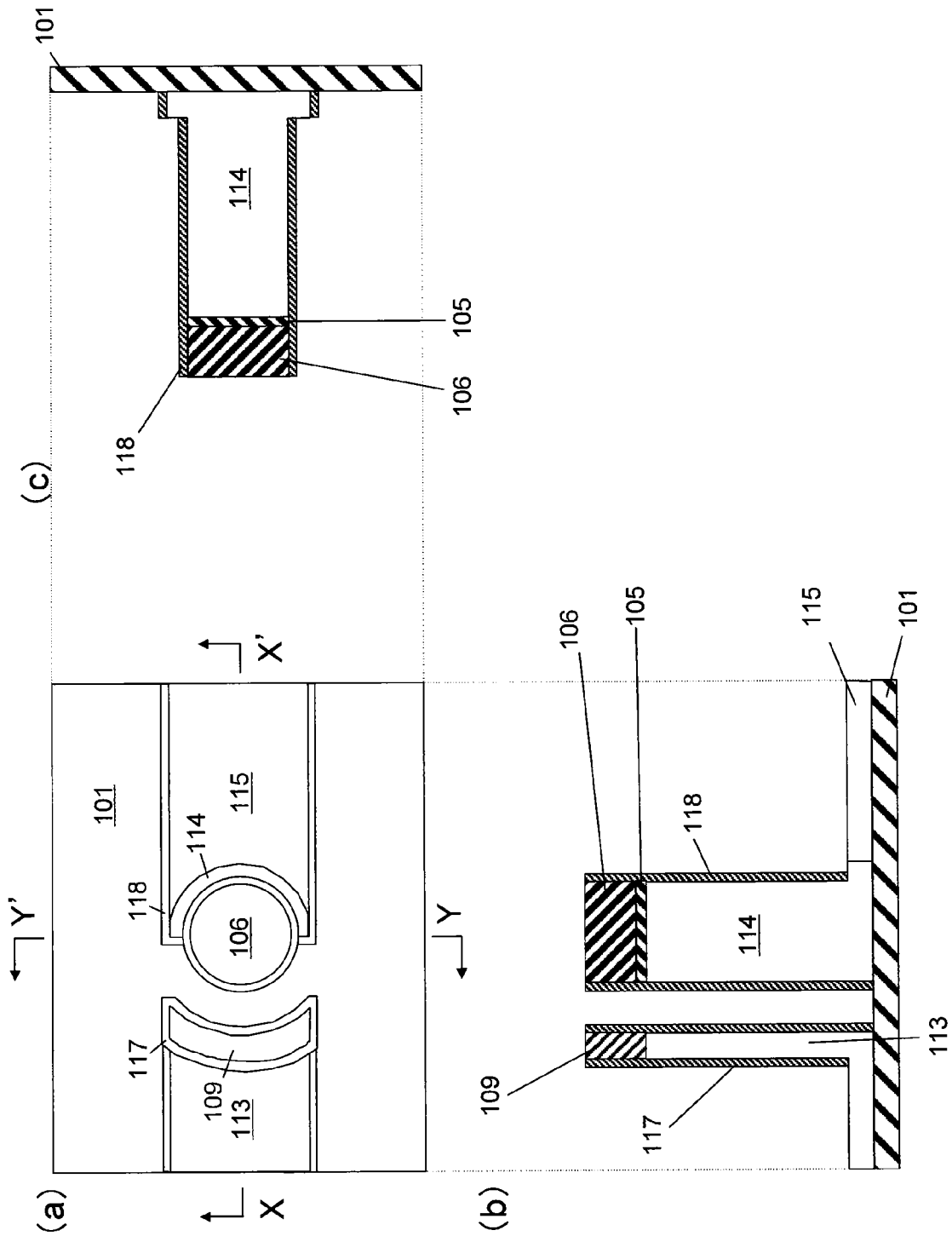
FIG. 22 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 22, the nitride film 116 is etched by anisotropic etching so as to be left as a sidewall spacer at respective sidewalls of the island silicon layer 114 and the second arcuate silicon layer 113, thereby forming nitride-film sidewalls 117 and 118.

Figure 23:
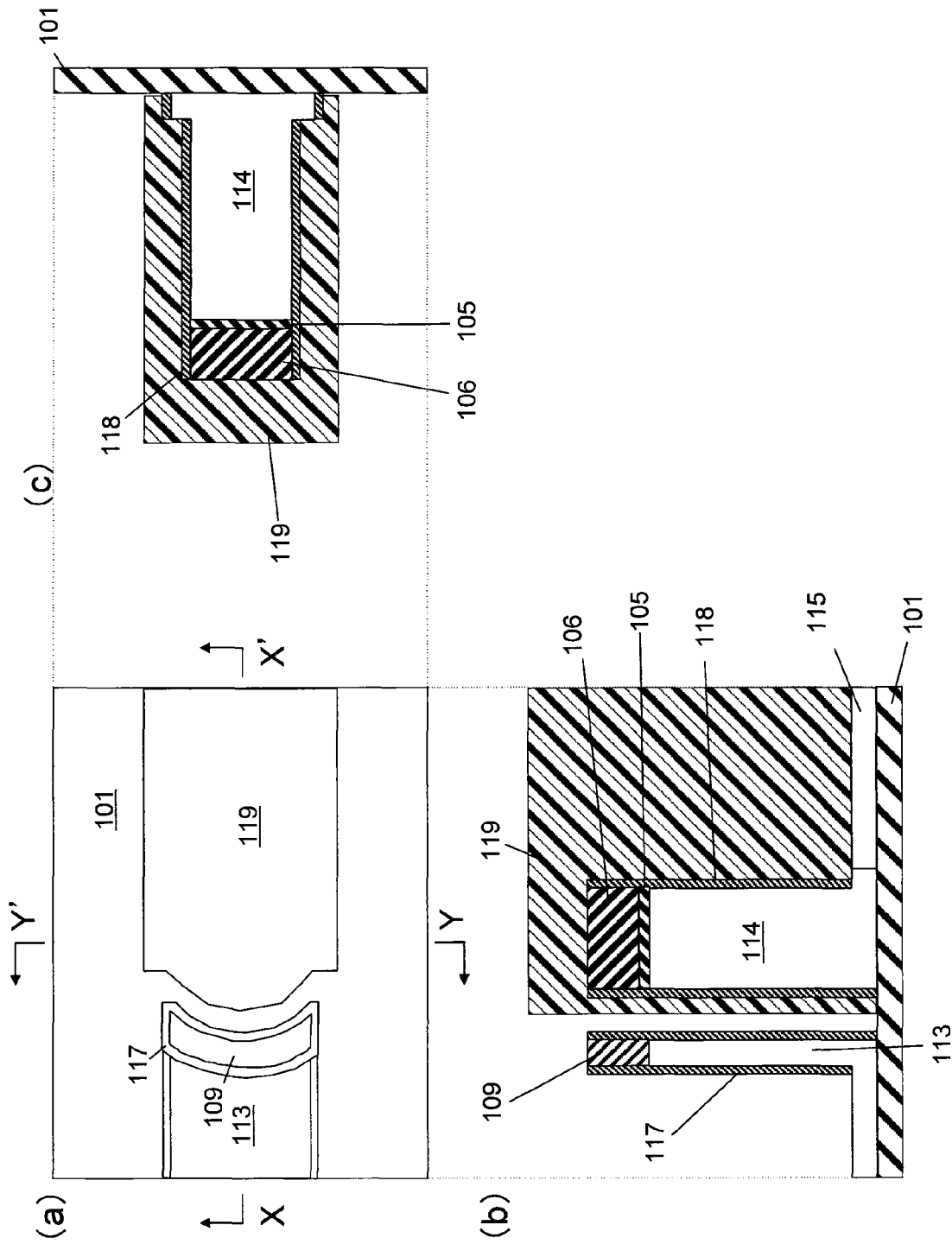
FIG. 23 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 23, a resist 119 for impurity doping is formed so as to cover the island silicon layer 114 over the nitride-film sidewall 118 and the nitride film 106.

Figure 24:
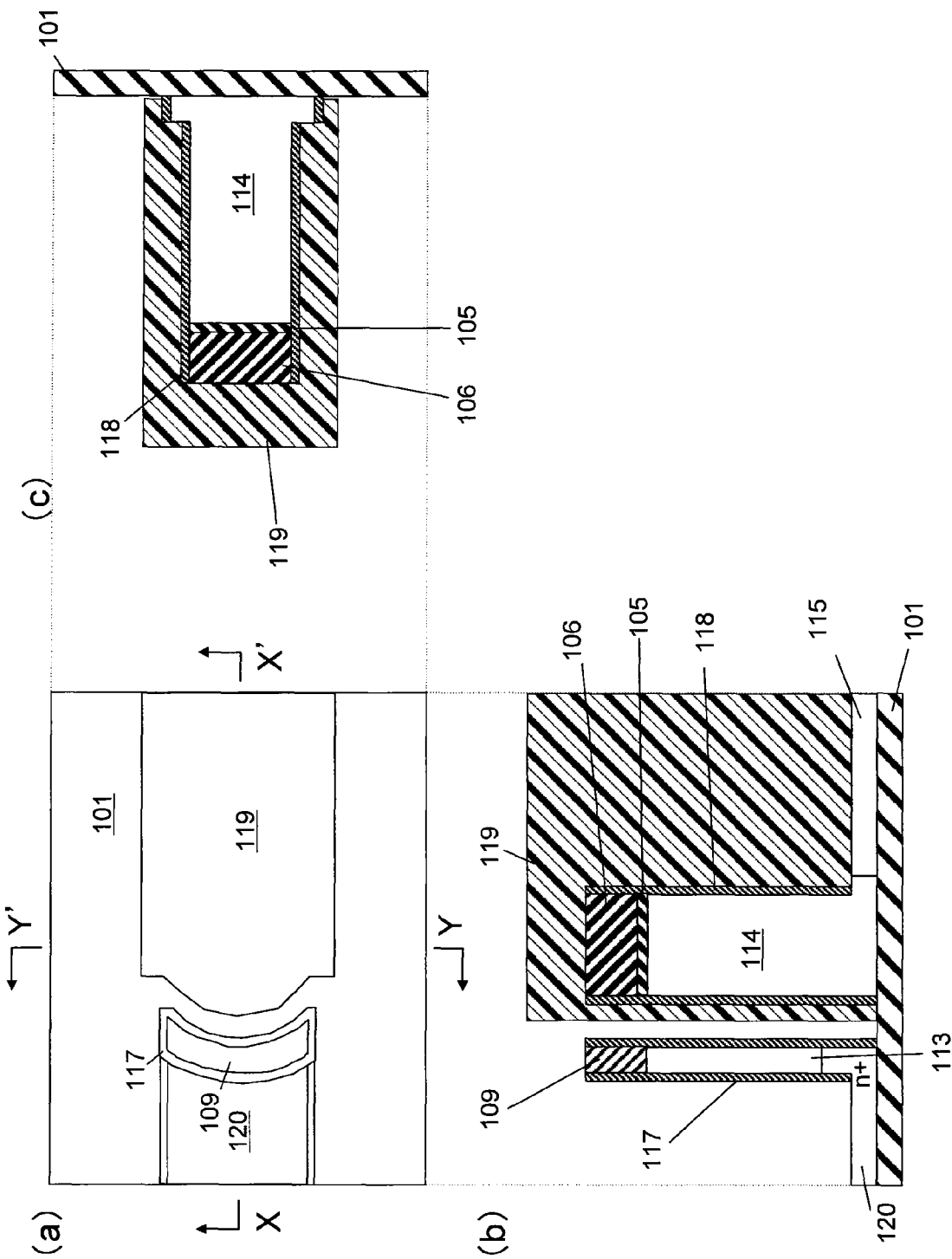
FIG. 24 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 24, arsenic (As) is doped to an extending part of the second arcuate silicon layer 113 running outwardly (in a direction apart from the island silicon layer 114) and in the horizontal direction to form the n+-type silicon layer 120 using the resist 119 as a mask.

Figure 25:
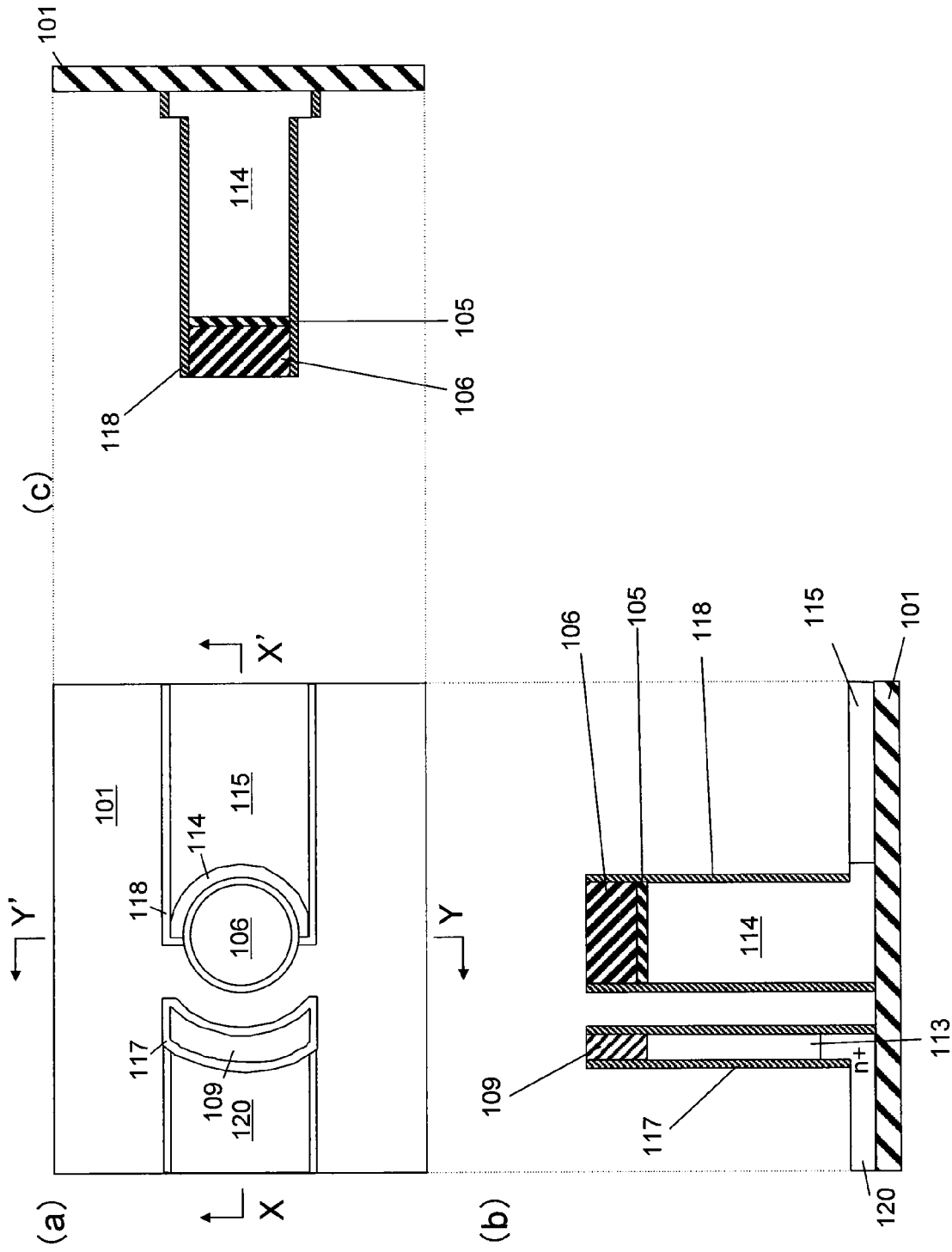
FIG. 25 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 25, the resist 119 is peeled.

Figure 26:
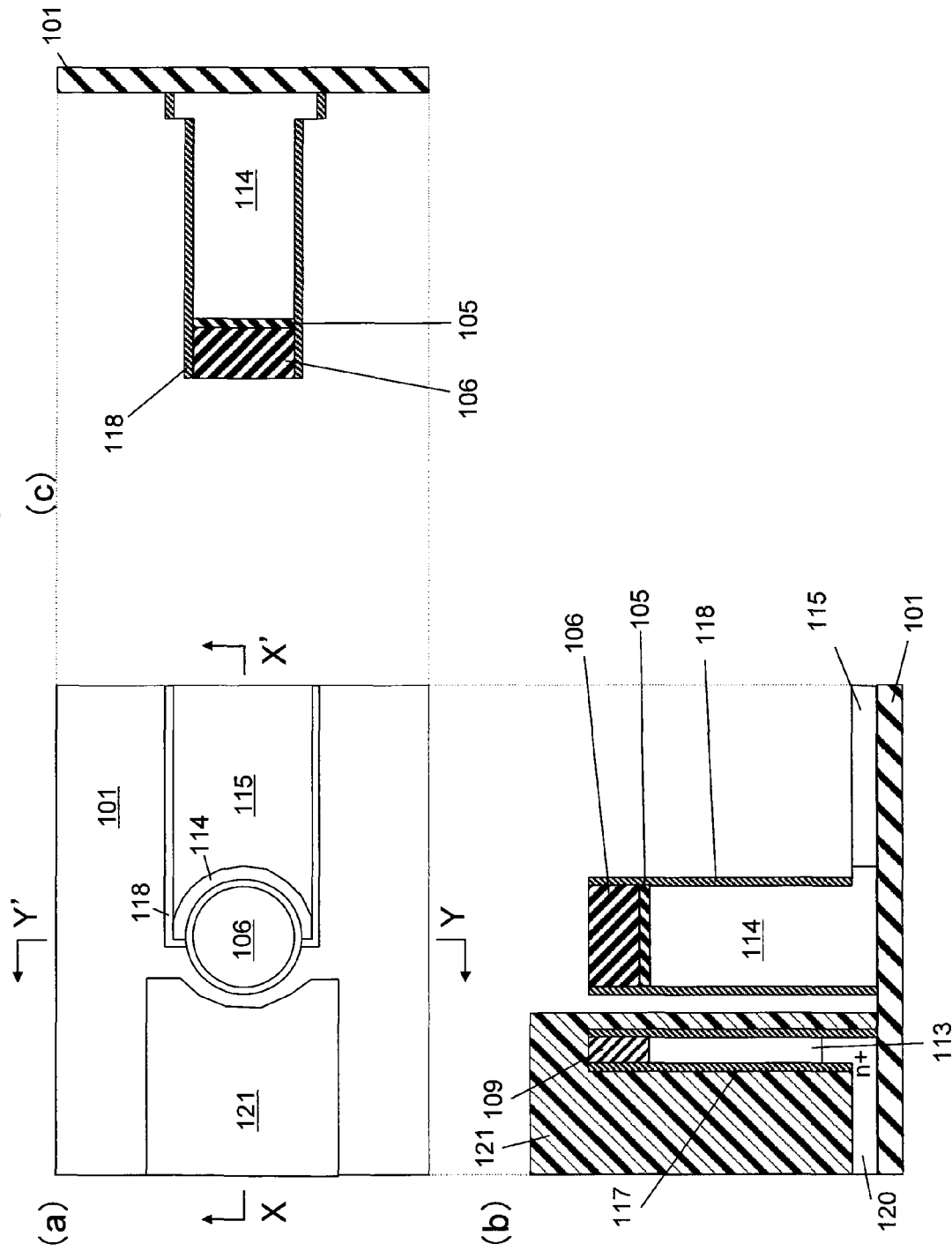
FIG. 26 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 26, a resist 121 for impurity doping is formed so as to cover the second arcuate silicon layer 113 over the nitride-film sidewall 117 and the nitride film 109.

Figure 27:
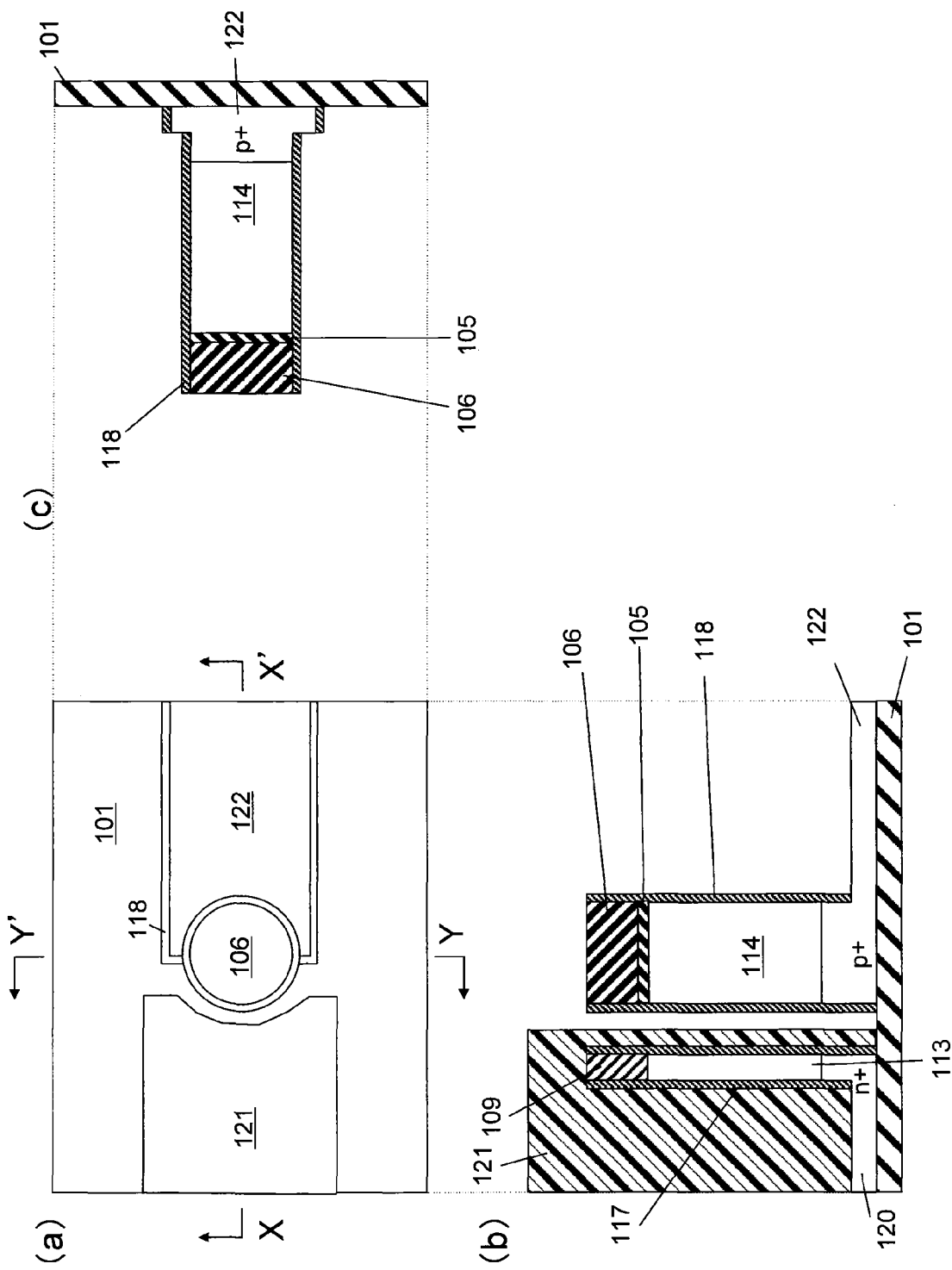
FIG. 27 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 27, boron (B) is doped to an extending part of the island silicon layer 114 running outwardly of a columnar part thereof (in a direction apart from the columnar part of the island silicon layer 114) and in the horizontal direction to form the p+-type silicon layer 122 using the resist 121 as a mask.

Figure 28:
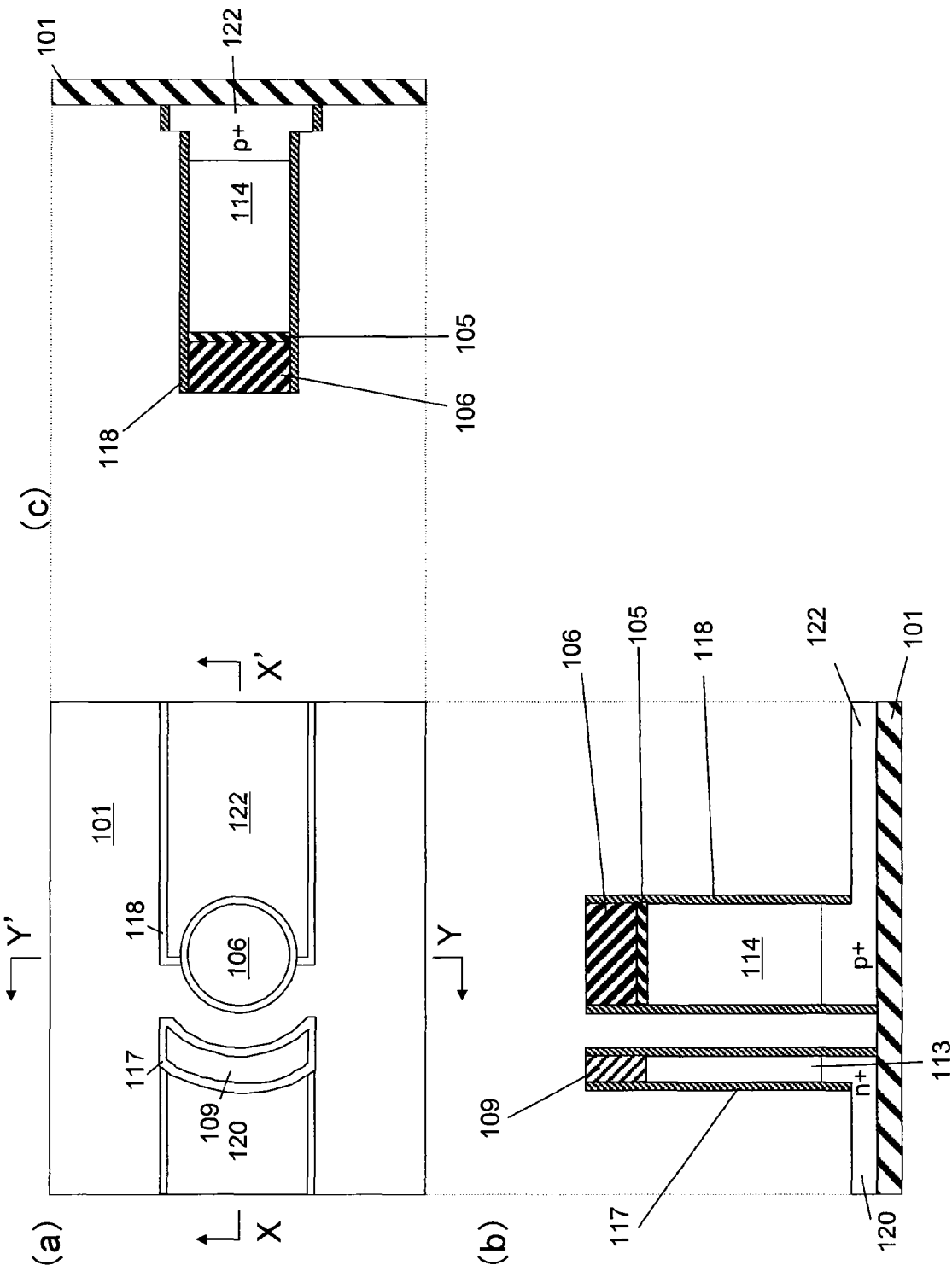
FIG. 28 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 28, the resist 121 is peeled.

Figure 29:
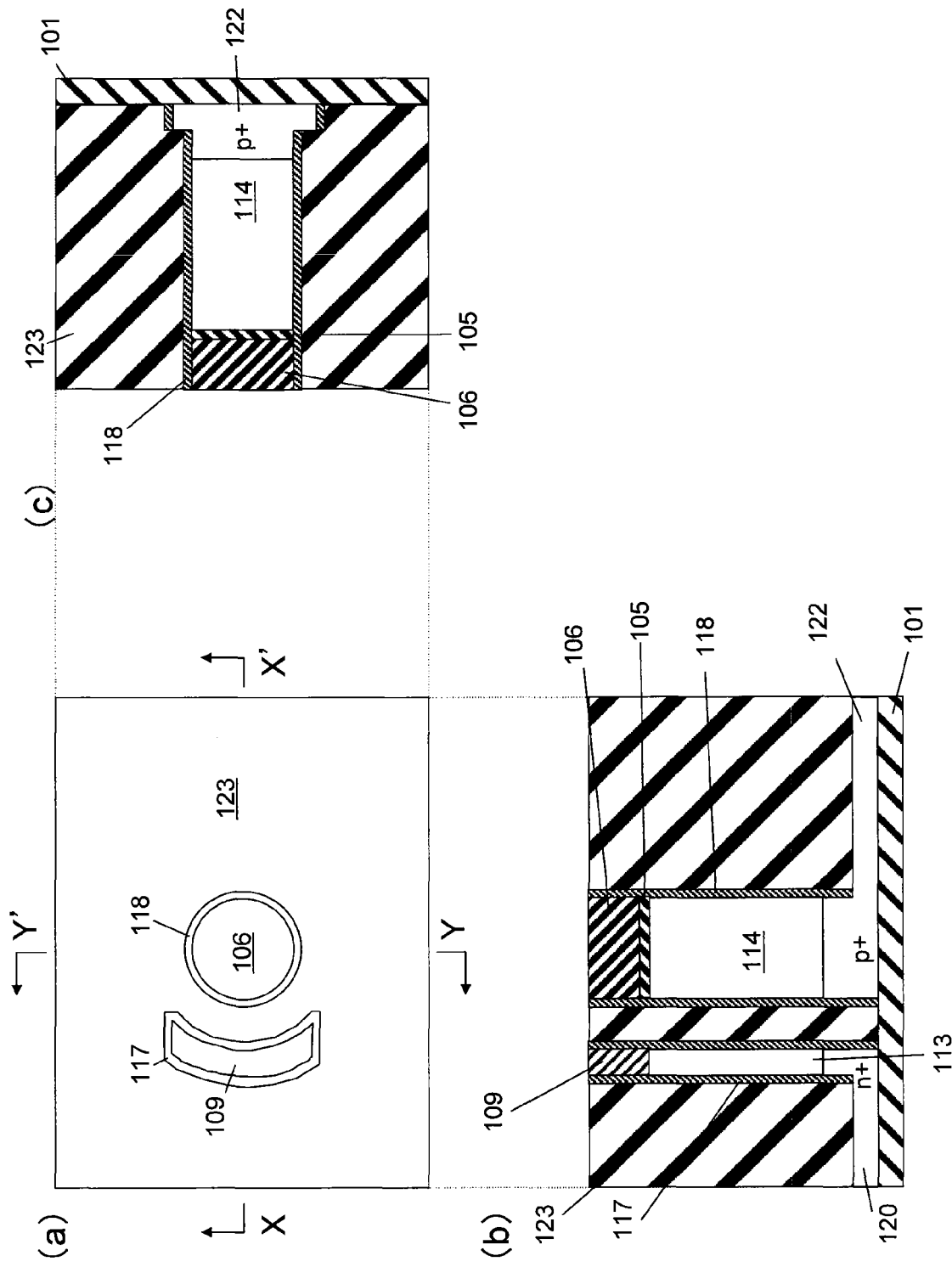
FIG. 29 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 29, an oxide film 123 is deposited until it exceeds a height of the columnar part of the second arcuate silicon layer 113 and that of the island silicon layer 114 so as to fill a space present around the sidewall of the columnar part of the second arcuate silicon layer 113 and that of the island silicon layer 114, and planarized by CMP (Chemical Mechanical Polishing)

Figure 30:
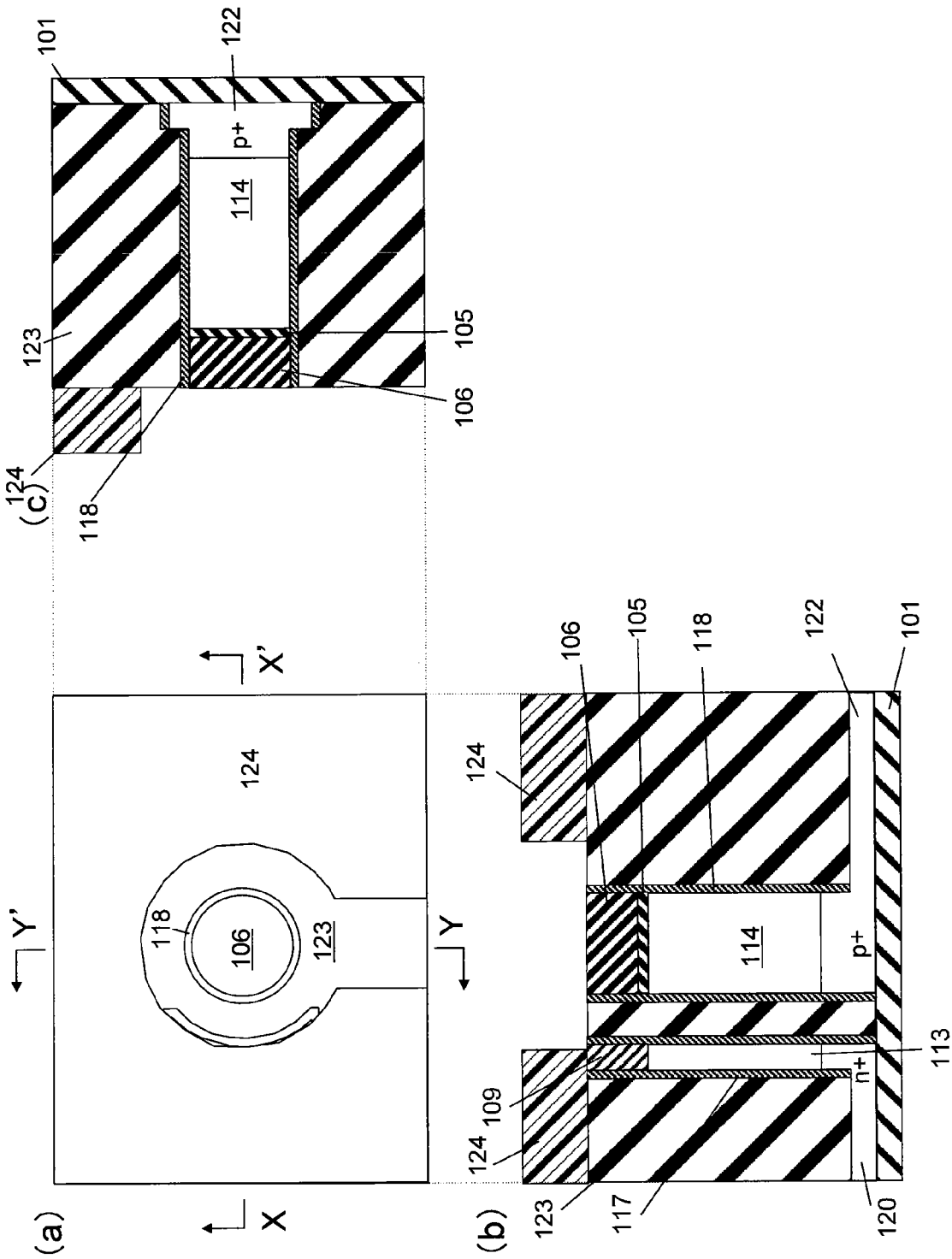
FIG. 30 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 30, a resist 124 having a predetermined pattern for etching a gate part is formed at predetermined positions on the oxide film 123 and on the second arcuate silicon layer 113.

Figure 31:
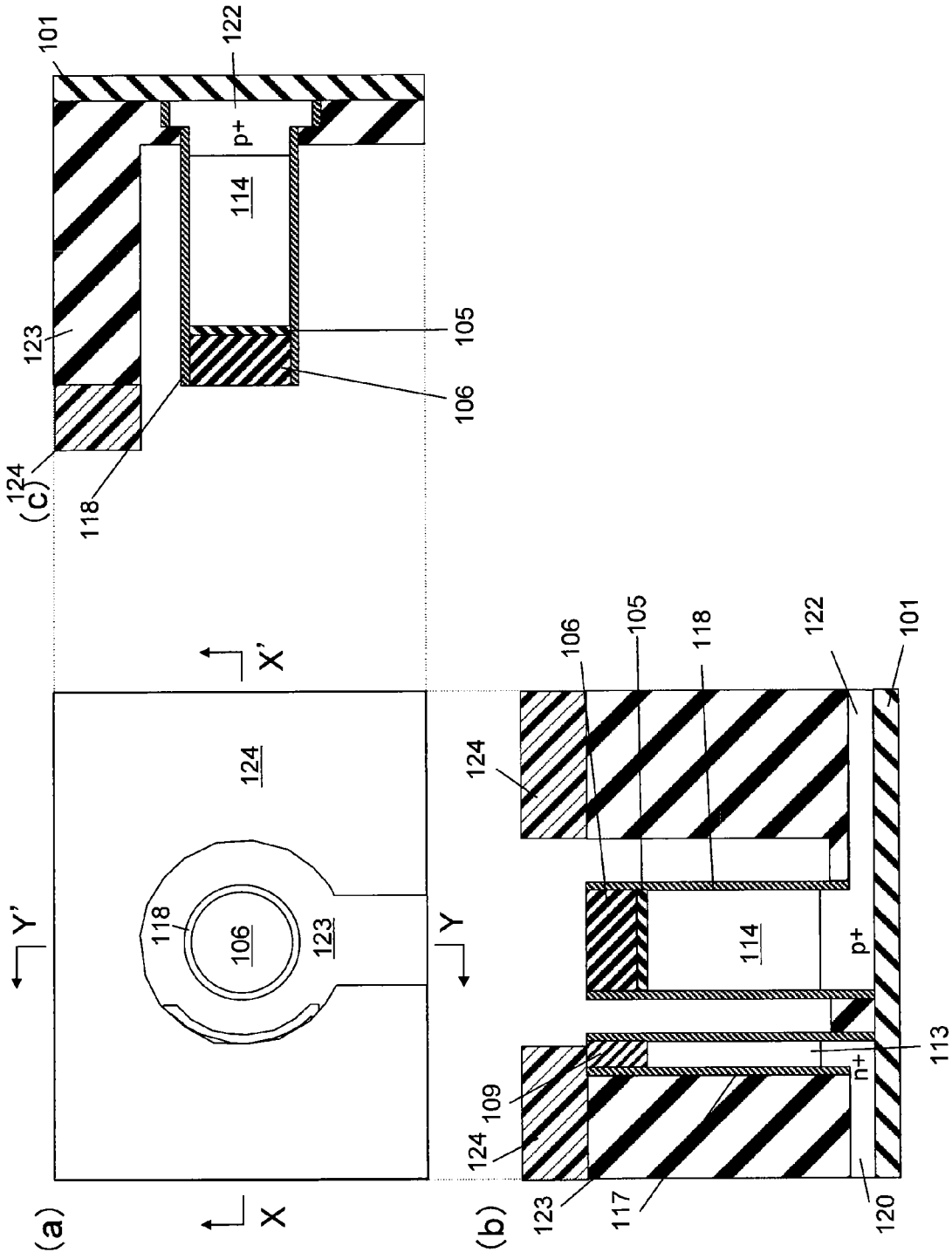
FIG. 31 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 31, the oxide film 123 around the island silicon layer 114 is etched to a predetermined depth and eliminated.

Figure 32:
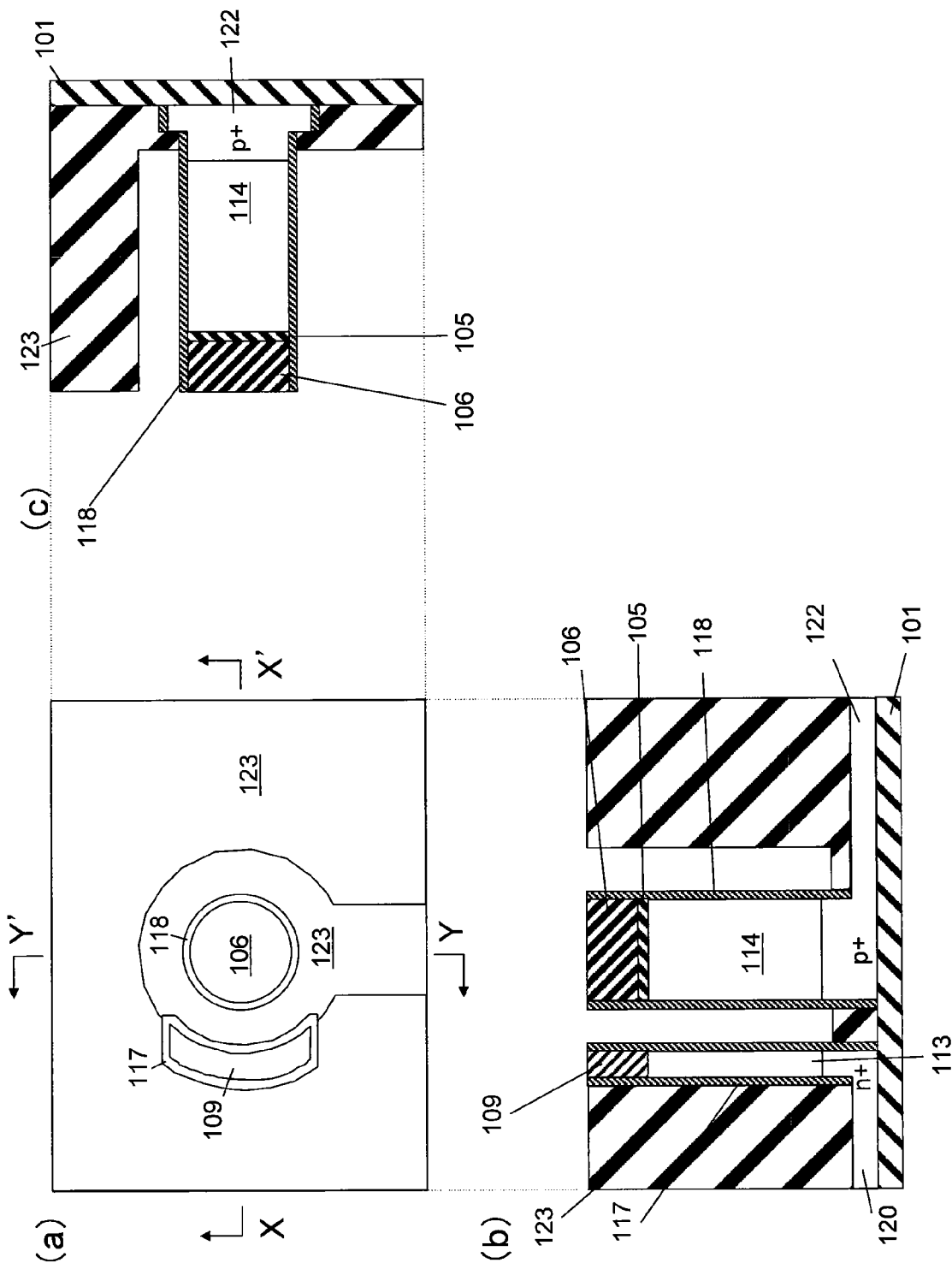
FIG. 32 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 32, the resist 124 is peeled.

Figure 33:
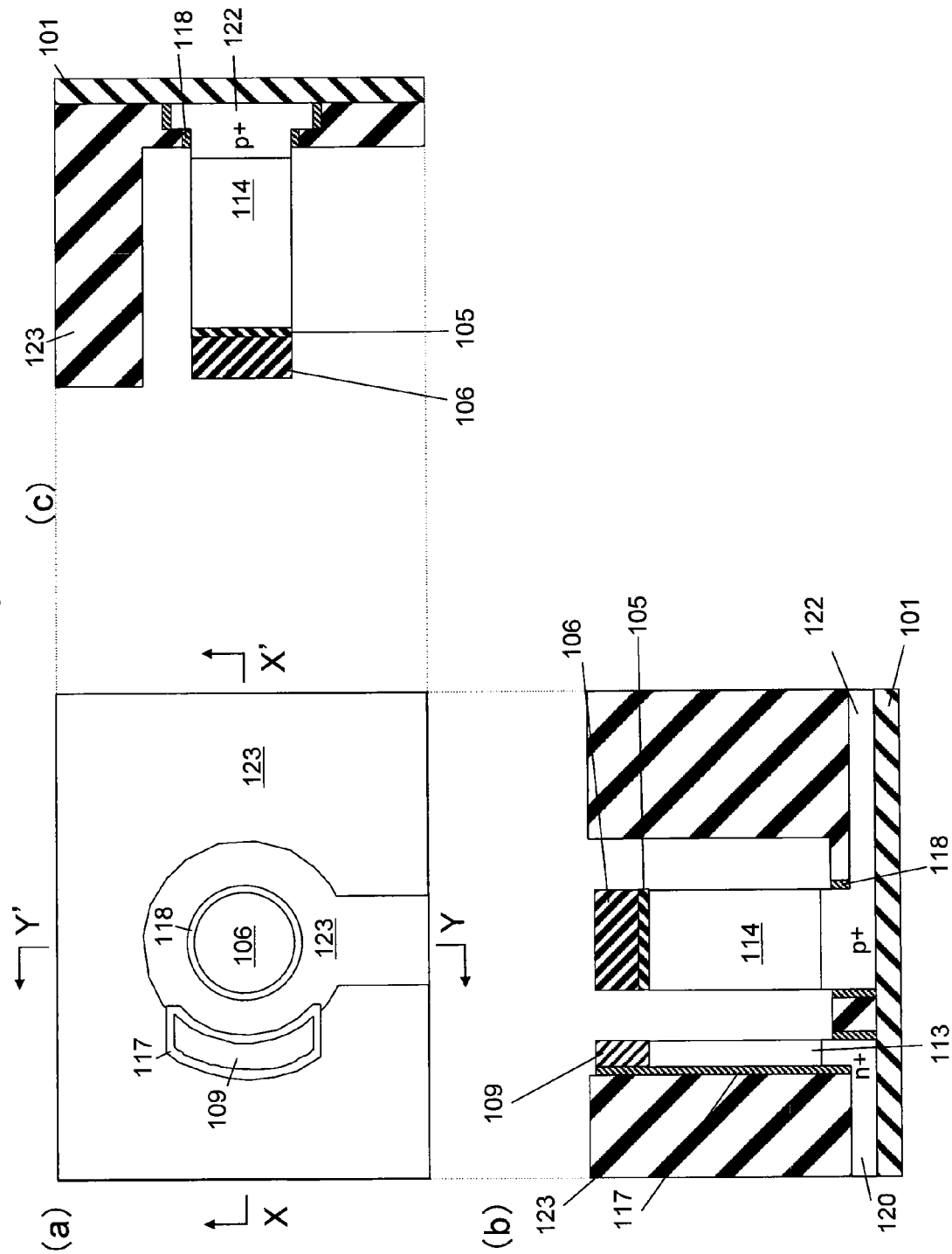
FIG. 33 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 33, the nitride-film sidewall 118 at the sidewall of the island silicon layer 114 and the nitride-film sidewall 117 at the sidewall of the second arcuate silicon layer 113 are etched and eliminated.

Figure 34:
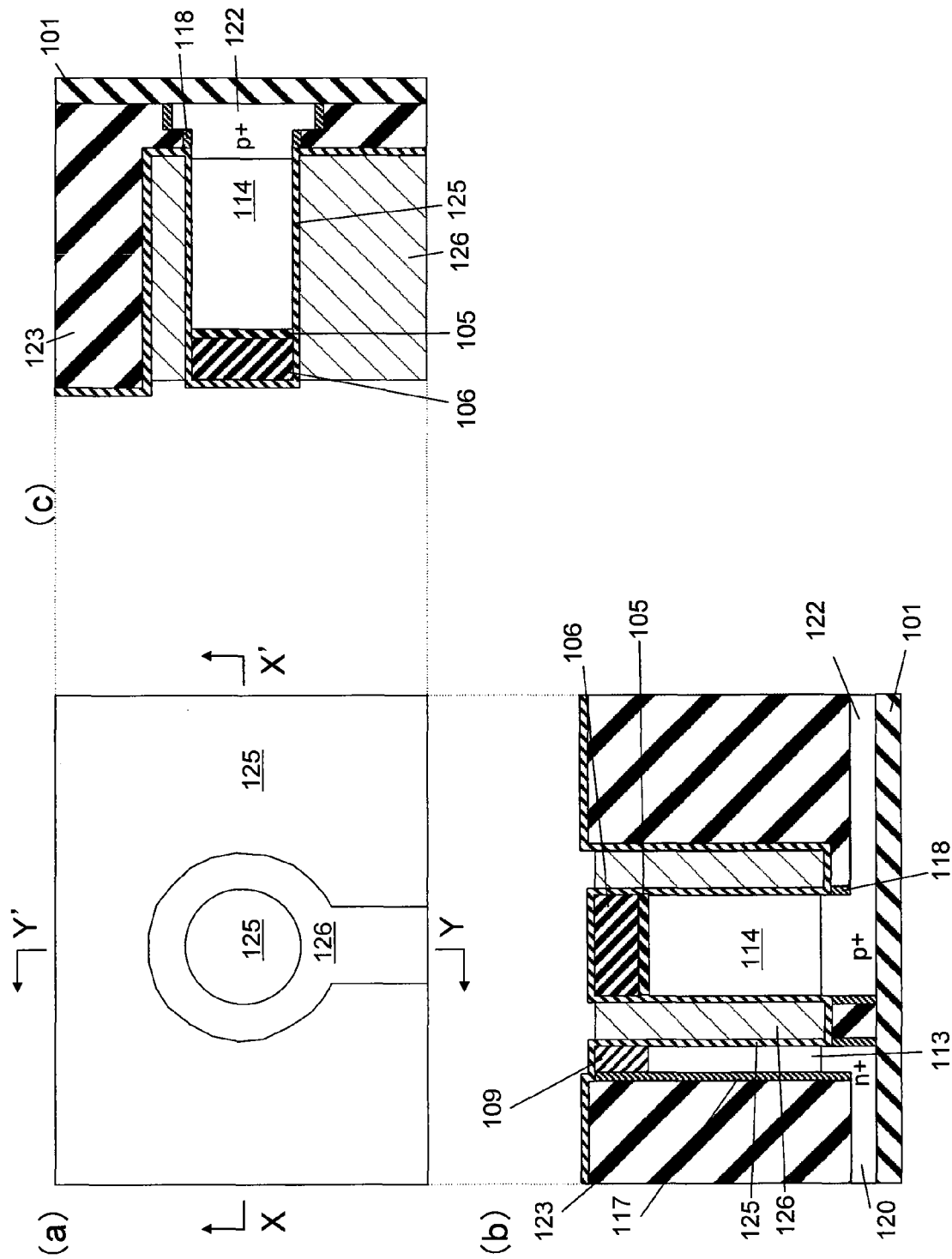
FIG. 34 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 34, a high dielectric film 125 which will be the first gate insulating film 125a and the second gate insulating film 125b, and, the metal 126 like aluminum for forming the gate electrode 126 are all deposited on the island silicon layer 114, on the second arcuate silicon layer 113, and on the oxide film 123, and planarized by CMP.

Figure 35:
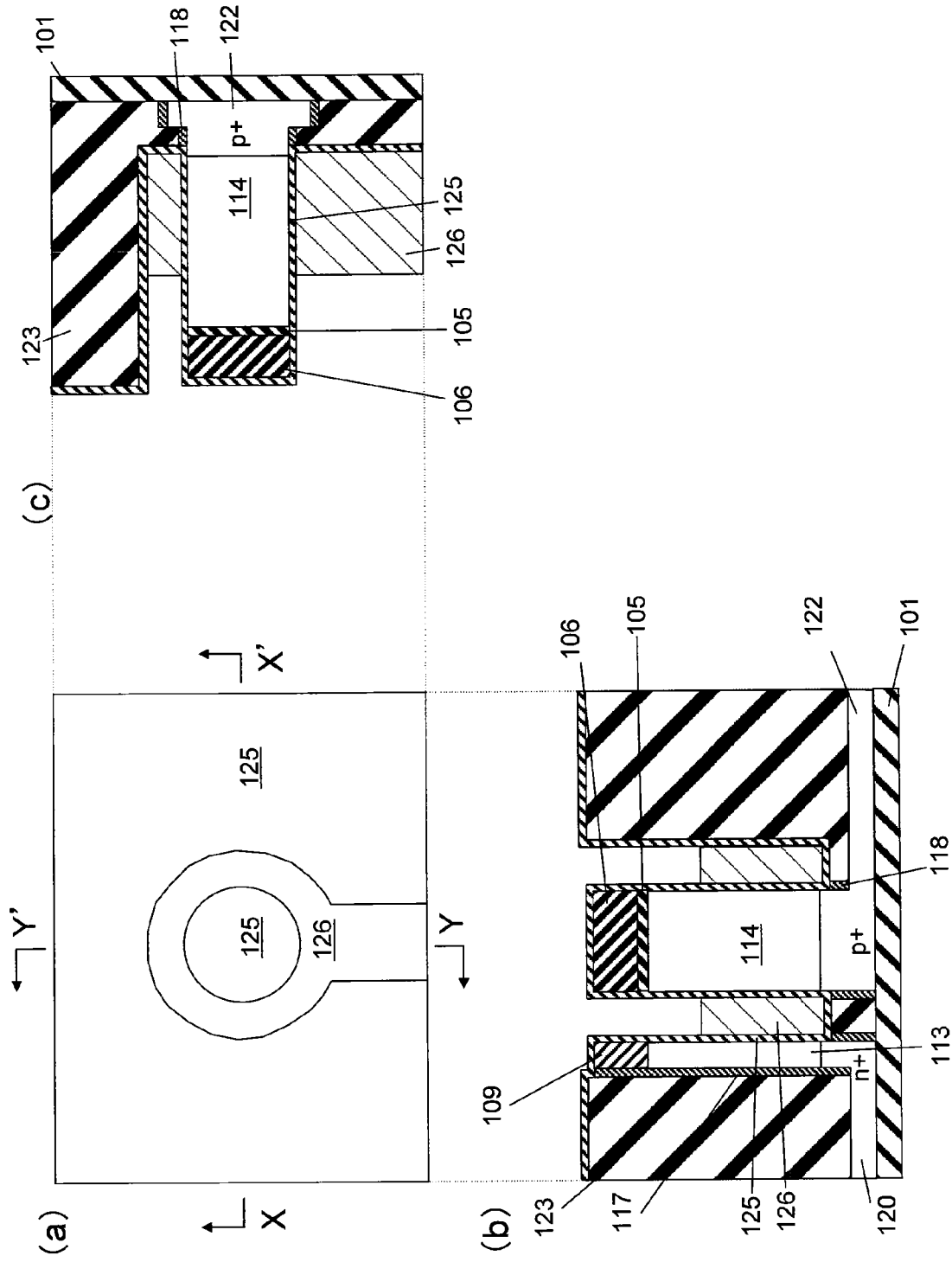
FIG. 35 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 35, the metal 126 around the island silicon layer 114 is subjected to etch-back to a predetermined depth (a center position of the height direction of the islands silicon layer 114).

Figure 36:
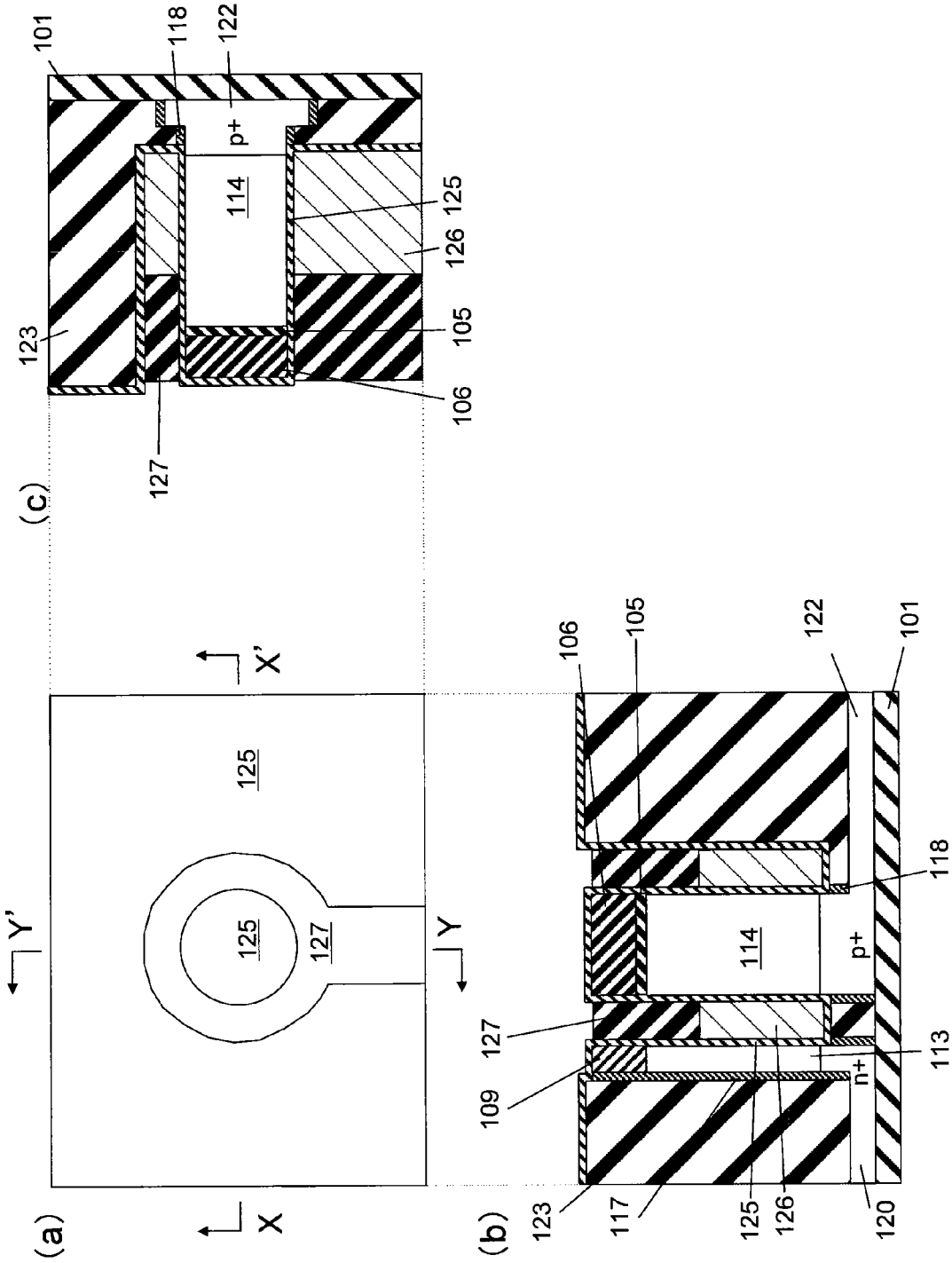
FIG. 36 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 36, an oxide film 127 is deposited in a space where the metal 126 subjected to etch-back was eliminated, and planarized by CMP.

Figure 37:
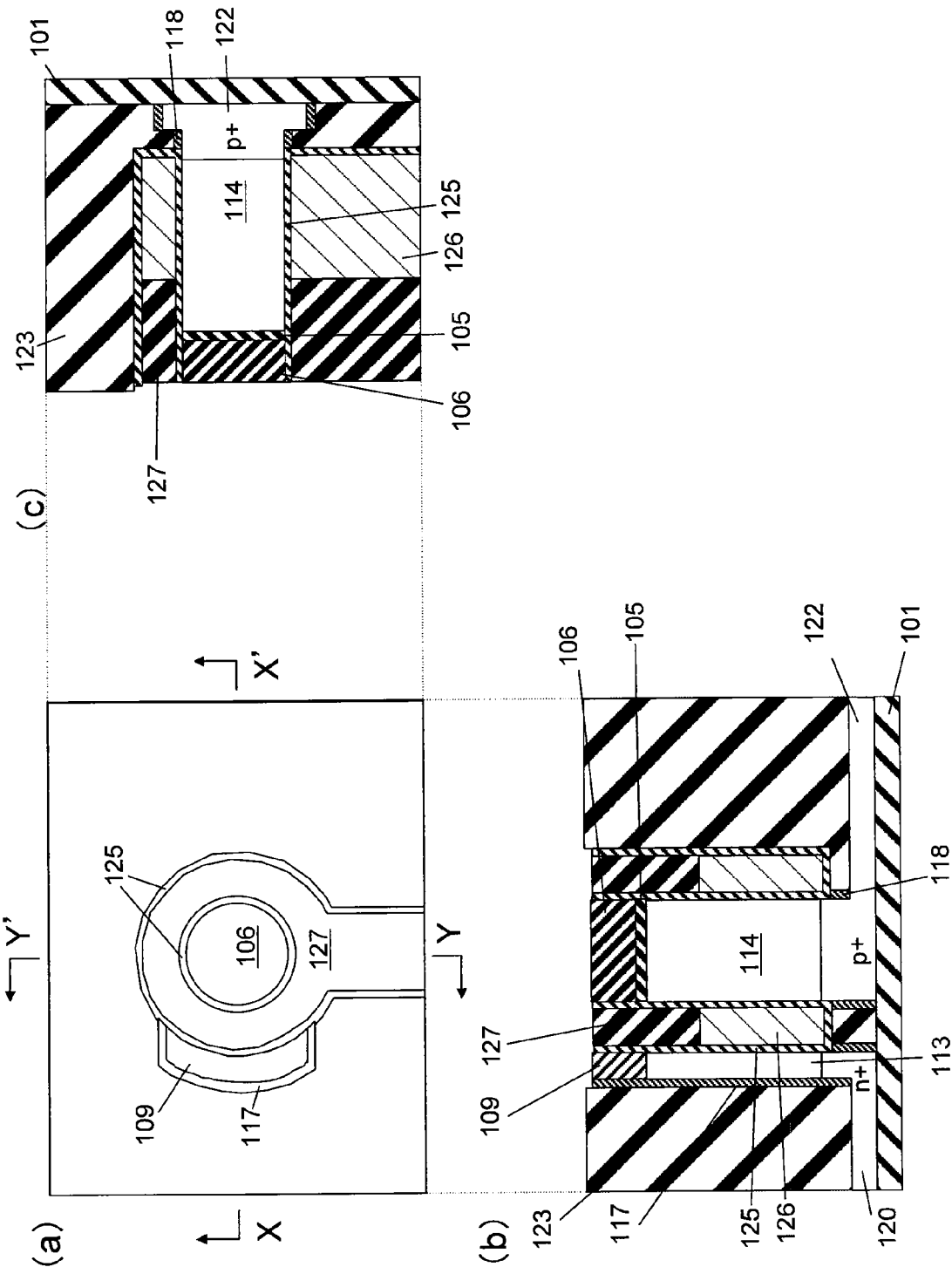
FIG. 37 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 37, the high dielectric film 125 exposed on a surface layer is etched and eliminated.

Figure 38:
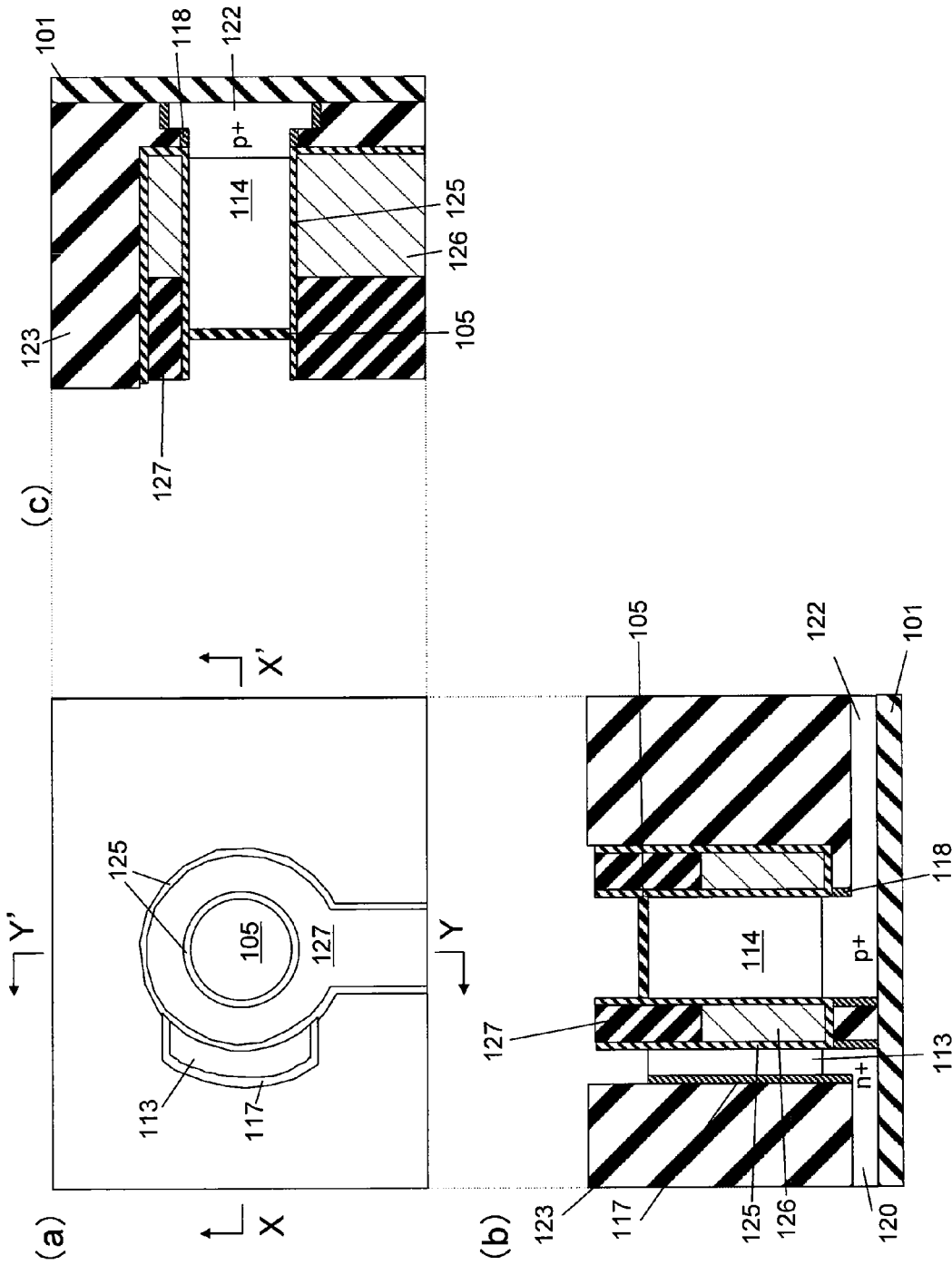
FIG. 38 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 38, the nitride film 106 on the island silicon layer 114, the nitride film 109 on the second arcuate silicon layer 113, and the nitride-film sidewall 117 at the sidewall of the second arcuate silicon layer 113 are etched and eliminated.

Figure 39:
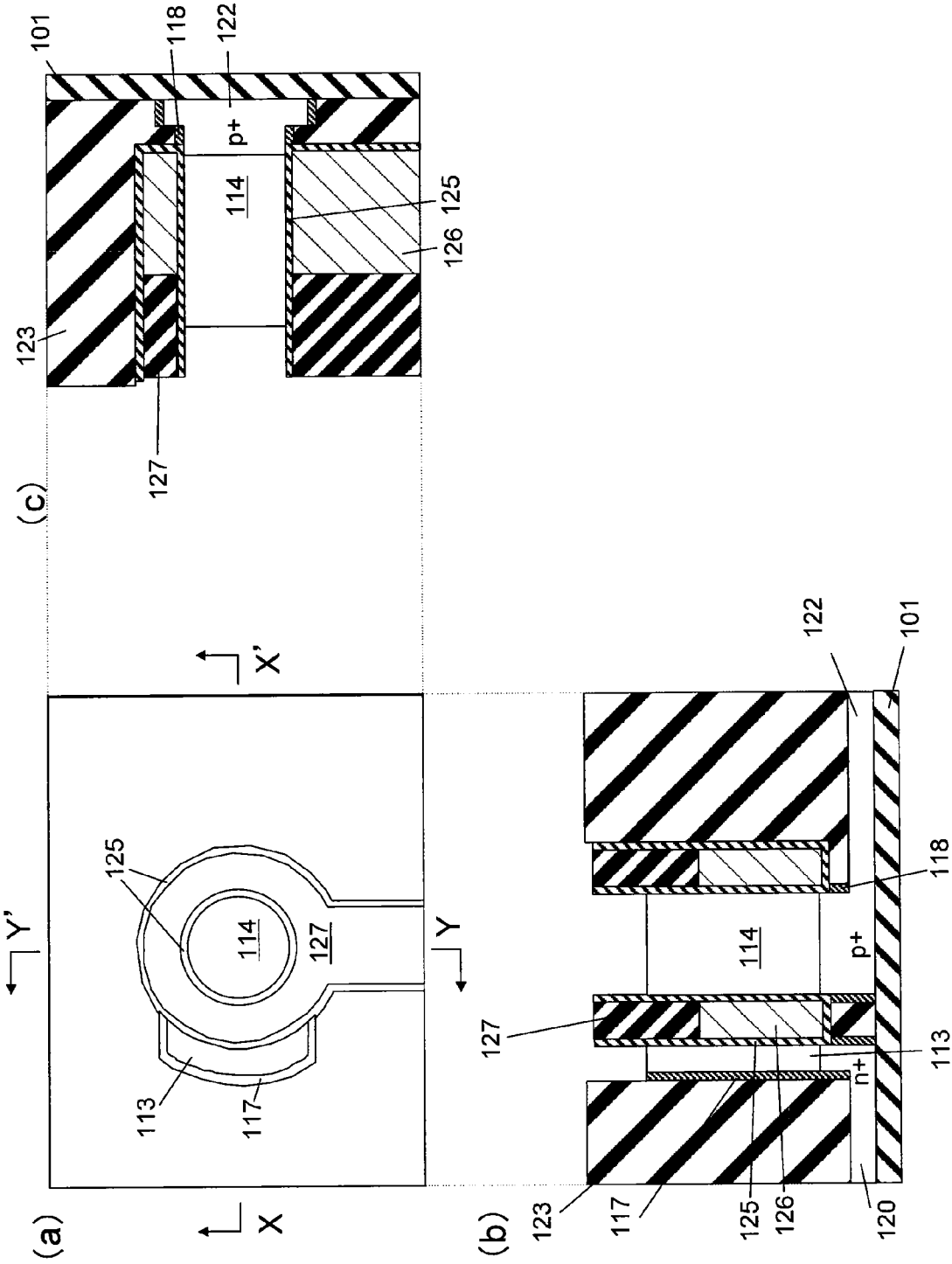
FIG. 39 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 39, the oxide film 105 on the island silicon layer 114 is etched and eliminated.

Figure 40:
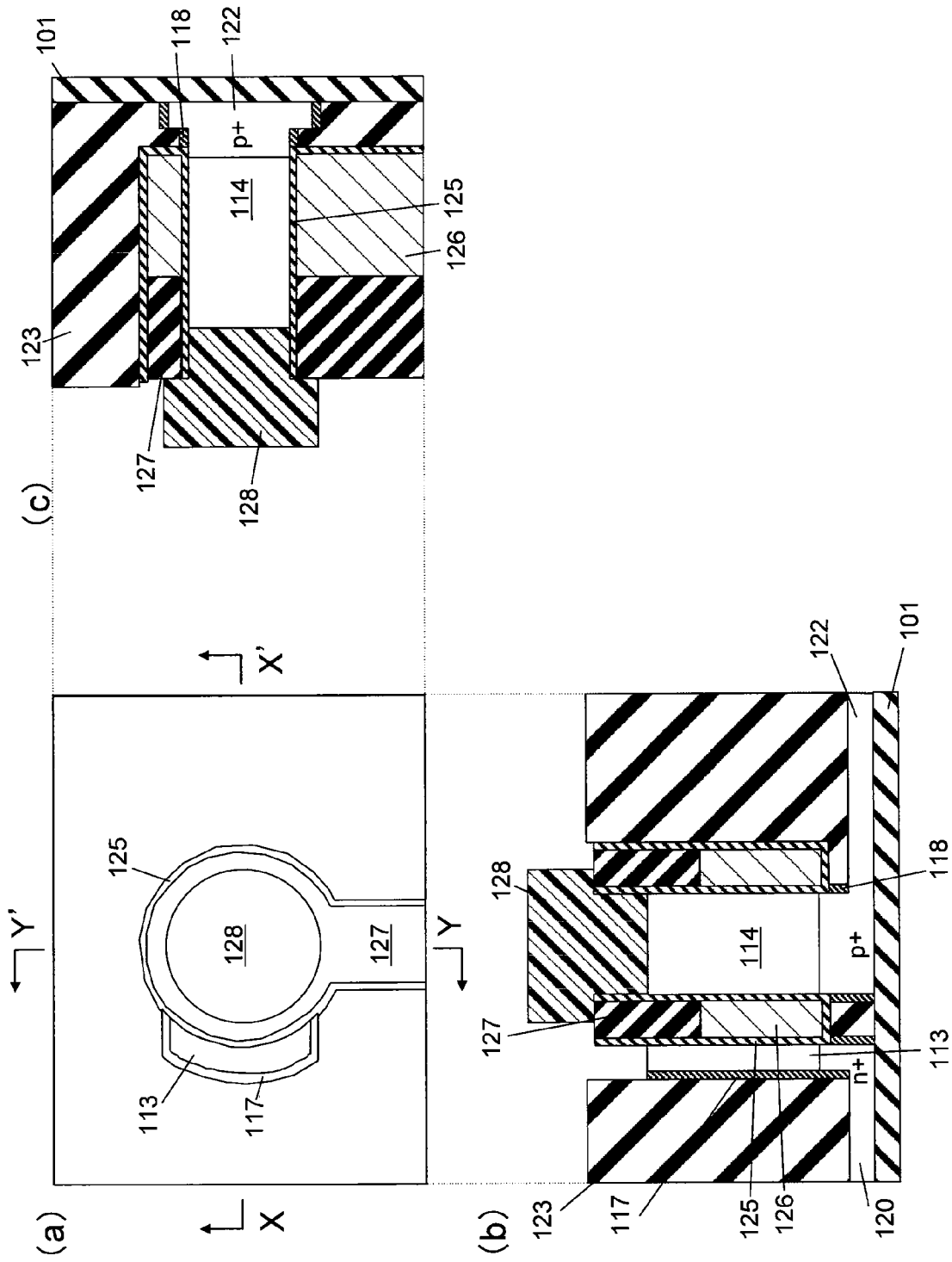
FIG. 40 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 40, a resist 128 having a predetermined pattern for impurity doping is formed so as to fill a space above the island silicon layer 114.

Figure 41:
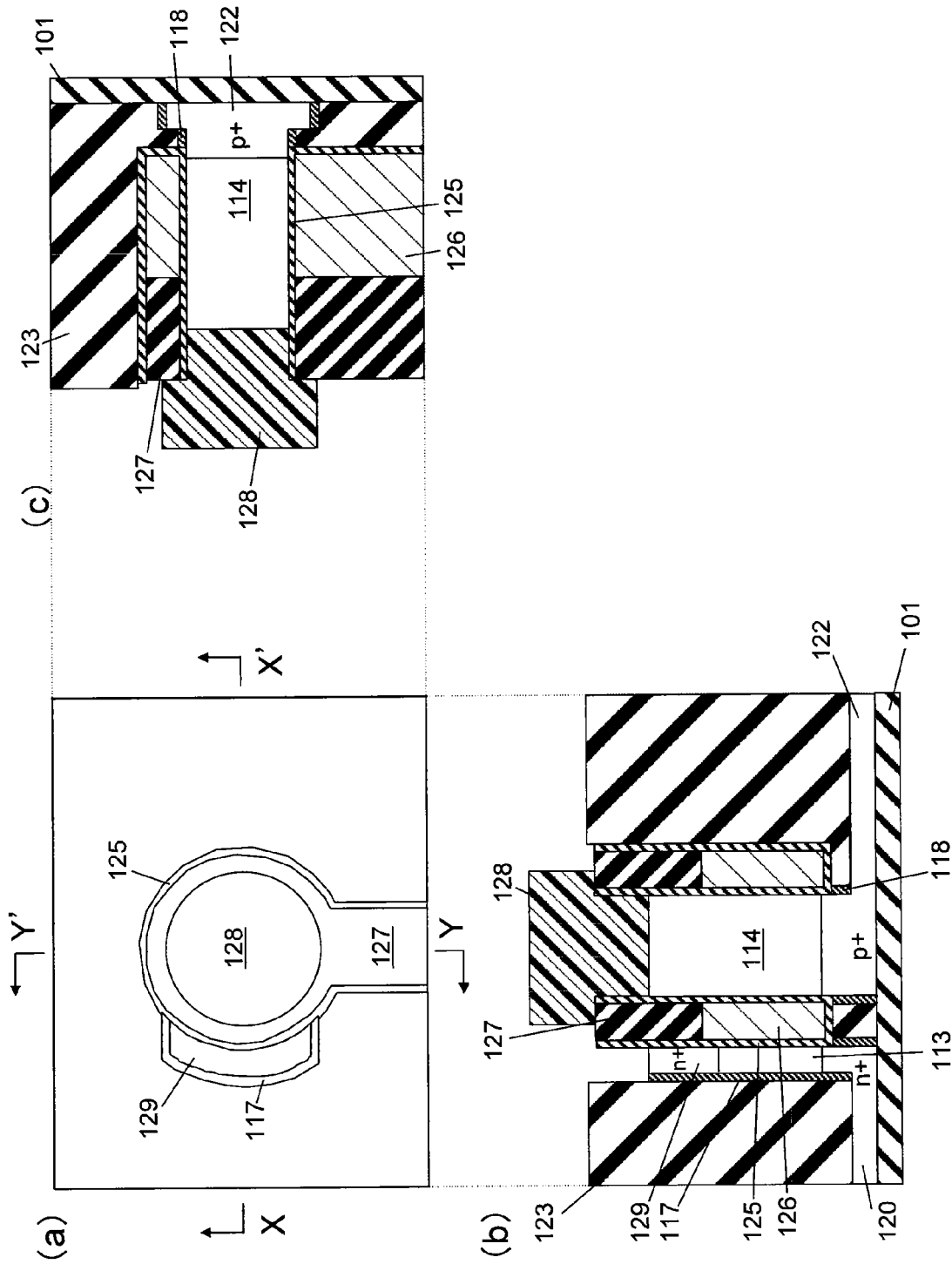
FIG. 41 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 41, arsenic (As) is doped to the second arcuate silicon layer 113 to form the n+-type silicon layer 129 using the resist 128 as a mask.

Figure 42:
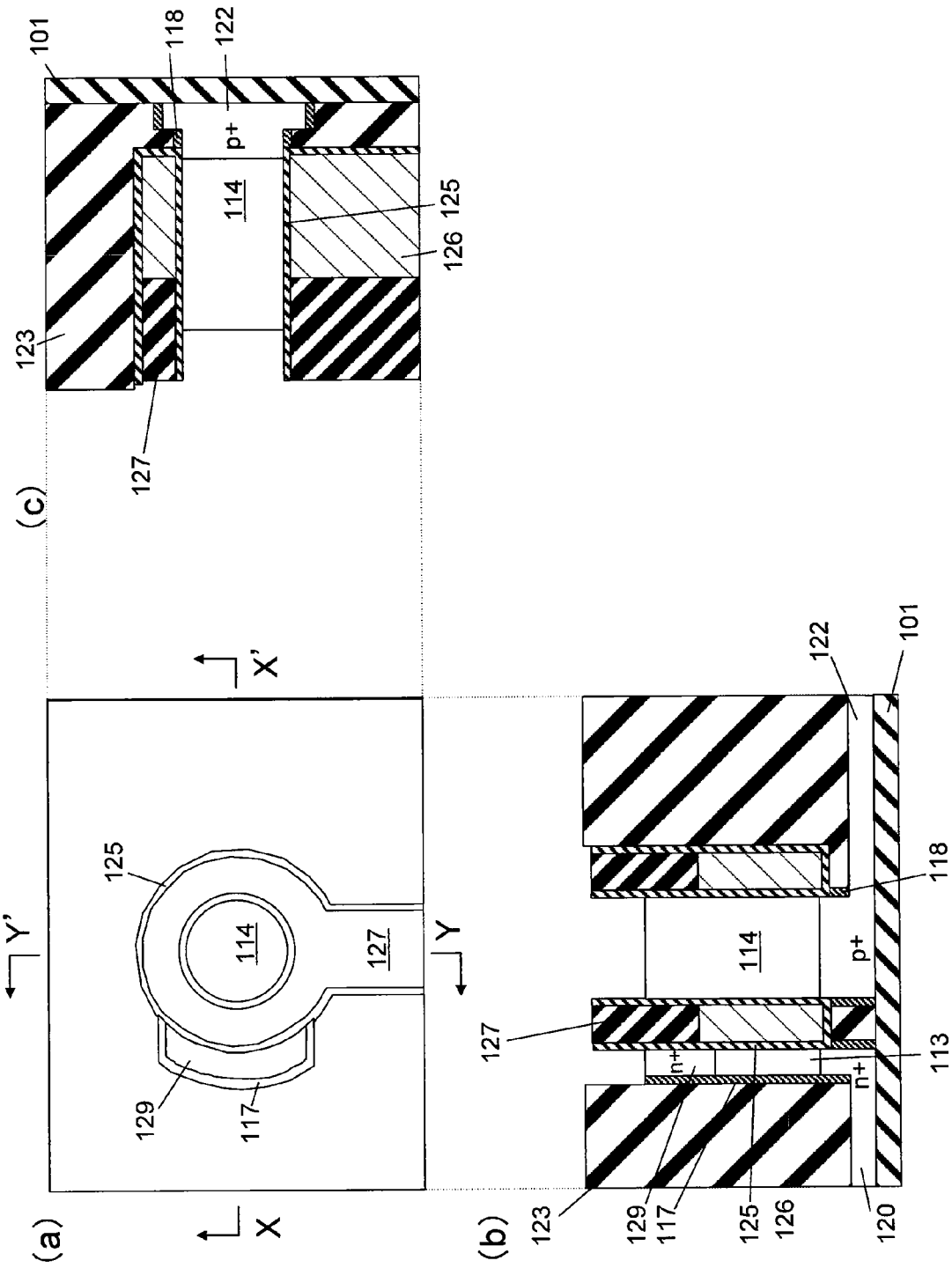
FIG. 42 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 42, the resist 128 is peeled.

Figure 43:
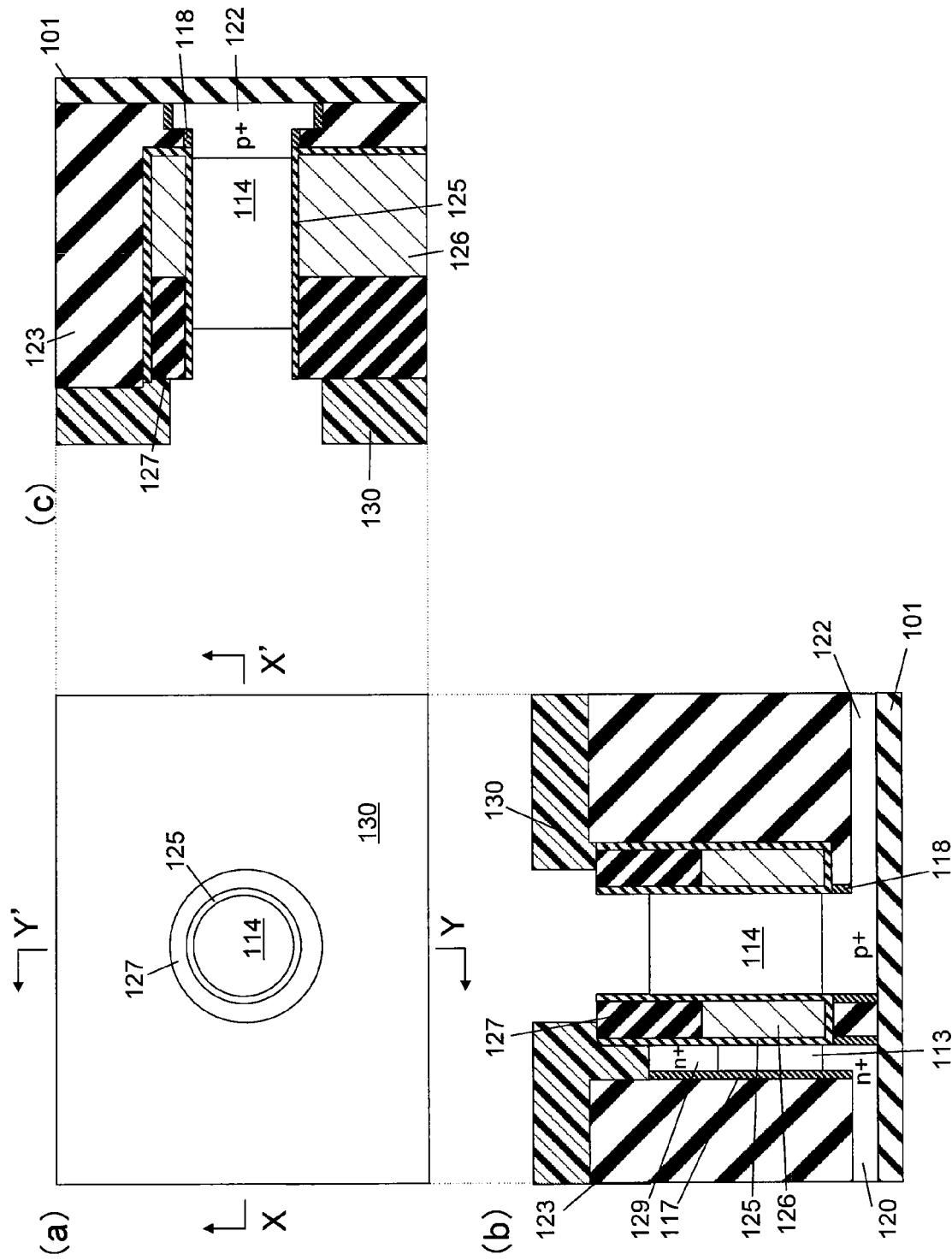
FIG. 43 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 43, a resist 130 having a predetermined pattern for impurity doping is formed at a predetermined position except the space above the island silicon layer 114.

Figure 44:
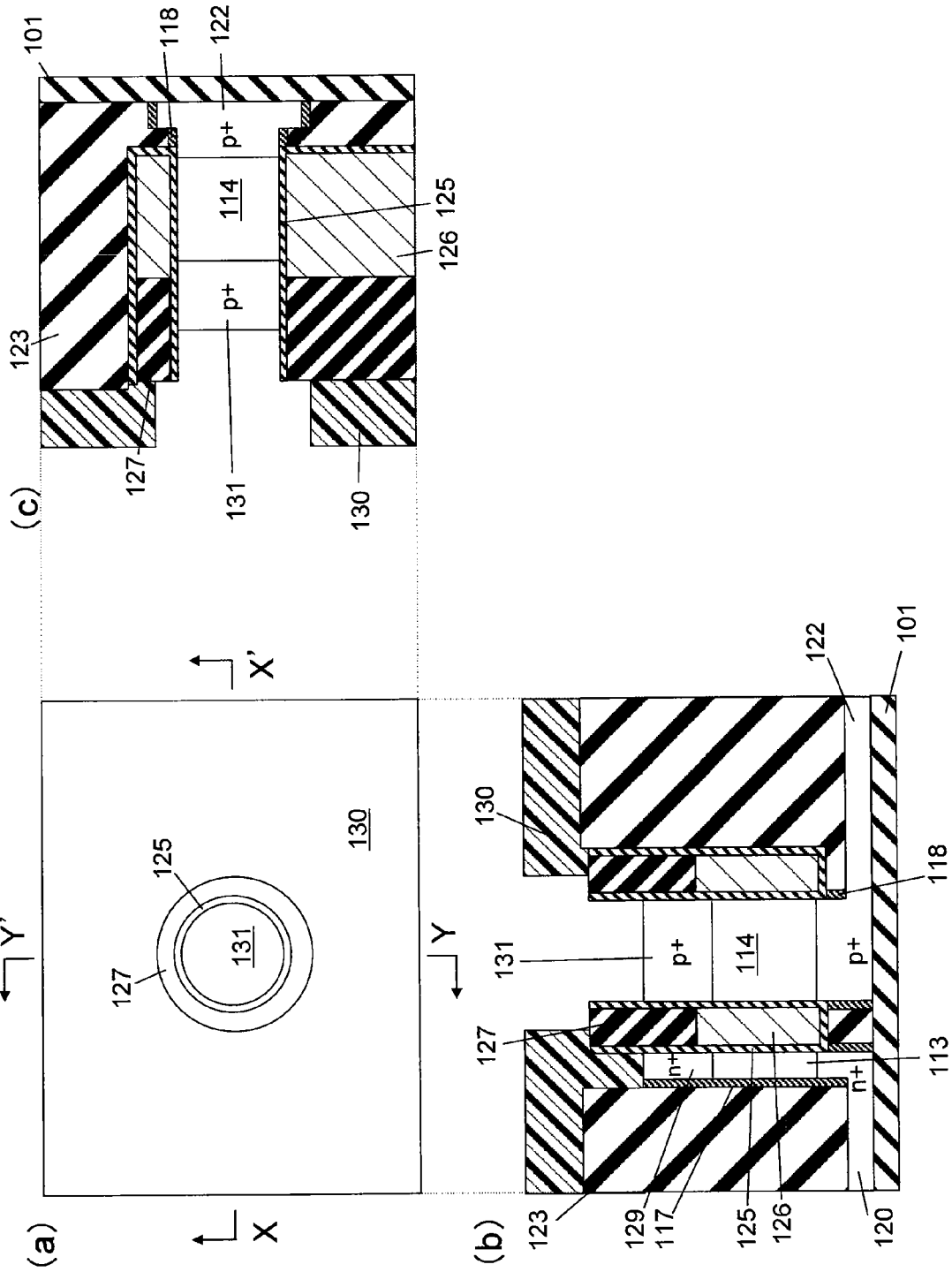
FIG. 44 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 44, boron (B) is doped to the island silicon layer 114 to form the p+-type silicon layer 131.

Figure 45:
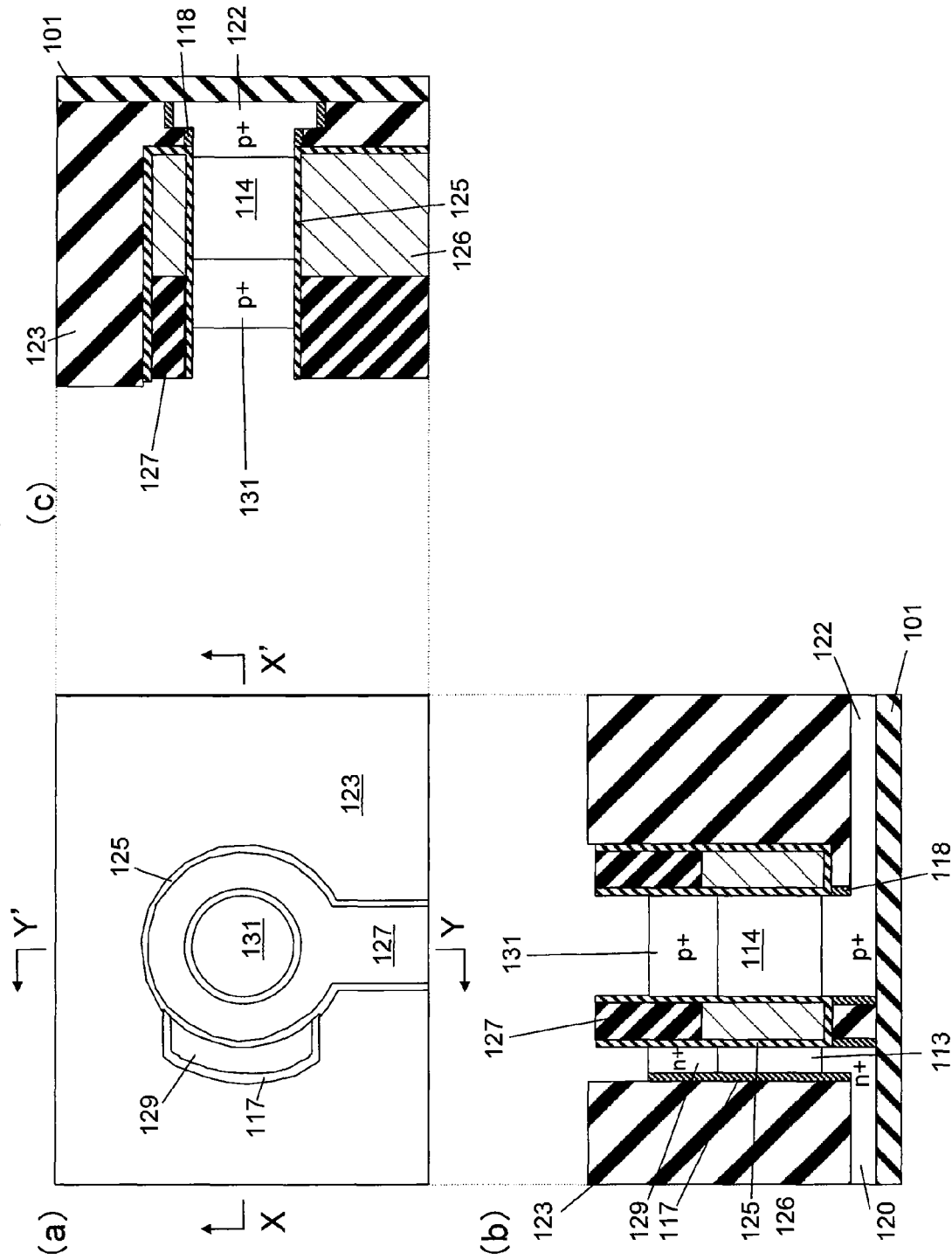
FIG. 45 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 45, the resist 130 is peeled.

Figure 46:
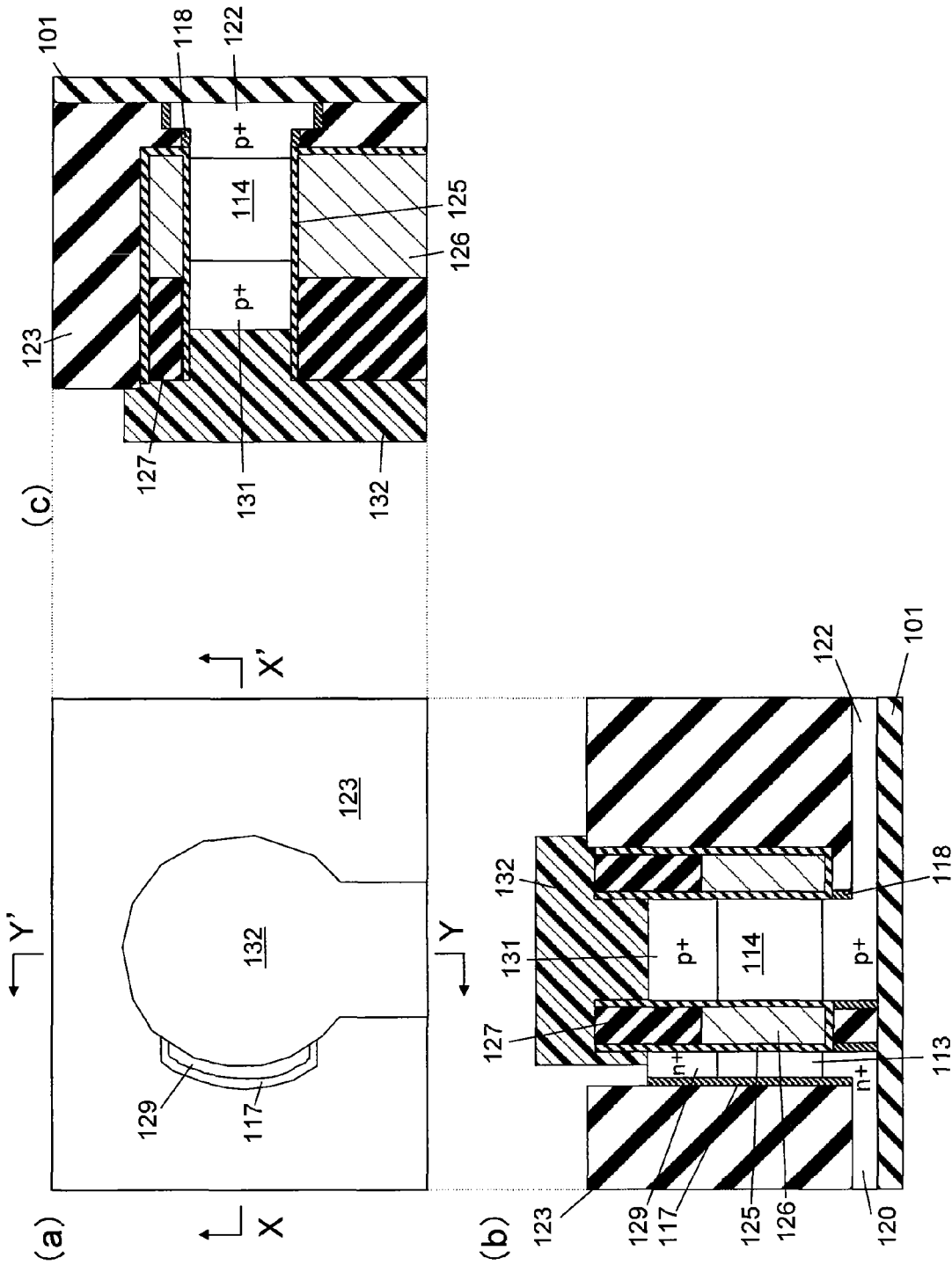
FIG. 46 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 46, a resist 132 for etching the oxide film is formed so as to fill the space above the island silicon layer 114 and to partially fill a space above the second arcuate silicon layer 113.

Figure 47:
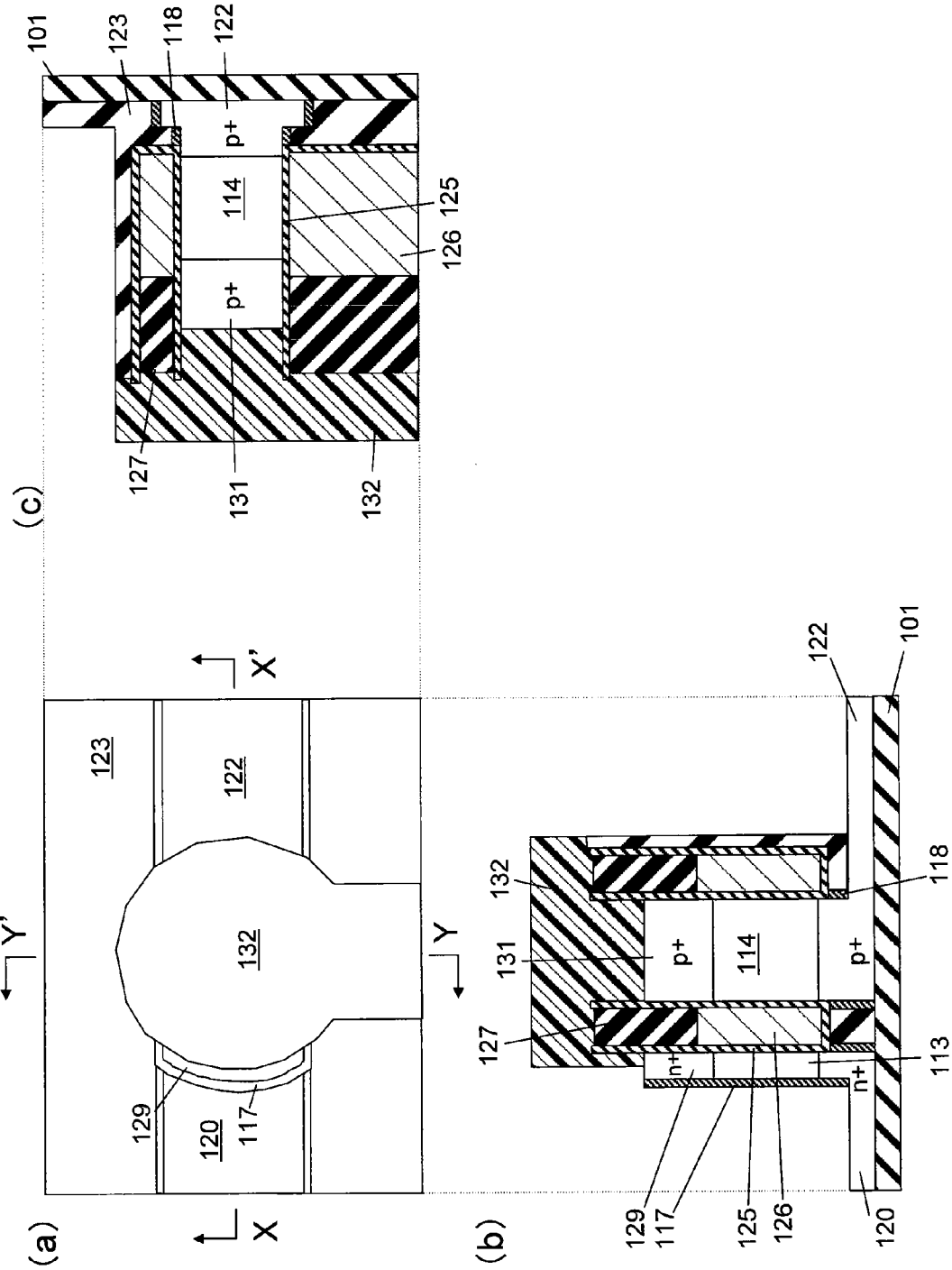
FIG. 47 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 47, the oxide film 123 is etched and eliminated.

Figure 48:
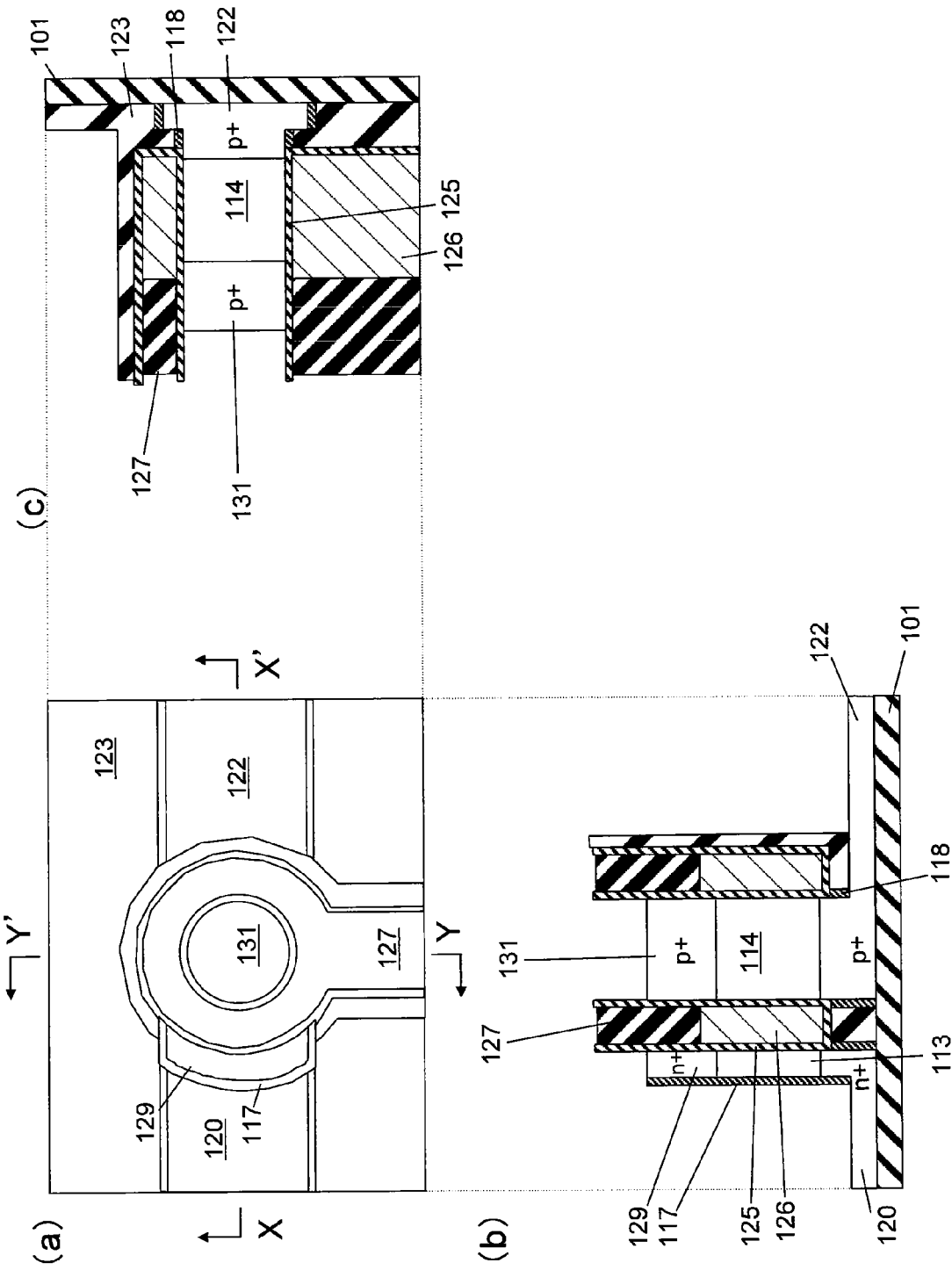
FIG. 48 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 48, the resist 130 is peeled.

Figure 49:
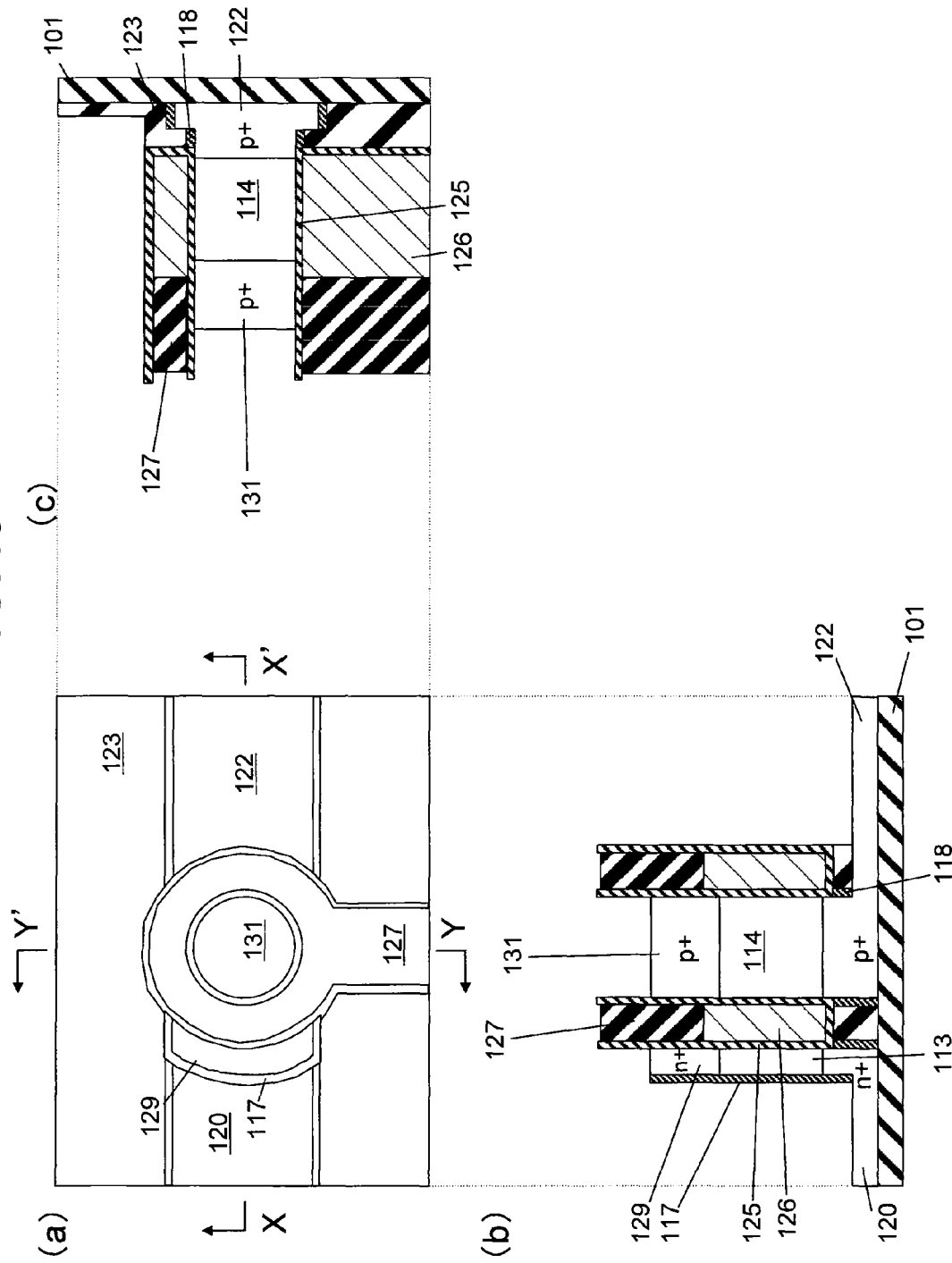
FIG. 49 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 49, the oxide film 123 which remained in the etching step in FIG. 47 is etched to be removed.

Figure 50:
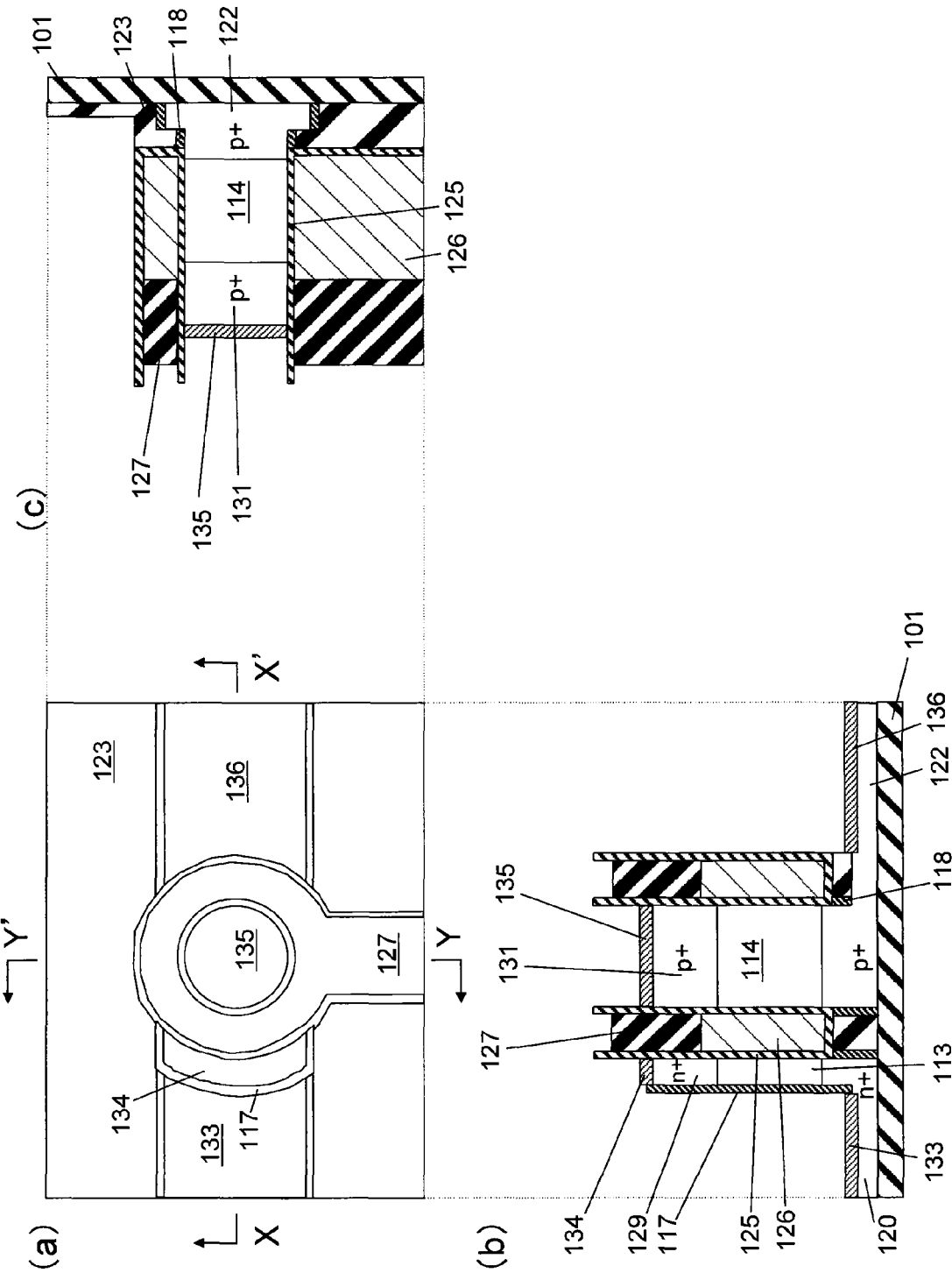
FIG. 50 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 50, the first silicon/metal compound layer 133, the second silicon/metal compound layer 134, the third silicon/metal compound layer 135, and the fourth silicon/metal compound layer 136 are formed on the n+-type silicon layer 120, on the n+-type silicon layer 129, on the p+-type silicon layer 131, and on the p+-type silicon layer 122, respectively. Ni (nickel) Co (cobalt) can be used as the metal, and the compound layer can be formed by, for example, depositing a nickel film on the silicon and applying a heat treatment to form an Ni silicide layer on the surface of the silicon.

Figure 51:
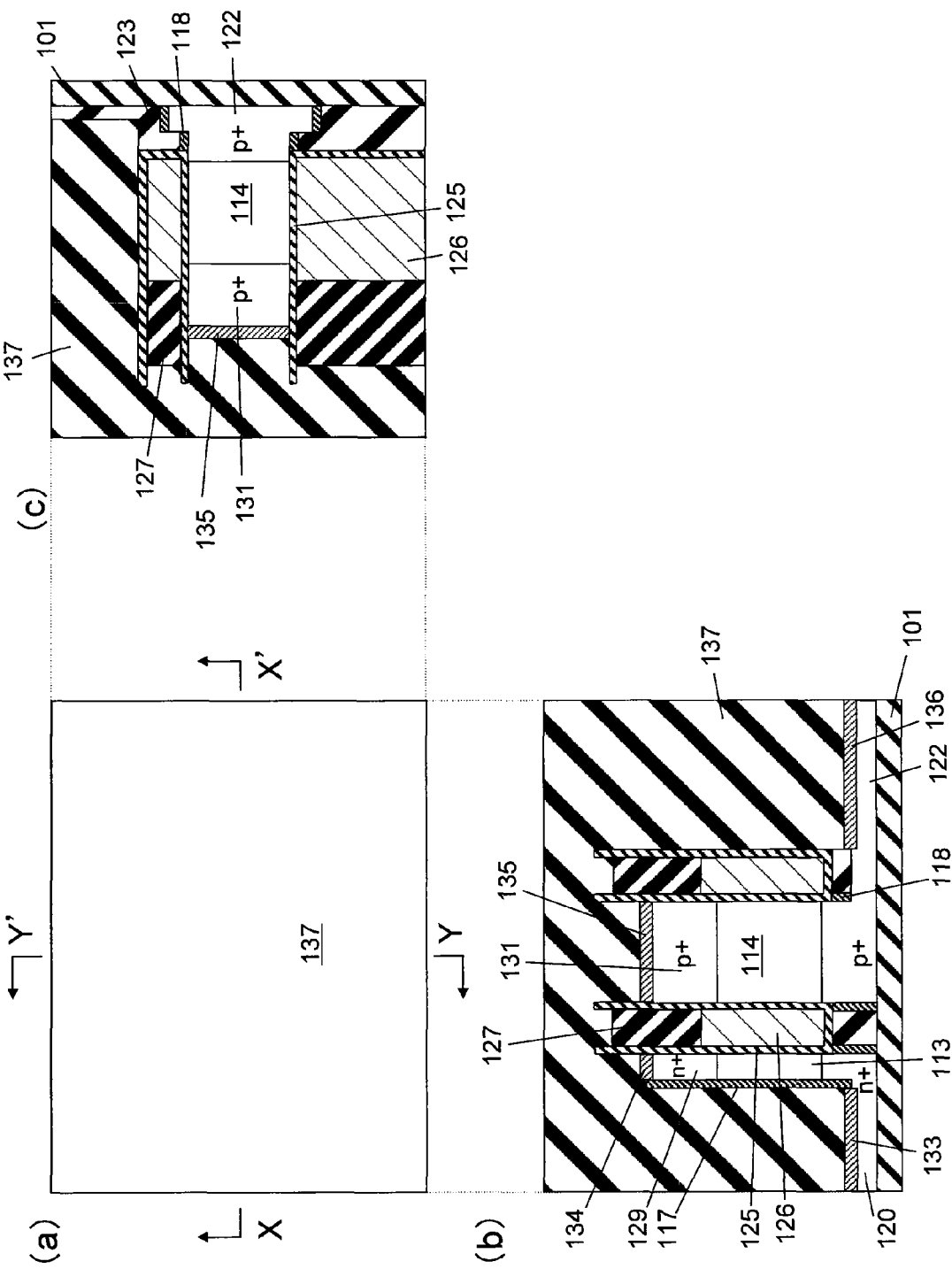
FIG. 51 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 51, an interlayer film 137 is deposited over the first to fourth silicon/metal compound layers 133 to 136, the oxide film 127 and the like.

Figure 52:
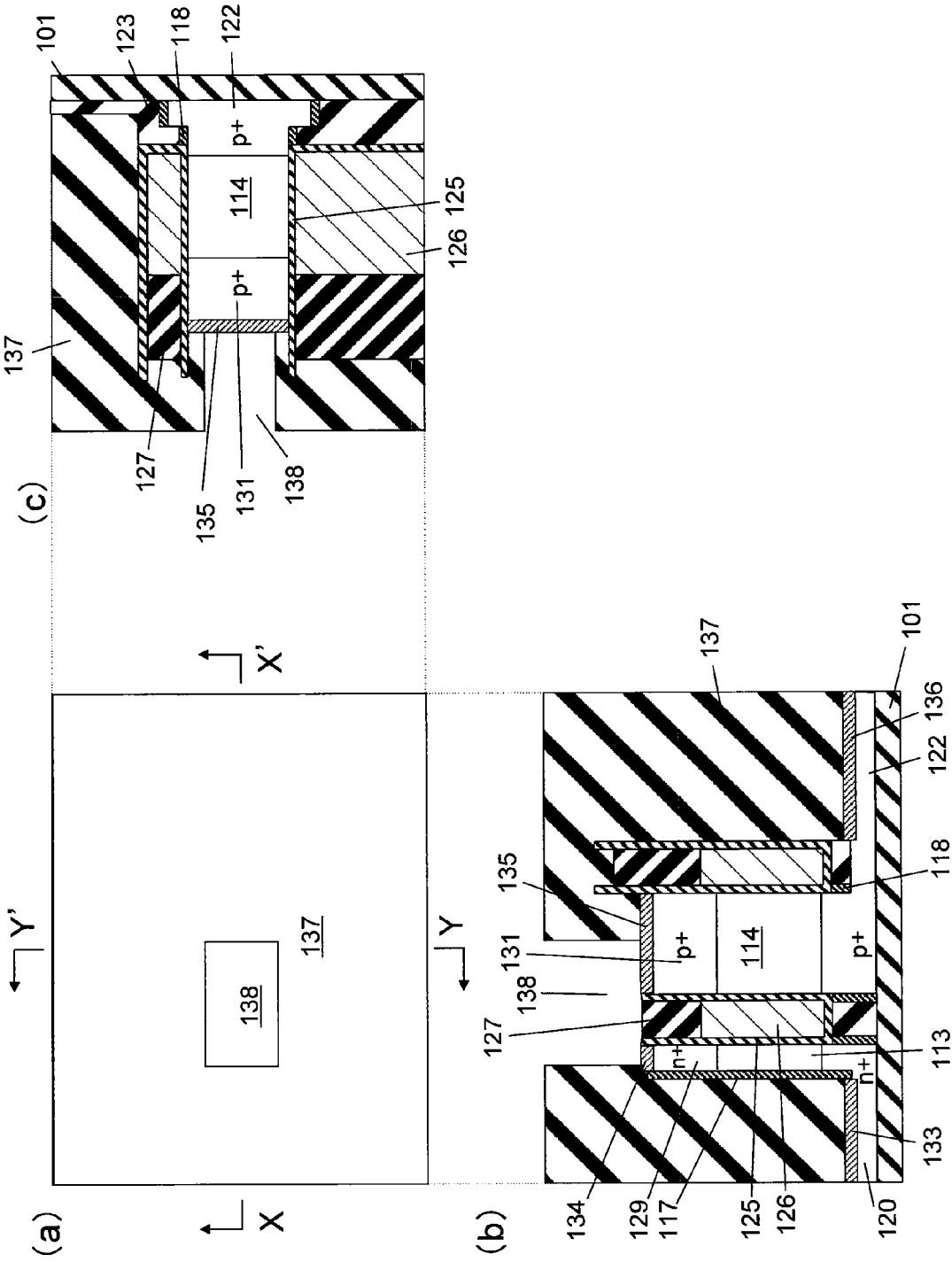
FIG. 52 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 52, a contact hole 138 is formed so as to allow a space above the second arcuate silicon layer 113 including the second silicon/metal compound layer 134 and the third silicon/metal compound layer 135 to be exposed.

Figure 53:
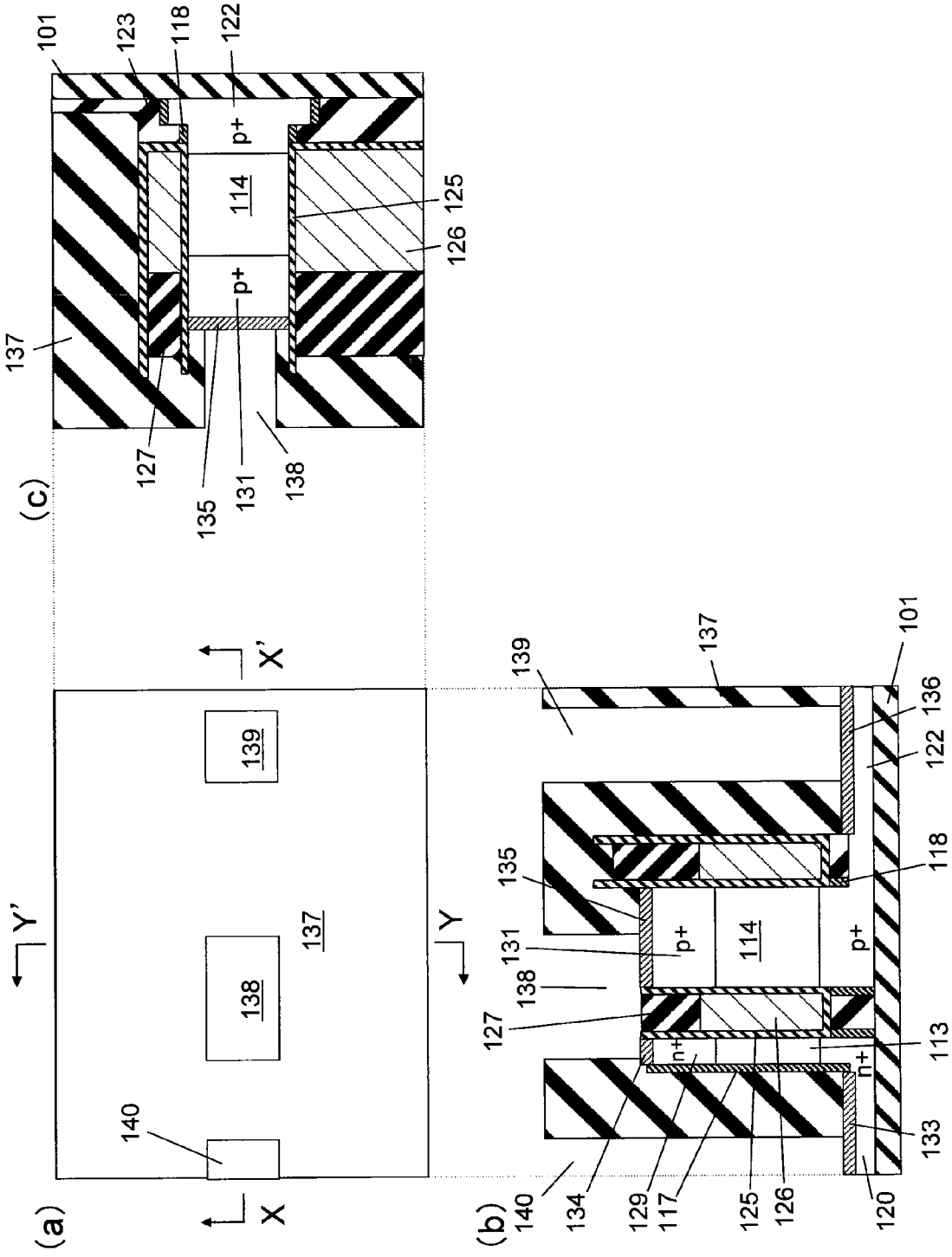
FIG. 53 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 53, contact holes 139 and 140 are formed so as to allow the first silicon/metal compound layer 133 and the fourth silicon/metal compound layer 136 to be exposed.

Figure 54:
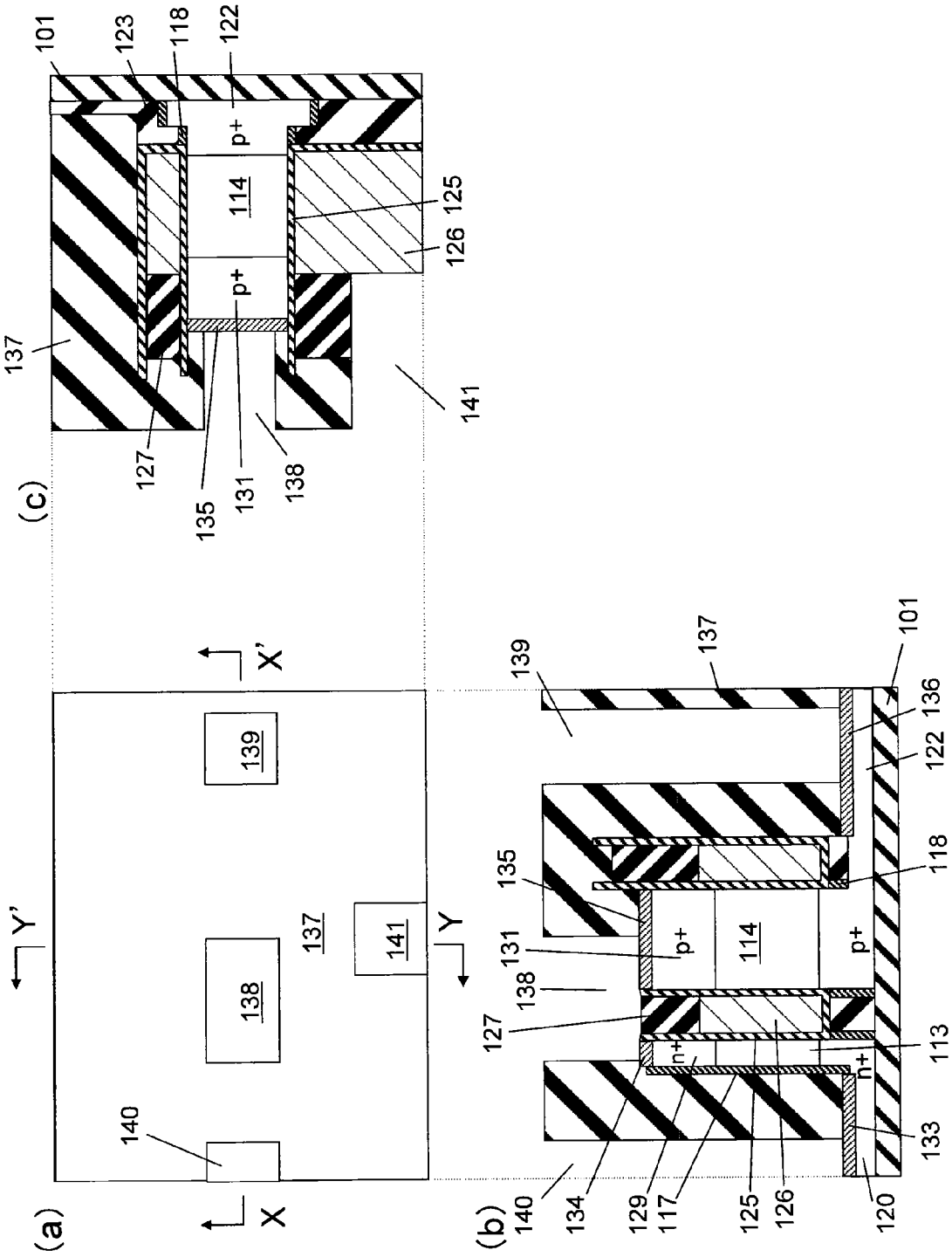
FIG. 54 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 54, a contact hole 141 is formed so as to allow a part of the metal 126 around the island silicon layer 114 to be exposed.

Figure 55:
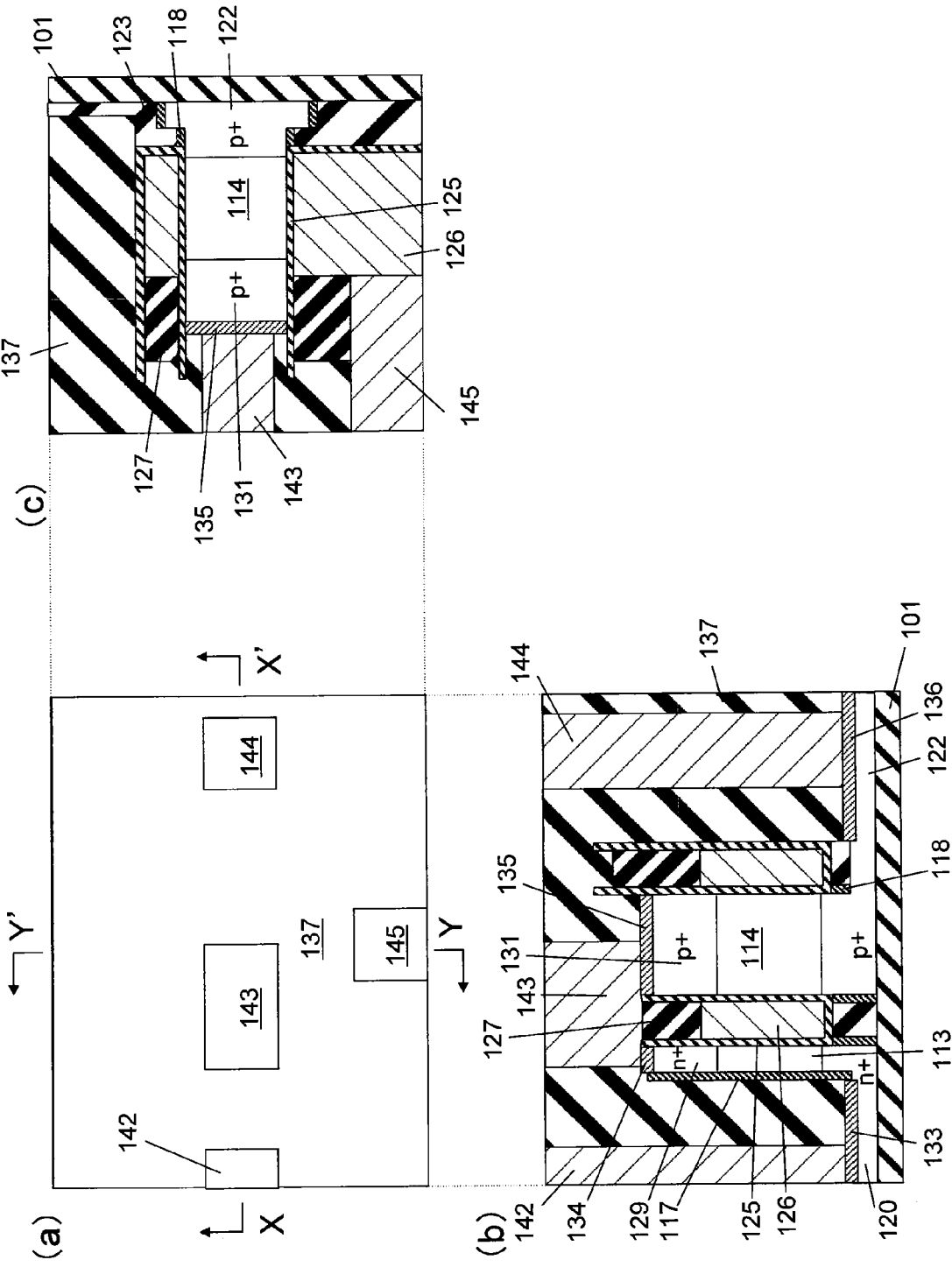
FIG. 55 shows a step in the example of the manufacturing process, wherein (a), (b) and (c) are a top plan view, a cross-sectional view taken along the line X-X' in (a), and a cross-sectional view taken along the line Y-Y' in (a), respectively.

Next, with reference to FIG. 55, contacts 142, 143, 144, and 145 are formed by filling the contact holes 138, 139, 140, and 141 with a metal material.

Next, with reference to FIG. 56, the first power-source wiring 148 and the second power-source wiring 146 are formed so as to be electrically connected to the contacts 144 and 142, respectively, and the input wiring 149 and the output wiring 147 are formed so as to be electrically connected to the contacts 145 and 143, respectively.

Through the foregoing steps, the structure (see, FIG. 1) of the semiconductor device according to the embodiment of the present invention is thus formed.

The present invention is not limited to the foregoing embodiment, and can be changed and modified in various forms. The structure of the element is just an example, and can be changed as needed.

Having described and illustrated the principles of this application by reference to one preferred embodiment, it should be apparent that the preferred embodiment may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor device comprising a first transistor and a second transistor and being allowed by the first and second transistors to function as an inverter, wherein
the first transistor includes:
an island semiconductor layer;
a first gate insulating film surrounding a periphery of the island semiconductor layer;
a gate electrode having a first surface in contact with and surrounding a periphery of the first gate insulating film;
a first-conductivity-type upper high-concentration semiconductor layer formed in an upper part of the island semiconductor layer; and
a first-conductivity-type lower high-concentration semiconductor layer formed in a lower part of the island semiconductor layer;
the second transistor includes:
the gate electrode;
a second gate insulating film in contact with and surrounding at least a part of a second surface of the gate electrode opposite from the first surface;
a semiconductor layer extending about only a portion of the gate electrode and contacting at least a part of a periphery of the second gate insulating film and separated from the gate electrode by the second gate insulating film;

a second-conductivity-type upper high-concentration semiconductor layer in an upper part of the semiconductor layer and having an opposite conductivity to the first-conductivity-type upper high-concentration semiconductor layer; and a second-conductivity-type lower high-concentration semiconductor layer in a lower part of the semiconductor layer and having an opposite conductivity to the first-conductivity-type lower high-concentration semiconductor layer, and the semiconductor device further comprises a first contact which electrically connects the first-conductivity-type upper high-concentration semiconductor layer in the first transistor and the second-conductivity-type upper high-concentration semiconductor layer in the second transistor together.

2. A semiconductor device comprising a first transistor and a second transistor and being allowed by the first second transistors to function as an inverter, wherein the first transistor includes:
 an island semiconductor layer;
 a first gate insulating film surrounding a periphery of the island semiconductor layer;
 a gate electrode having a first surface in contact with and surrounding a periphery of the first gate insulating film;
 a first-conductivity-type upper high-concentration semiconductor layer in an upper part of the island semiconductor layer; and
 a first-conductivity-type lower high-concentration semiconductor layer in a lower part of the island semiconductor layer;

the second transistor includes:
 the gate electrode;
 a second gate insulating film in contact with and surrounding at least a part of a second surface of the gate electrode opposite from the first surface;
 an arc-shaped semiconductor layer extending about only a portion of the gate electrode and contacting a part of a periphery of the gate insulating film and separated from the gate electrode by the second gate insulating film;
 a second-conductivity-type upper high-concentration semiconductor layer in an upper part of the arcuate semiconductor layer and having an opposite conductivity to the first-conductivity-type upper high-concentration semiconductor layer; and
 a second-conductivity-type lower high-concentration semiconductor layer in a lower part of the arcuate semiconductor layer and having an opposite conductivity to the first-conductivity-type lower high-concentration semiconductor layer, the semiconductor device further comprises a first contact which electrically connects the first-conductivity-type upper high-concentration semiconductor layer in the first transistor and the second-conductivity-type upper high-concentration semiconductor layer in the second transistor together.

3. A semiconductor device comprising a first transistor and a second transistor and being allowed by the first second transistors to function as an inverter, wherein the first transistor includes:
 an island semiconductor layer;
 a first gate insulating film surrounding a periphery of the island semiconductor layer;
 a gate electrode having a first surface in contact with and surrounding a periphery of the first gate insulating film;
 a first-conductivity-type upper high-concentration semiconductor layer formed in an upper part of the island semiconductor layer; and
 a first-conductivity-type lower high-concentration semiconductor layer formed in a lower part of the island semiconductor layer;

the second transistor includes:
 the gate electrode;
 a second gate insulating film in contact with and surrounding at least a part of a second surface of the gate electrode opposite from the first surface;
 an arc-shaped semiconductor layer extending about only a portion of the gate electrode and contacting a part of a periphery of the second gate insulating film and separated from the gate electrode by the second gate insulating film;
 a second-conductivity-type upper high-concentration semiconductor layer which is formed in an upper part of the arcuate semiconductor layer and which has an opposite conductivity to the first-conductivity-type upper high-concentration semiconductor layer; and
 a second-conductivity-type lower high-concentration semiconductor layer which is formed in a lower part of the arcuate semiconductor layer and which has an opposite conductivity to the first-conductivity-type lower high-concentration semiconductor layer, the semiconductor device further comprises:
a first semiconductor/metal compound layer formed on the first-conductivity-type upper high-concentration semiconductor layer in the first transistor;
a second semiconductor/metal compound layer formed on an extending part of the first-conductivity-type lower high-concentration semiconductor layer in the first transistor running outwardly of the first transistor and in a horizontal direction of the first transistor;
a third semiconductor/metal compound layer formed on the second-conductivity-type upper high-concentration semiconductor layer in the second transistor;
a fourth semiconductor/metal compound layer formed on an extending part of the second-conductivity-type lower high-concentration semiconductor layer in the second transistor running outwardly of the second transistor and in a horizontal direction of the second transistor;
a first contact which is formed on the first semiconductor/metal compound layer and on the third semiconductor/metal compound layer and which electrically connects the first-conductivity-type upper high-concentration semiconductor layer in the first transistor and the second-conductivity-type upper high-concentration semiconductor layer in the second transistor together; and
an output wiring electrically connected to the first contact.

4. The semiconductor device according to claim 3, further comprising:
a second contact on the second semiconductor/metal compound layer;
a third contact on the fourth semiconductor/metal compound layer;
a fourth contact on the gate electrode;
the output wiring which is connected to the first contact and which is for outputting a signal;
an input wiring which is connected to the fourth contact and which is for inputting a signal;
a first power-source wiring connected to the second contact and to an external power source; and a second power-source wiring connected to the third contact and to an external power source.

5. The semiconductor device according to claim 1, wherein
the first-conductivity-type upper high-concentration semiconductor layer comprises a p+-type semiconductor layer,
the first-conductivity-type lower high-concentration semiconductor layer comprises a p+-type semiconductor layer,
the second-conductivity-type upper high-concentration semiconductor layer comprises an n+-type semiconductor layer, and
the second-conductivity-type lower high-concentration semiconductor layer comprises an n+-type semiconductor layer.

6. The semiconductor device according to claim 3, wherein Wp≅2×Wn is satisfied where Wn is a length of an arc formed at a boundary where the arcuate semiconductor layer contacts a part of the periphery of the second gate insulating film and Wp is an outer circumference length of the island semiconductor layer.

7. The semiconductor device according to claim 3, wherein when a length of an arc formed at a boundary where the arcuate semiconductor layer contacts a part of the periphery of the second gate insulating film is Wn and an outer circumference length of the island semiconductor layer is Wp, Wp is larger than Wn.

8. The semiconductor device according to claim 3, wherein Ln≅Lp is satisfied where Ln is a channel length of the arcuate semiconductor layer and Lp is a channel length of the island semiconductor layer.

9. The semiconductor device according to claim 3, wherein Wp≅2 Wn and Ln≅Lp are both satisfied where Ln is a channel length of the arcuate semiconductor layer and Lp is a channel length of the island semiconductor layer.

10. The semiconductor device according to claim 3, wherein Wp>Wn and Ln≅Lp are both satisfied where Ln is a channel length of the arcuate semiconductor layer and Lp is a channel length of the island semiconductor layer.

11. The semiconductor device according to claim 1, wherein
the first transistor comprises an enhancement-type nMOS transistor,
the first-conductivity-type upper high-concentration semiconductor layer comprises a p+-type semiconductor layer,
the first-conductivity-type lower high-concentration semiconductor layer comprises a p+-type semiconductor layer,
the second transistor is an enhancement-type pMOS transistor,
the second-conductivity-type upper high-concentration semiconductor layer comprises an n+-type semiconductor layer, and
the second-conductivity-type lower high-concentration semiconductor layer comprises an n+-type semiconductor layer, and
the gate electrode comprises a material that causes the nMOS transistor and the pMOS transistor to be an enhancement-type transistor.

12. The semiconductor device according to claim 3, wherein all of the first to fourth semiconductor/metal compound layers comprise a compound layer of silicon and metal.

13. The semiconductor device according to claim 2, wherein
the first and second transistors are an enhancement-type nMOS transistor and an enhancement-type pMOS transistor, respectively,
the island semiconductor layer comprises an island silicon layer,
the arcuate semiconductor layer comprises an arcuate silicon layer,
both of the first-conductivity-type upper high-concentration semiconductor layer and the first-conductivity-type lower high-concentration semiconductor layer comprise a p+-type silicon layer, and
both of the second-conductivity-type upper high-concentration semiconductor layer and the second-conductivity-type lower high-concentration semiconductor layer comprises an n+-type silicon layer.

14. The semiconductor device according to claim 13, wherein
the island silicon layer comprises an n-type or none-doped island silicon layer, and
the arcuate silicon layer comprises a p-type or none-doped arcuate silicon layer.

* * * * *